(12) United States Patent
Fuhr et al.

(10) Patent No.: US 10,094,855 B1
(45) Date of Patent: Oct. 9, 2018

(54) FREQUENCY VISUALIZATION APPARATUS AND METHOD

(71) Applicants: Peter Fuhr, Knoxville, TN (US); Harris Kagan, Foxboro, MA (US)

(72) Inventors: Peter Fuhr, Knoxville, TN (US); Harris Kagan, Foxboro, MA (US)

( * ) Notice: Subject to any disclaimer, the term of this patent is extended or adjusted under 35 U.S.C. 154(b) by 30 days.

(21) Appl. No.: 14/313,721

(22) Filed: Jun. 24, 2014

Related U.S. Application Data

(63) Continuation-in-part of application No. 13/925,568, filed on Jun. 24, 2013, now Pat. No. 9,423,300.

(60) Provisional application No. 61/838,814, filed on Jun. 24, 2013, provisional application No. 61/838,809, filed on Jun. 24, 2013, provisional application No. 61/838,842, filed on Jun. 24, 2013, provisional application No. 61/838,832, filed on Jun. 24, 2013, provisional application No. 61/838,830, filed on Jun. 24, 2013, provisional application No. 61/838,822, filed on Jun. 24, 2013, provisional application No. 61/898,869, filed on Nov. 1, 2013, provisional application No. 61/900,184, filed on Nov. 5, 2013, provisional application No. 61/900,245, filed on Nov. 5, 2013, provisional application No. 61/900,208, filed on Nov. 5, 2013, provisional application No. 61/937,152, filed on Feb. 7, 2014.

(51) Int. Cl.
*G01R 13/02* (2006.01)

(52) U.S. Cl.
CPC .................. *G01R 13/0281* (2013.01)

(58) Field of Classification Search
CPC ... G01R 13/0281; G01R 13/0227; H04B 1/06
See application file for complete search history.

(56) References Cited

U.S. PATENT DOCUMENTS

| | | | | |
|---|---|---|---|---|
| 4,990,925 A | * | 2/1991 | Edelsohn | G01K 11/006 342/190 |
| 8,400,452 B2 | * | 3/2013 | Williams | G06T 11/206 345/440 |
| 2003/0109242 A1 | * | 6/2003 | Ohtaki | H04B 7/084 455/335 |
| 2004/0219899 A1 | * | 11/2004 | Ho | H04B 7/0842 455/273 |

(Continued)

*Primary Examiner* — Georgia Y Epps
*Assistant Examiner* — Don Williams
(74) *Attorney, Agent, or Firm* — Matthew M. Googe; Robinson IP Law, PLLC

(57) ABSTRACT

A frequency visualization apparatus for detecting and displaying one or more specific sets of energy waves based on one or more of defined discrete sets of frequency ranges is disclosed, the apparatus including two or more directional radio frequency antennas for capturing a field of view, such orientation comprising a detector array, each antenna configured to output a specific voltage based on the strength of the intercepted radio waves, two or more voltage amplifiers in communication with the one or more radio frequency antennas, two or more analog to digital converters, a digital memory apparatus connected to the two or more converters for receiving and storing the digital data in a numeric array, a processor connected to the digital memory apparatus, and a display connected to the processor for displaying a visual array comprising visual array elements, each visual array element corresponding to a specific antenna of the detector.

8 Claims, 55 Drawing Sheets

(56) References Cited

U.S. PATENT DOCUMENTS

| | | | |
|---|---|---|---|
| 2009/0046794 A1* | 2/2009 | Maruyama | H01Q 9/0435 375/260 |
| 2010/0007738 A1* | 1/2010 | Lehnert | H04N 7/181 348/159 |
| 2011/0051868 A1* | 3/2011 | Roufoogaran | H04B 1/18 375/350 |

* cited by examiner

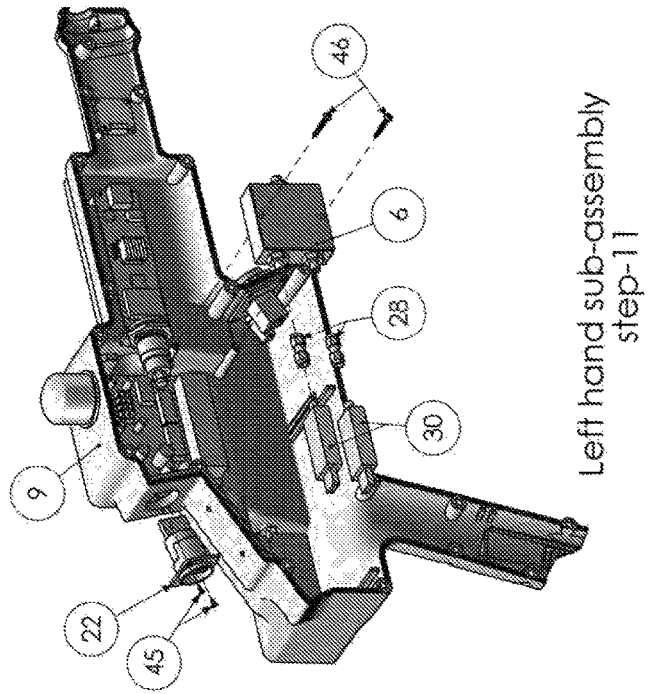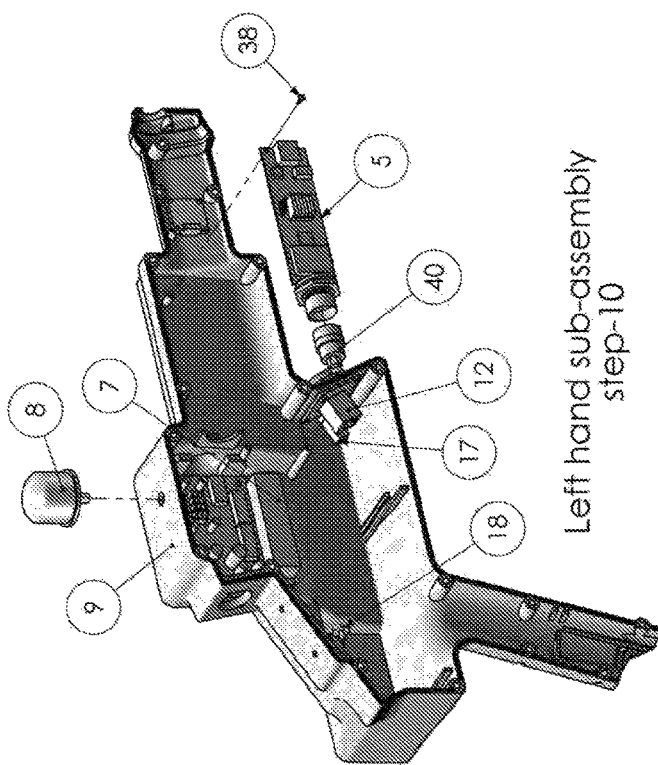

Figure 5.30: Tag Using a Surface-acoustic-wave (SAW) Active Element.

FREQUENCY VISUALIZATION APPARATUS AND METHOD

CROSS REFERENCES TO RELATED APPLICATIONS

This application claims priority to co-pending U.S. Nonprovisional patent application Ser. No. 13/925,568 entitled "Frequency Visualization Apparatus and Method" which was filed on Jun. 24, 2013, the content of which is incorporated herein by reference in its entirety. This application also claims priority to U.S. Provisional Patent Application Ser. No. 61/838,814 entitled "Hemispheric Sensing Via Sensor Arrays" which was filed on Jun. 24, 2013, U.S. Provisional Patent Application Ser. No. 61/838,809 entitled "Portable Frequency Visualization Apparatus" which was filed on Jun. 24, 2013, U.S. Provisional Patent Application Ser. No. 61/838,842 entitled "Strategic and Inferential Measurements with Visual Identification of Phenomena in Real-Time" which was filed on Jun. 24, 2013, U.S. Provisional Patent Application Ser. No. 61/838,832 entitled "Head Mounted Display for Frequency Visualization" which was filed on Jun. 24, 2013, U.S. provisional patent application Ser. No. 61/838,830 entitled "Radio Frequency (RF) Focal Plane Array Diplexer System with Structured Light Rendering" which was filed on Jun. 24, 2013, U.S. Provisional Patent Application Ser. No. 61/838,822 entitled "Radio Frequency (RF) Electrical Signature Analysis (ESA) of Electrical Distribution Transformers" which was filed on Jun. 24, 2013, U.S. Provisional Patent Application Ser. No. 61/898,869 entitled "System and Method for Determining Range to an Electromagnetic Wave Source" which was filed on Nov. 1, 2013, U.S. Provisional Patent Application Ser. No. 61/900,184 entitled "Radio Frequency Imaging Method and Apparatus" which was filed on Nov. 5, 2013, U.S. Provisional Patent Application Ser. No. 61/900,245 entitled "Assisted Detection and Location of Cooperating Assets with Augmented Reality Visualization" which was filed on Nov. 5, 2013, U.S. Provisional Patent Application Ser. No. 61/900,208 entitled "Acoustic Imaging Apparatus" which was filed on Nov. 5, 2013, and U.S. Provisional Patent Application Ser. No. 61/937,152 entitled "Directional Passive Wireless Sensor Tag Interrogation" which was filed on Feb. 7, 2014, the contents of which are incorporated herein by reference in their respective entireties.

FIELD

This disclosure relates to sensing, representation, visualization and display of characteristics of signals detected in selected frequency bands.

BACKGROUND

A vast amount of information and/or energy is traveling all around us at any given time whether in the form of radio waves, visible light, invisible light, audible acoustic waves, inaudible acoustic waves, microwaves, and other similar waves, but the vast majority of this information and/or energy is unseen and/or unheard to the average human. The effect of average humans not being able to visually detect such waves is often trivial, but in certain environments (e.g., combat, industry, space), such unseen information and/or energy can be hazardous and, in some cases, deadly.

What is needed, therefore, is a means by which to better detect waves that are typically undetectable to the average human, preferably bringing much more of the light and sound spectrums within reach of the human senses.

SUMMARY

It would be useful in some environments to provide a visual representation of frequencies present in a selected portion of the radiofrequency, microwave, infrared, visible or ultraviolet spectrum, in order to estimate locations and intensities of sources that may be producing such frequencies—particularly those that are not readily apparent to the basic five human senses. It would also be useful to provide an indication of an intensity or strength of these frequencies, or an indication of whether the associated intensity or strength of particular frequencies is above a threshold that is of concern, and to provide an alert signal when the intensity or shape characteristics of this frequency overlay is changing by at least a threshold amount.

A frequency visualization apparatus for detecting and displaying one or more specific sets of energy waves based on one or more of defined discrete sets of frequency ranges is disclosed, the apparatus comprising two or more directional radio frequency antennas oriented at an orientation to capture a field of view targeted by the radio frequency imager and intercept radio waves therein, such orientation comprising a detector array, each antenna configured to output a specific voltage based on the strength of the intercepted radio waves, two or more voltage amplifiers in communication with the one or more radio frequency antennas, for amplifying the strength of each output voltage, two or more analog to digital converters, each converter connected to a corresponding voltage amplifier of the two or more voltage amplifiers for converting each output voltage into digital data, a digital memory apparatus connected to the two or more converters for receiving and storing the digital data in a numeric array corresponding to the detector array, a processor connected to the digital memory apparatus for processing the digital data, and a display apparatus connected to the processor for receiving display commands from the processor and for displaying a visual array comprising visual array elements, each visual array element corresponding to a specific antenna of the detector array and configured to display information characterizing a magnitude of the radio wave frequency intercepted by that particular antenna during a particular time period.

In one embodiment, the two or more directional radio frequency antennas are comprised of Yagi-Uda directional antennas.

In another embodiment, the visual array comprising array elements is at least a 3×3 array of visual array elements. In yet another embodiment, the visual array elements are selected from the group consisting of geometric shapes, graphs, color variations, and combinations thereof. In one embodiment, the visual array elements vary in appearance based on a strength of the radio wave intercepted by the radio frequency imager. In another embodiment, characteristics of the visual array elements vary based on a particular wavelength range of the intercepted radio waves.

In one embodiment, the intercepted radio waves further comprise corresponding wavelength ranges selected from the group consisting of from about 0.1 nm to about 10 nm; from about 10 nm to about 400 nm; from about 400 nm to about 700 nm; from about 1 um to about 1000 um; from about 1 mm to about 10 cm; and from about 50 cm to about 10 m.

In another aspect, a method of intercepting and displaying one or more radio waves based on a strength of the intercepted radio waves is provided. The method includes the steps of orienting two or more directional radio frequency antennas to capture a desired field of view, capturing one or more radio waves within the field of view of the two or more radio frequency antennas, generating an output signal at each of the two or more radio frequency antennas, wherein a strength of the output signal of the two or more radio frequency antennas is based on a strength of the radio waves detected by each of the two or more radio frequency antennas, displaying an array of visual array elements wherein each of the visual array elements corresponds to each of the two or more radio frequency antennas and wherein the visual array elements are oriented according to a portion of the field of view captured by each of the two or more radio frequency antennas, displaying a visual indicator within each of the visual array elements when each of the corresponding two or more radio frequency antennas capture one or more radio waves within the particular radio frequency antenna's portion of the field of view, and varying an appearance of the visual indicator based on a strength of the output signal from each of the two or more radio frequency antennas that is based on a strength of the radio waves detected by the radio frequency antennas.

BRIEF DESCRIPTION OF THE DRAWINGS

Further features, aspects, and advantages of the present disclosure will become better understood by reference to the following detailed description, appended claims, and accompanying figures, wherein elements are not to scale so as to more clearly show the details, wherein like reference numbers indicate like elements throughout the several views, and wherein:

FIGS. 16-24 illustrate a portable handheld frequency visualization apparatus according to one embodiment of the disclosure;

DETAILED DESCRIPTION

Figure 1:
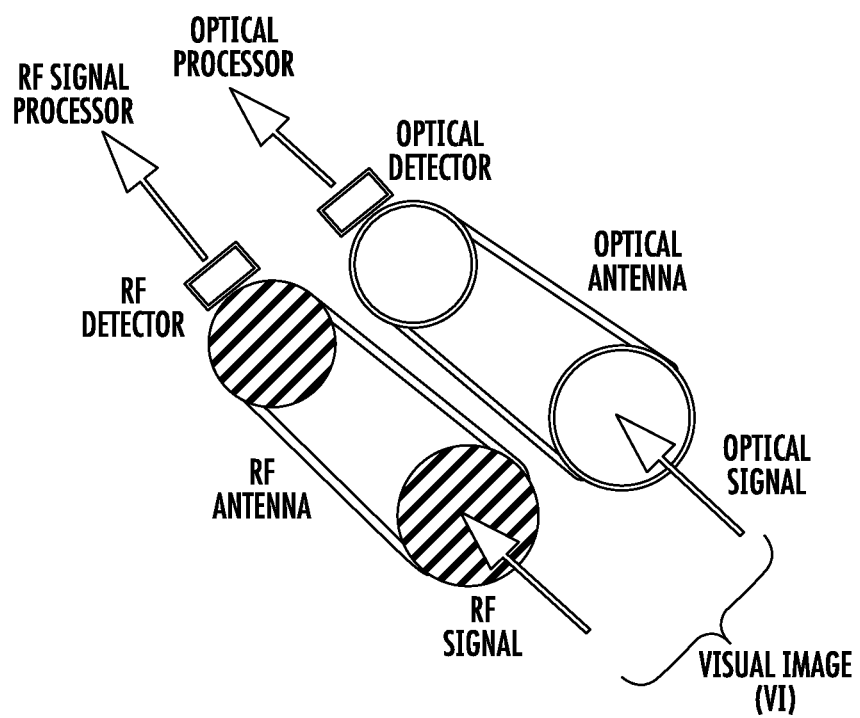
FIG. 1 is a schematic illustration of a frequency visualization system according to one embodiment of the disclosure.

Various terms used herein are intended to have particular meanings. Some of these terms are defined below for the purpose of clarity. The definitions given below are meant to cover all forms of the words being defined (e.g., singular, plural, present tense, past tense). If the definition of any term below diverges from the commonly understood and/or dictionary definition of such term, the definitions below control.

The phrase "connected to" can be interpreted as "in communication with", but the use of this phrase "connected to" does not necessitate the same meaning as the phrase "in communication with".

The phrase "in communication with" means that two items are in communication with one another either directly (e.g., by wire") or indirectly (e.g., by wireless communication).

As referred to herein, the phrase "field of view" refers to an observable area at a given moment including not only visible components but also invisible components such as radio waves and other signals.

An apparatus and method for providing an image showing one or more RF signals over a desired field of view is disclosed. As referred to herein, RF signals generally comprise signals having a wavelength of greater than 10 cm and a frequency of less than or equal to about 3 GHz. Specifically, a system for recognizing the presence of frequencies in a selected portion of the electromagnetic spectrum and for presenting electronic and/or visual signals that represent these frequencies is disclosed. A visual image is split into at least a first frequency dependent image component and a second frequency dependent image component, with the first component including only frequencies in a selected frequency-limited detection interval (FDI), for example, a portion of the radio frequency, microwave, mid-infrared, near-infrared, visible and/or ultraviolet spectrum; and the second component including an image as perceived by a human eye or similar image formation system.

In one embodiment, the first image component is formed by passing the image through a first array of M1 FDI detectors to produce an array of "flixels", then through a second array of, for example, M2 LEDs, with each LED being coupled to, at most, one of the FDI detectors in the first array. As referred to herein, a "flixel" corresponds to a small segment of an image (analogous to a pixel), but the information associated with the flixel is limited to a selected frequency-limited detection interval (FDI). By contrast, a pixel on a computer monitor or television screen may include information associated with visible, near-infrared and near-ultraviolet wavelengths and is not necessarily limited to a specified wavelength or frequency interval. The system, or the user, may vary the choice of FDI over a discrete set of FDIs, partly overlapping or wholly distinct from each other (e.g., microwaves, radio waves, ultraviolet waves).

The second (LED) array for the first image component produces a set of visual image components, each representing a small portion of the original image. Each small portion of the image, as represented by the second array, is transparent (or, alternatively, opaque) unless that small portion of the image has at least one FDI frequency with an associated signal intensity or strength that is at least a selected threshold intensity value. If a frequency in the FDI (referred to for convenience herein as an "FDI frequency") for a pixel in the first image component has an associated signal intensity or signal strength at least equal to a selected threshold intensity value, that image pixel will have a non-transparent (or non-opaque) image component representing the above-threshold FDI frequency present.

An output signal from the second array of LEDs for the first image component will thus be transparent (or opaque), except for individual LED flixels where at least one FDI frequency is present with an associated signal intensity or strength at least equal to the threshold intensity value. This output signal from the array of LEDs is re-aligned and combined, flixel-by-flixel, with corresponding pixels of the second image component and is presented as a combined image in a visually perceptible format, or an electronic format corresponding to this combined image.

In another embodiment, the second image component is divided into pixels of the original image, corresponding to flixels in the array of FDI detectors, and is processed as a standard visual image. The original image is again divided into a first image component and a second image component, and the first image component is divided into pixels of the original image corresponding to the flixels of the first image component, and each pixel signal is passed through an optical detector array (e.g., visible or near-infrared or near-ultraviolet) to produce a standard visual image, with flixel-by-corresponding-flixel alignment of the first and second image components. The first image component flixels and the aligned second image component pixels are combined in a microprocessor, and the combined images are displayed directly on a display screen in a visual format.

In yet another embodiment, a directional antenna having a narrow angular sector (e.g., 10°-30°) and an adjustable (narrow) view video camera are mounted on first and second turntables that are rotationally coordinated so that the antenna "view" and the video camera view substantially the same narrowly defined portion of a selected scene, producing first and second image components, respectively. An antenna output signal is received by a frequency-limited detector (e.g., a flixel or group of related flixels) with a narrowly defined FDI (e.g., having a frequency resolution of $\Delta f \approx 330$ KHz). Spectral analysis is performed by a computer on an output signal from the frequency detector for each of a sequence of frequency resolution windows that cover the total frequency interval width of interest, such as, for example, 1 MHz or 5 MHz or 20 MHz width. Optionally, the computer includes a visual display for an associated signal intensity for each FDI. Spectrum-analyzed computer output signals are carried on a data transmission medium (e.g., an S-video channel) and received and processed by a composite converter module to produce a first component of a composite video signal. The video camera produces a second component of the composite video signal, and the first and second components are received and processed by a video signal mixer to produce a visually perceptible composite video signal, including a visually perceptible image component (video camera) of the scene and a frequency-limited overlay component as an image overlay.

In each embodiment, the visual intensity of the frequency-limited overlay component can be weighted according to the relative intensities of the FDI components, or according to any other suitable weighting allocation. The frequency-limited overlay components can be presented as time-sequenced image overlays, or can be presented in one or more groupings of FDIs.

FIG. 1 illustrates the general context of the disclosure where visible and FDI views of the same scene (field of view) are captured, processed and visually overlaid by each processing arm.

Figure 2:
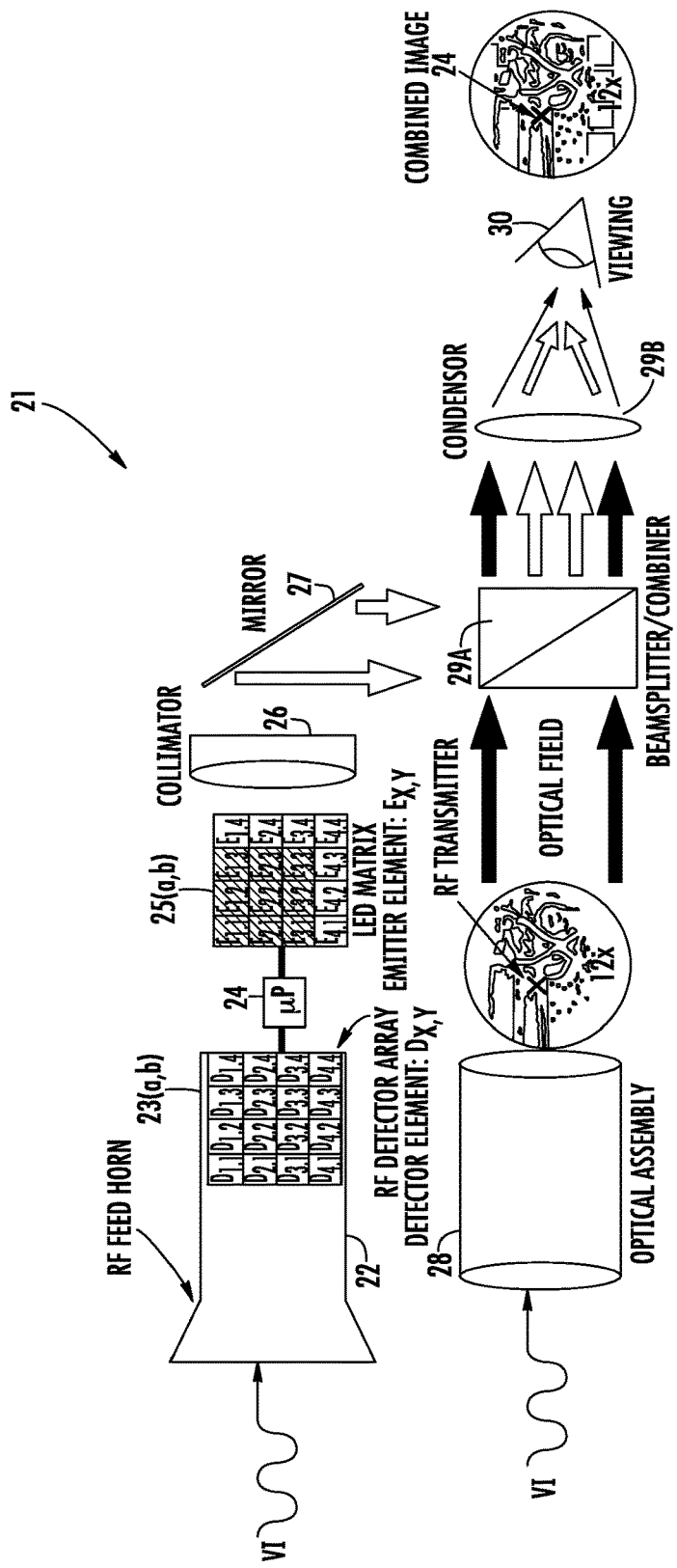
FIGS. 2-4 are schematic illustrations of a frequency visualization system according to one embodiment of the disclosure.

FIG. 2 schematically illustrates an embodiment of the disclosure. A visual image (VI) signal is received by an FDI feed horn 22 (e.g., an RF feed horn), and the signal(s) is fed to a first array 23 of M1 frequency detectors 23($a,b$). In one approach, each frequency detector 23($a,b$), with a corresponding location indexed as L(m1), has the same frequency-limited detection interval FDI (e.g., 2.395≤f (GHz) ≤2.405) for each detector. The FDI can be varied from one frequency interval to another to cover a desired frequency range.

Presence (or absence) of one or more frequencies in the selected FDI is sensed at each of the M1 regions in the visual image signal received by the FDI feed horn 22. The signal produced at each location L(m1)(m1=1, . . . , M1) by a corresponding frequency detector is processed by a programmed microprocessor 24, and the processed signals produce a second array 25 of output signals at M2 LEDs 25($a,b$), numbered m2=1, . . . M2 (M2≈M1), with the signal produced at frequency detector number m1 corresponding to and being received at LED number m2=m1 to produce an LED output signal number m2=m1. The sequence of LED output signals is collimated and aligned by a collimator 26 and reflected by a mirror 27 to produce an array of FDI signals, with the same FDI.

The VI signal is also received by a video camera or other image formation mechanism 28 that produces a visually perceptible field of pixel values, with each pixel corresponding to a flixel in the FDI array, and the pixel signal(s) is combined with the FDI signal from the mirror 27 in a beamsplitter and combiner 29A. The combined beams (FDI plus original visual image) are optically processed by a condenser 29B and are presented at a viewing mechanism 30, which may be a display screen or other suitable electronic instrument.

Figure 3:
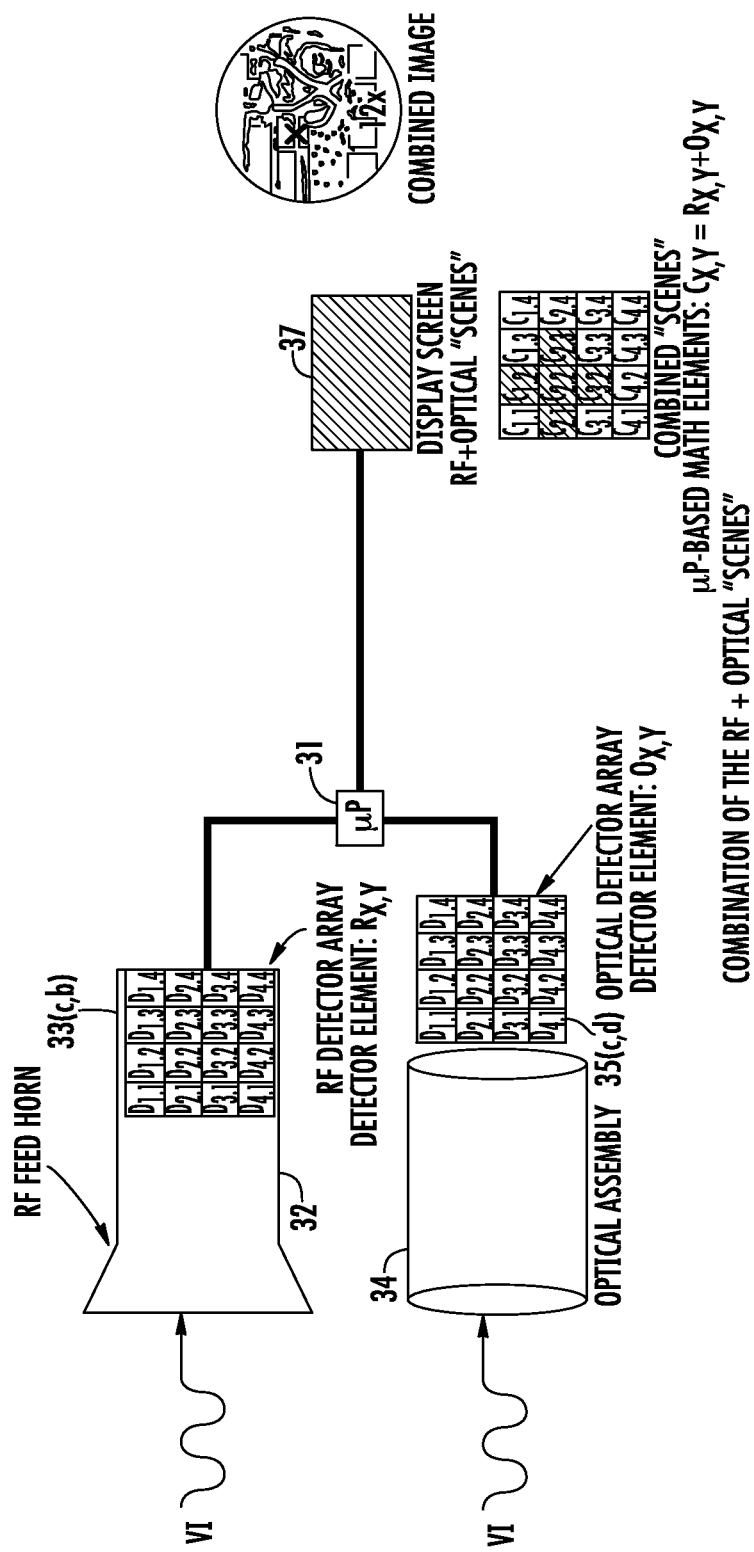

In another embodiment, shown in FIG. 3, the VI signal is again divided into a first image component and a second image component, and the first image component is passed through an FDI feed horn 32 to an array 33 of M1 frequency detectors 33($c,d$) to provide a sequence of flixels, with each flixel corresponding to a small selected area of the visual image VI. Optionally, in each embodiment, a flixel in the array 33 ($c,d$) registers information for the specified FDI only if the signal intensity (peak or integrated, as desired) is above (or at least equal to) a selected threshold intensity value; otherwise, the flixel is transparent (or, alternatively, opaque). The second image component is passed through an optical assembly to an array 35 of optical detectors 35($c,d$), covering a visible and/or an infrared frequency interval of interest, with each pixel 35($c,d$) in the optical detector array 35 corresponding to a flixel 33 ($c,d$) in the FDI detector array 33. The output signals from the FDI detector array 33 and the output signals from the optical detector array 35($c,d$) are combined, flixel-by-corresponding-pixel, in a microprocessor 31 and presented to a display screen or other visualization mechanism 37. Where the first image component is blocked, only a conventional visually perceptible optical image appears on the visualization mechanism 37. Where the second image component is blocked, information appears on the visualization mechanism 37 only for the flixels with the intensity values at or above threshold in the specified FDI. Where neither the first image component nor the second image component is blocked, a composite image (above-threshold FDI plus optical image) appears on the visualization mechanism 37.

Figure 4:
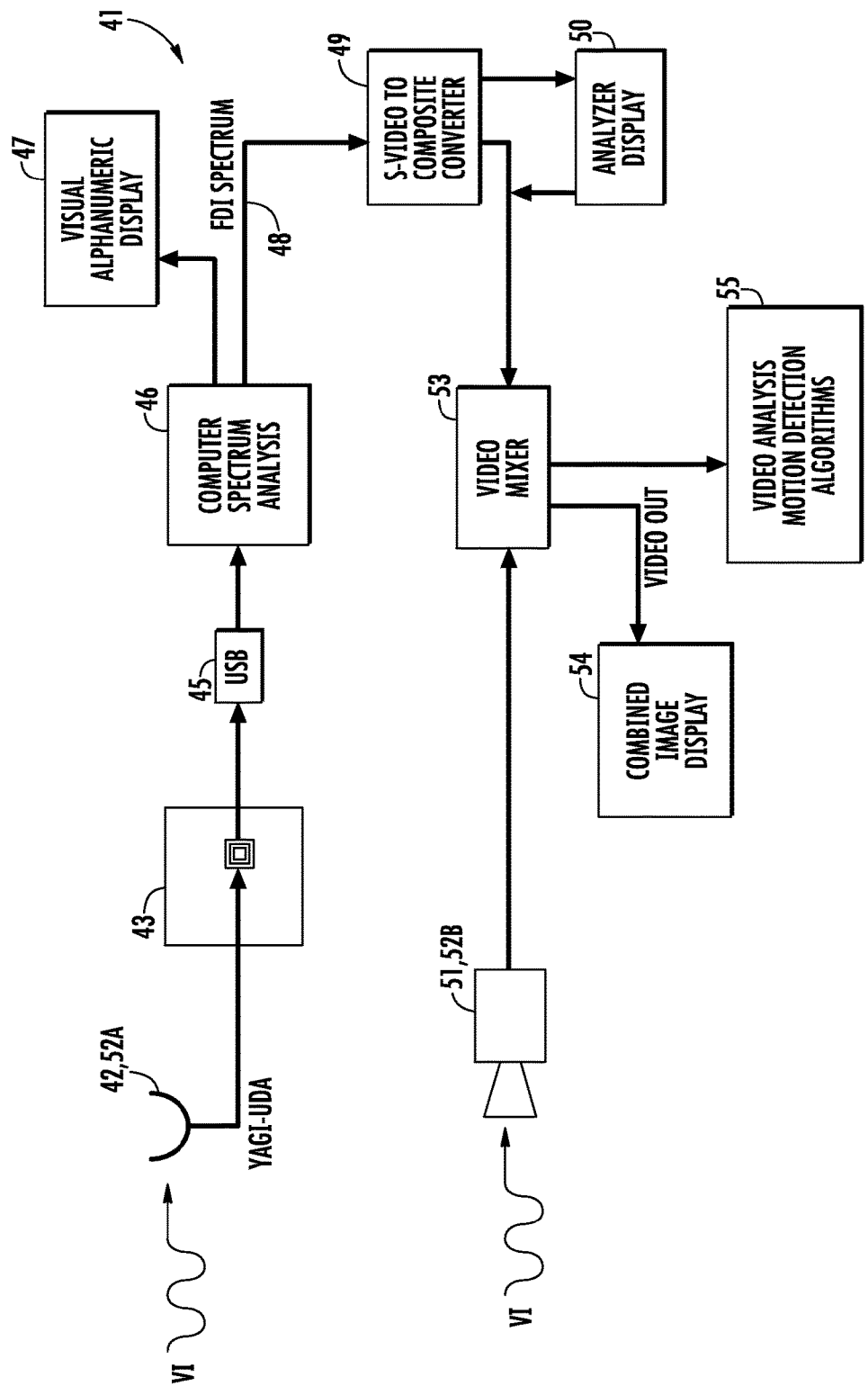
Figure 5:
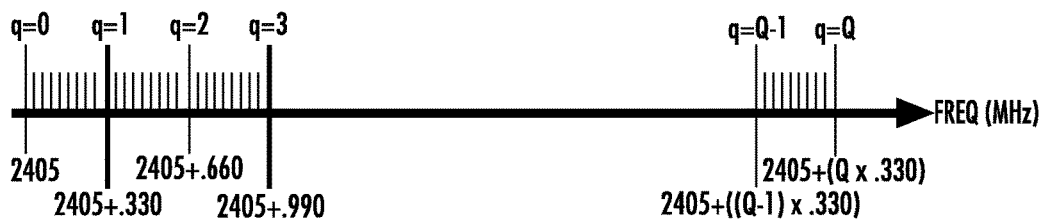
FIG. 5 is an illustration of a division of a portion of a frequency interval into distinct frequency segments according to one embodiment of the disclosure.

FIG. 4 schematically illustrates yet another embodiment 41, which is partly parallel to the embodiment, in FIG. 2. A VI signal is received by a directional antenna 42, such as a Yagi-Uda multi-element directional antenna operating in a selected portion (FDI) of the electromagnetic spectrum, for example, with a 10°-30° sector (adjustable or fixed) field of view and an 18 dB gain factor. An output signal from the directional antenna 42 is received by a frequency-limited detector 43 which has an FDI in a selected portion of the range 2.405≤f (GHz)≤2.485, for example, and a frequency resolution of Δf≈330 KHz. Spectral analysis is performed on the received signal within this 330 KHz window, yielding a synthesized set of FDI signals, each having a relatively small frequency width, such as Δf≈330 KHz, with a central frequency of $f_q$(KHz)=2405+165+330q (q=1, ..., Q). In this configuration, the FDI signal detector 43 covers a frequency range of 2405 KHz≤f≤2405+Q330 KHz, as illustrated in FIG. 5. Optionally, two, three or more of the FDI frequency intervals (consecutive or non-consecutive) can be combined for display as part of an image overlay.

The detector-processed signal in FIG. 4 is received by an input port 45 (e.g., a USB port) on a computer 46, having an optional display mechanism 47 (e.g., a split screen display) that is programmed to perform spectrum analysis on each of the input signals. The spectrum-analyzed output signals from the computer 46 are sent on a data transmission medium 48 (e.g., an S-video channel) and are converted by a composite converter 49 to produce composite video signals on an analyzer display 50, according to an IEEE standard (e.g., one of the standards IEEE 802.11, 802.15.1 or 802.15.4). Optionally, visual image information in at most one of the frequency segments at a time, 2405+165+330q≤$f_q$ (KHz)=2405+165+330(q+1) is received by the S-video-to-composite converter 49 and is provided as a frequency-limited component of a first composite video output signal.

Figure 8:
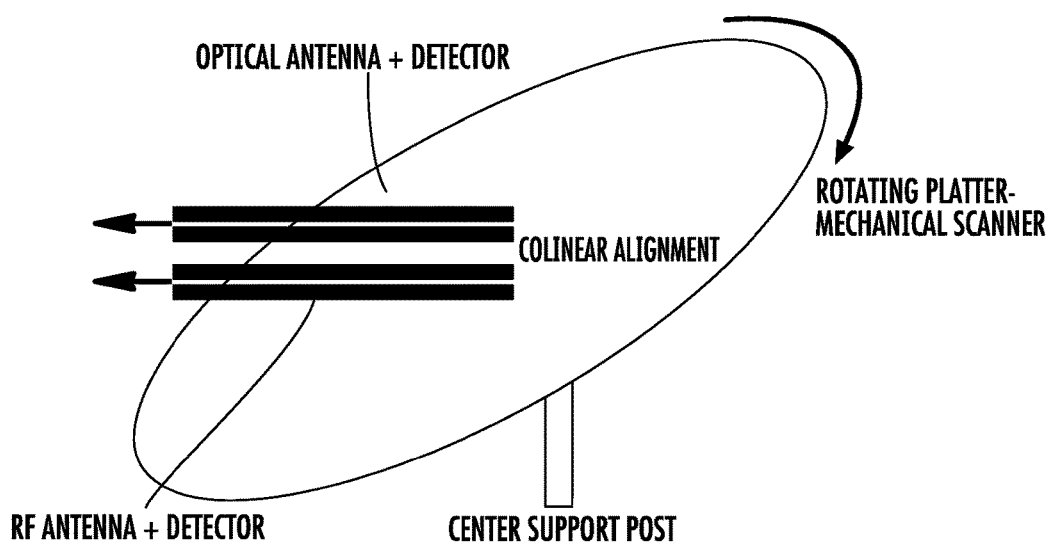
FIG. 8 illustrates an optical and RF antenna mounted to turntables to facilitate alignment of received images according to one embodiment of the disclosure.

The visual image signal VI, or a parallax-correlated replica of the VI signal is also received by a video camera 51 with an adjustable (narrow) field of view. Preferably, the directional antenna 42 and the video camera 51 are mounted on one or more turntables, 52A and 52B (illustrated in FIG. 8), that provide substantially aligned visual image views. The visual image view from the video camera 51 and the frequency-limited output signal from the composite converter 49 are received at first and second input terminals of a video mixer 53. A first composite video output signal from the video mixer 53 is received by and displayed at a visual display mechanism 54, such as a display screen.

Figure 6:
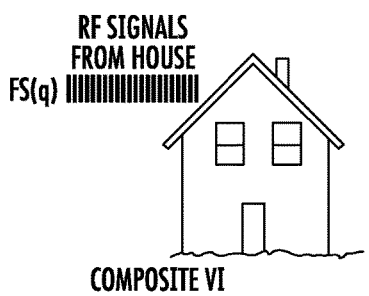
FIG. 6 is an illustration of an overlay of a visually perceptible image and a frequency-limited overlay according to one embodiment of the disclosure.

The display on the display mechanism 54 presents the visually perceptible VI signal, plus a visually distinguishable and partly transparent overlay, illustrated in FIG. 6, that indicates the presence of electromagnetic signals in a selected frequency segment, such as, for example, 2405+165+330q≤$f_q$(KHz)=2405+165+330(q+1), in part or all of the VI signal received. The FDI frequency segment may appear in only part of or in all of the composite image. Presence of the frequency segment may be indicated by use of an unusual color, such as deep purple, or by use of a pattern having a discernable texture, such as stripes or cross-hatching, as an overlay in portions of the displayed VI signal where the frequency segment is present (with intensity values at or above threshold). The intensity of this overlay can be caused to increase monotonically with increasing a signal intensity of the frequency segment, and this intensity can be variable over different portions of the VI signal and the composite image. Optionally, different frequency segments $f_q$, corresponding to q=1, 2, ..., Q, can be shown in a time shared manner as overlays in different timer intervals, preferably non-overlapping, with an associated indicium that identifies which frequency segment $f_q$ is currently being viewed as an overlay. In one cycle, with temporal length of 2-30 sec., all frequency segments can be shown as separate overlays on the VI signal at different times in the cycle.

Figure 7:
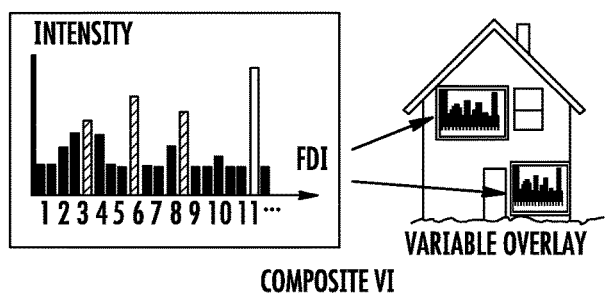
FIG. 7 is an illustration of a visually perceptible image with a graphical overall representing relative signal intensities in a sequence of FDIs according to one embodiment of the disclosure.

Alternatively, relative intensities of the different FDI frequency segments can be displayed graphically as a histogram on the visually perceptible image, as illustrated in FIG. 7, with two or more FDI contributions displayed as separate bars.

A second composite video output signal from the video mixer 53 is optionally received by a computer module 55 (e.g., Linux-based), which is programmed to detect motion (e.g., change in, one or more FDI segment overlays, by comparison of a frequency selector output signal intensity at two or more distinct times. The motion detector computer module 55 can be programmed to provide an audibly perceptible or visually perceptible alert or alarm signal whenever the change or difference in two or more of the fixed frequency segments, relative to each other, with passage of time is at least a selected threshold difference level.

As noted in the preceding disclosure, the visual intensity of each frequency-limited overlay component can be weighted according to the relative intensities of the FDI components, or according to any other suitable weighting allocation. For example, where relative intensity of one or more of the FDI components is changing, as sensed by a change detector module (e.g., 55 in FIG. 4), the relative intensity can be replaced by (i) time averaged mean of the relative intensity, (ii) standard deviation of the relative intensity, (iii) standard deviation, divided by mean, of the relative intensity, or (iv) mean plus a selected fraction (e.g., 0.5 or 1 or 2) of the standard deviation of the relative intensity. The frequency-limited overlay components can be presented as time-sequenced image overlays, or can be presented in one or more groupings (adjacent or non-adjacent) of FDIs to provide more extensive frequency coverage.

The displayed or visual intensity of each frequency-limited overlay component can also vary monotonically with the relative intensities of the FDI components so that, for example, a larger FDI relative intensity will produce a more intense visual display of the FDI component.

The frequency interval, 2405≤f (KHz)≤2405+Q330, illustrated in FIG. 5 can be replaced by any other frequency interval that covers part of or all of the rf range, the microwave range, the infrared range, the visible range and/or part or all of the ultraviolet range, for purposes of application of various embodiments of the disclosure.

The frequency visualization system may be adapted to a portable form factor such that the frequency visualization system may be mounted to a vehicle or carried as a light-weight portable device, such as the device illustrated in FIGS. 9-15.

Figure 9:
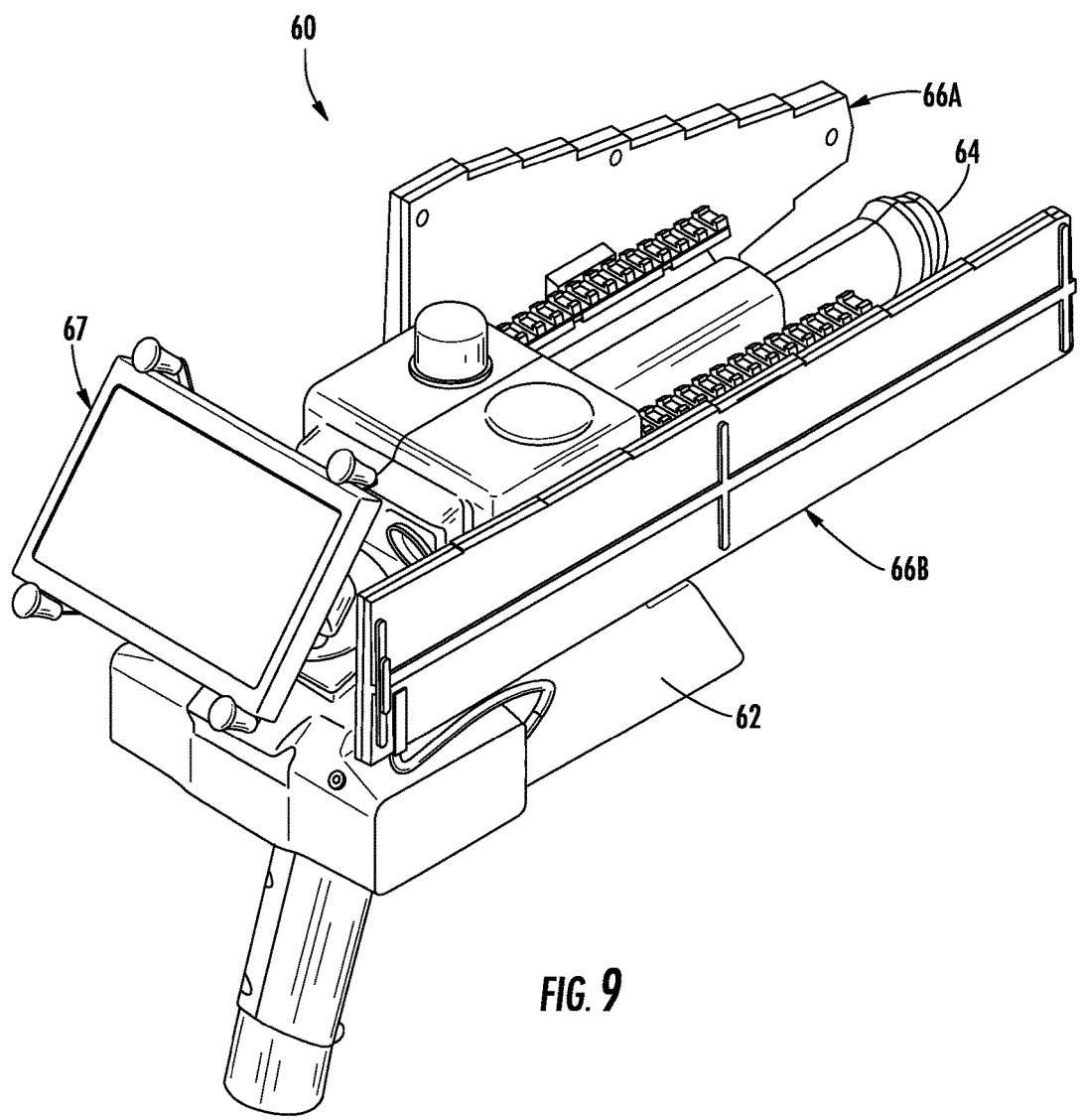
FIG. 9 shows a somewhat schematic perspective view of a portable handheld frequency visualization apparatus as described herein.

FIG. 9 shows a perspective view of one embodiment of a portable frequency visualizer 60. The portable frequency visualizer 60 includes a housing 62, a camera 64, one or more antennas 66A and 66B for detecting various frequencies as disclosed above and a display 67. The portable frequency visualizer 60 is compact allowing the visualizer 60 to be operated handheld by a single user. The portable frequency visualizer 60 can be battery powered and/or powered by a DC power source or an AC power source and passed through an AC/DC converter.

Figure 10:
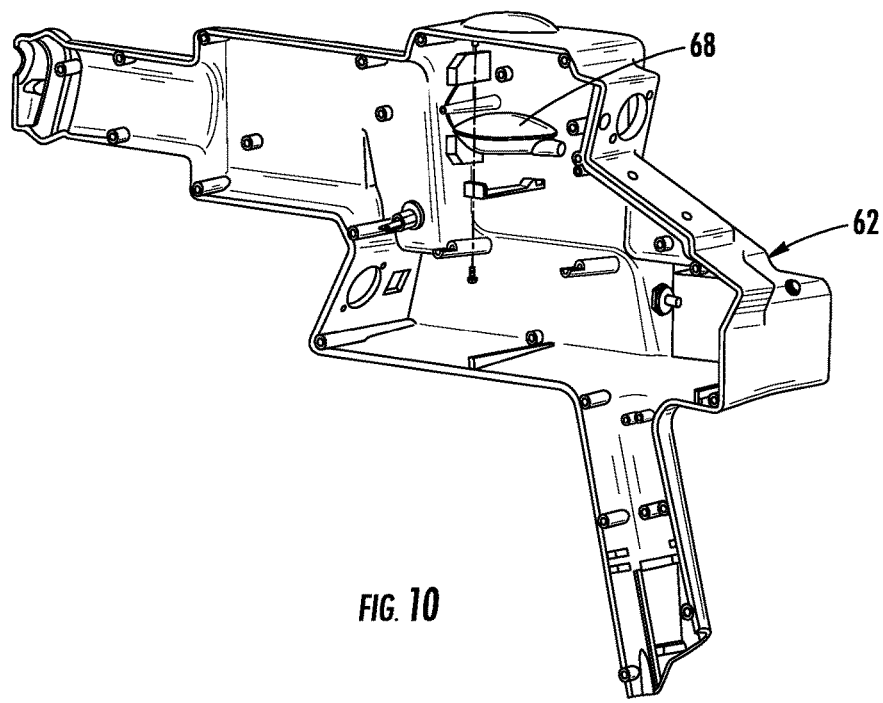
FIG. 10 shows a somewhat schematic internal side view of the portable handheld frequency visualization apparatus shown in FIG. 9.
Figure 11:
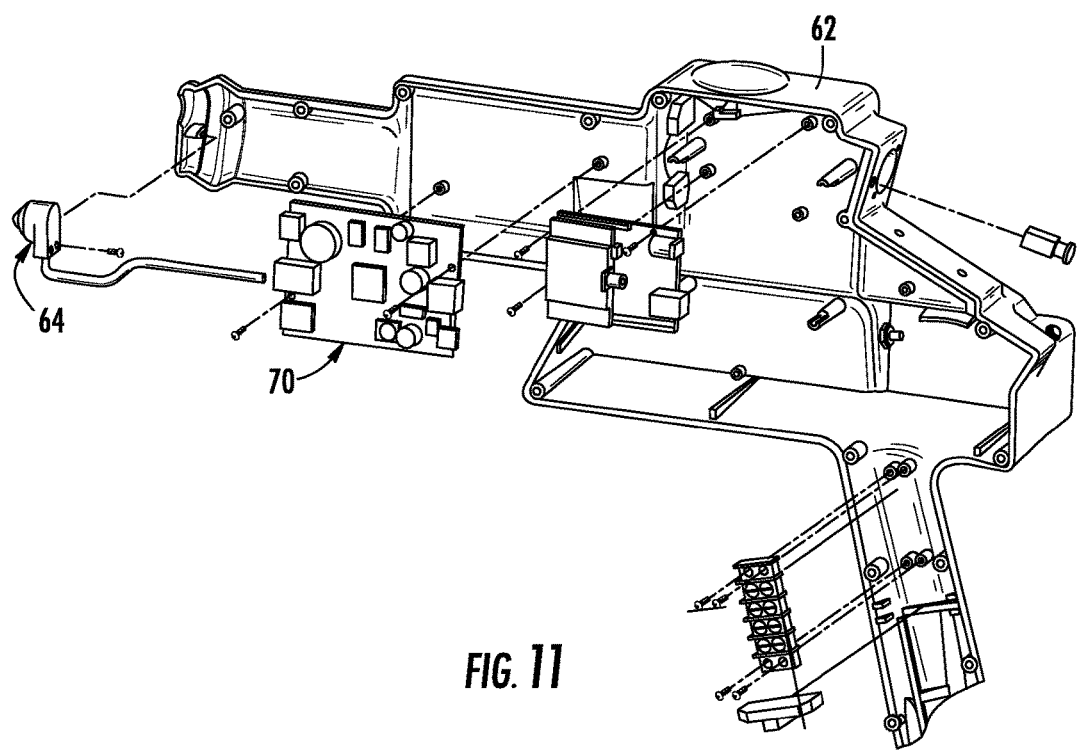
FIG. 11 shows a somewhat schematic exploded internal side view of the portable handheld frequency visualization apparatus shown in FIG. 9.

Referring to FIGS. 10 and 11, a cross-sectional side view of the portable frequency visualizer 60 is shown. The portable frequency visualizer 60 includes a GPS module 68 for locating a position of the visualizer and user. The camera 64 is secured in a forward portion of the portable visualizer 60 relative to the user, with the camera 64 in communication with a camera control board 70.

Figure 12:
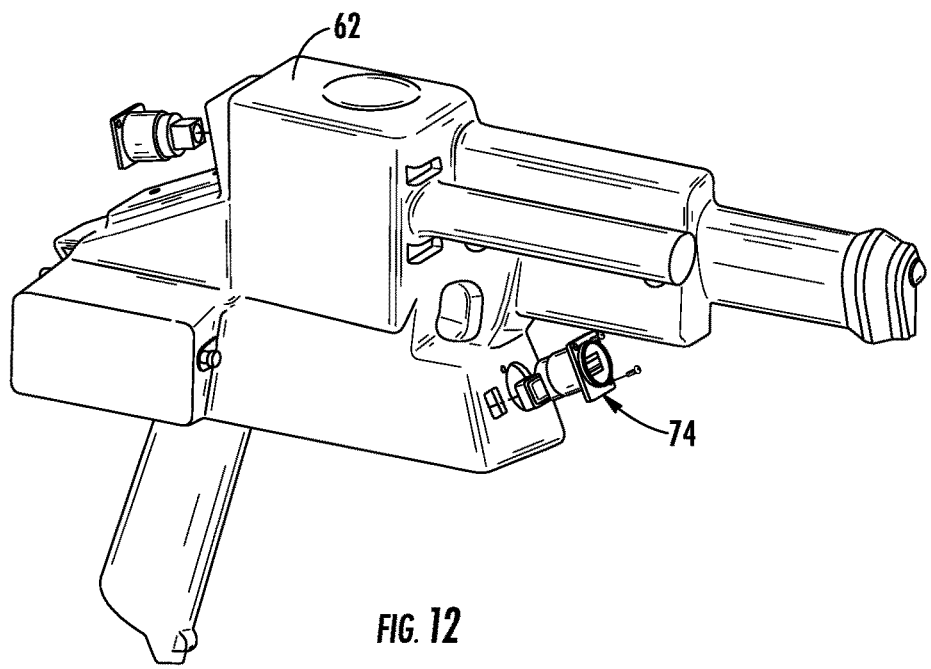
FIG. 12 shows a somewhat schematic external side view of the portable handheld frequency visualization apparatus shown in FIG. 9.
Figure 13:
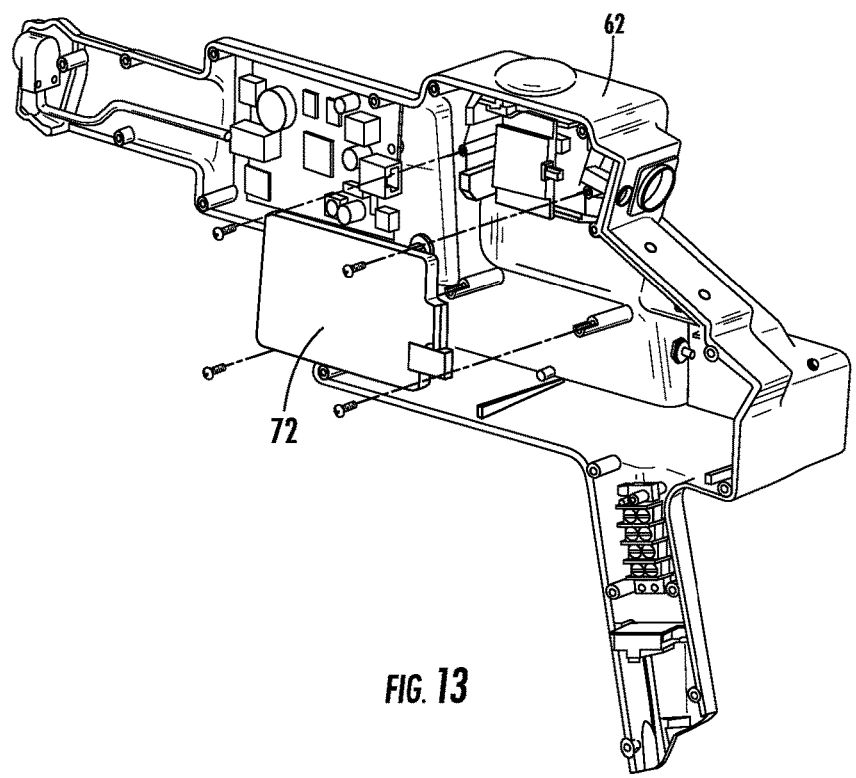
FIG. 13 shows a somewhat schematic exploded internal side view of the portable handheld frequency visualization apparatus shown in FIG. 9.

The portable frequency visualizer 60 further includes a storage component 72 such as a hard drive or solid state storage device and a connection terminal 74 such as, for example, a USB port for communicating with external devices such as a personal computer or other accessories as shown in FIGS. 12 and 13.

Figure 14:
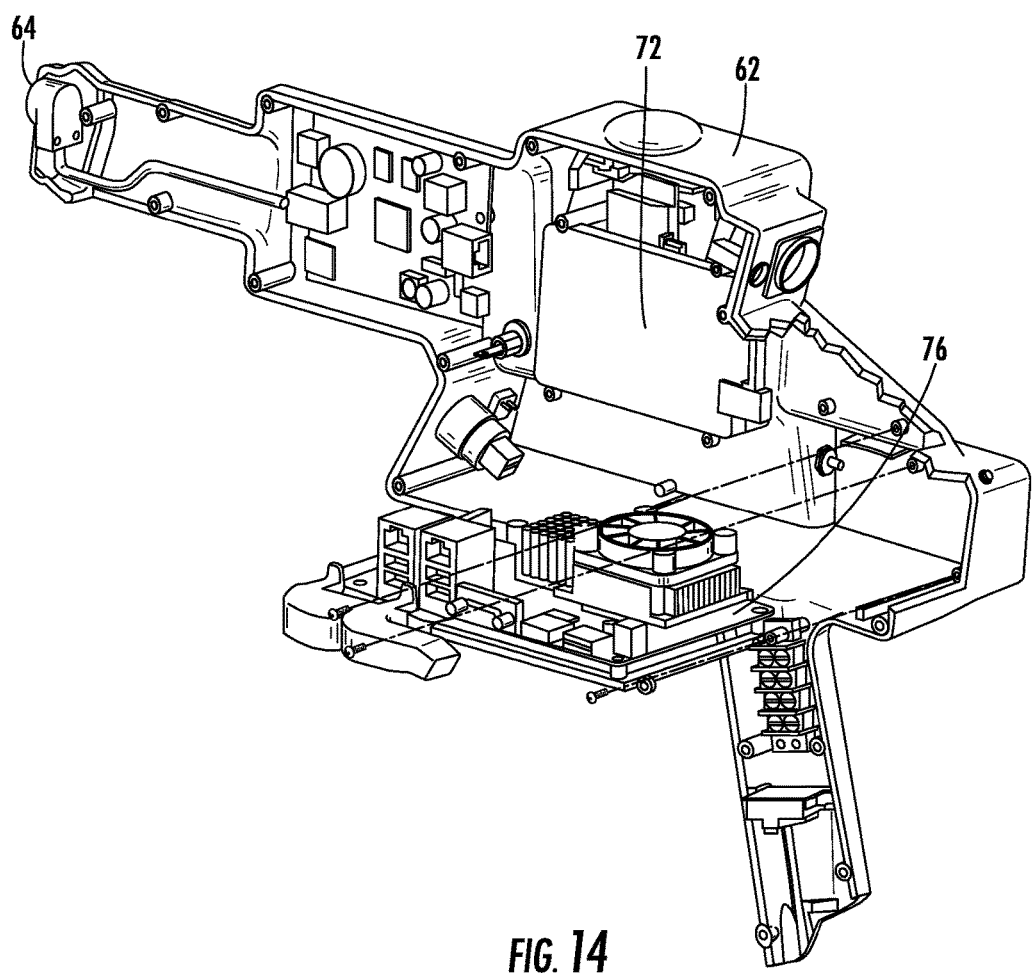
FIG. 14 shows a somewhat schematic exploded internal side view of the portable handheld frequency visualization apparatus shown in FIG. 9.
Figure 15:
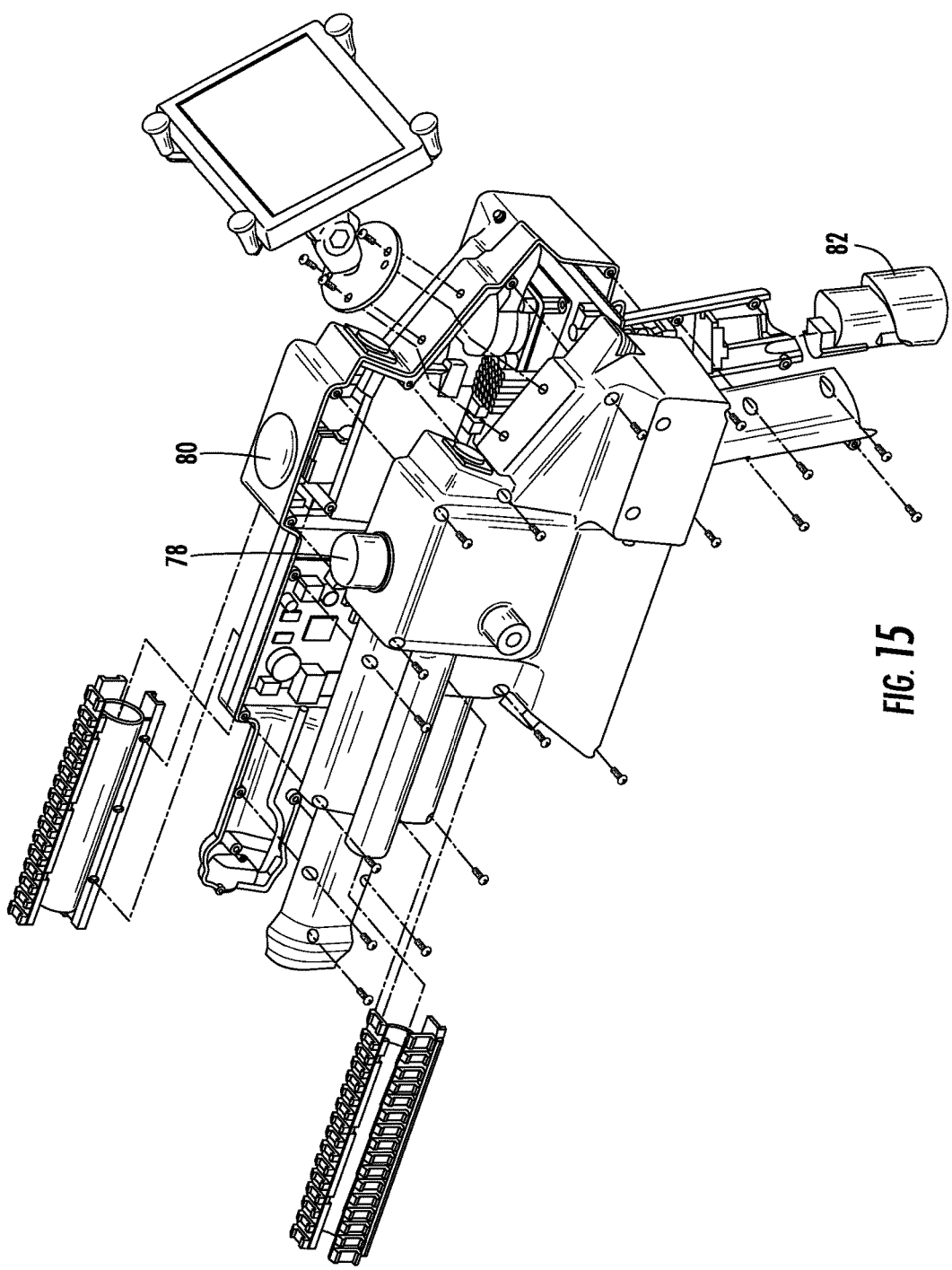
FIG. 15 shows a somewhat schematic exploded view of the portable handheld frequency visualization apparatus shown in FIG. 9.
Figure 16:
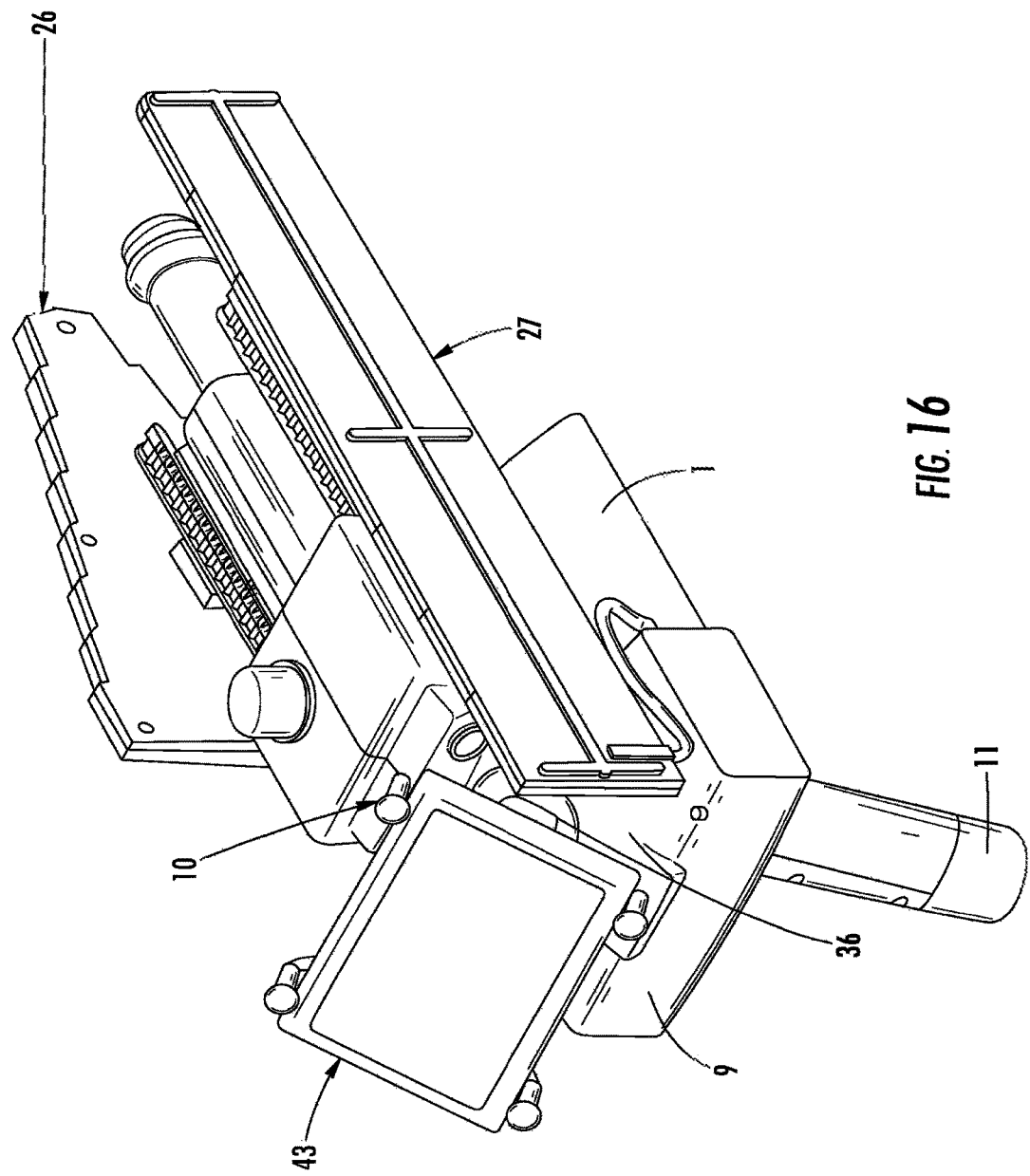
Figure 17:
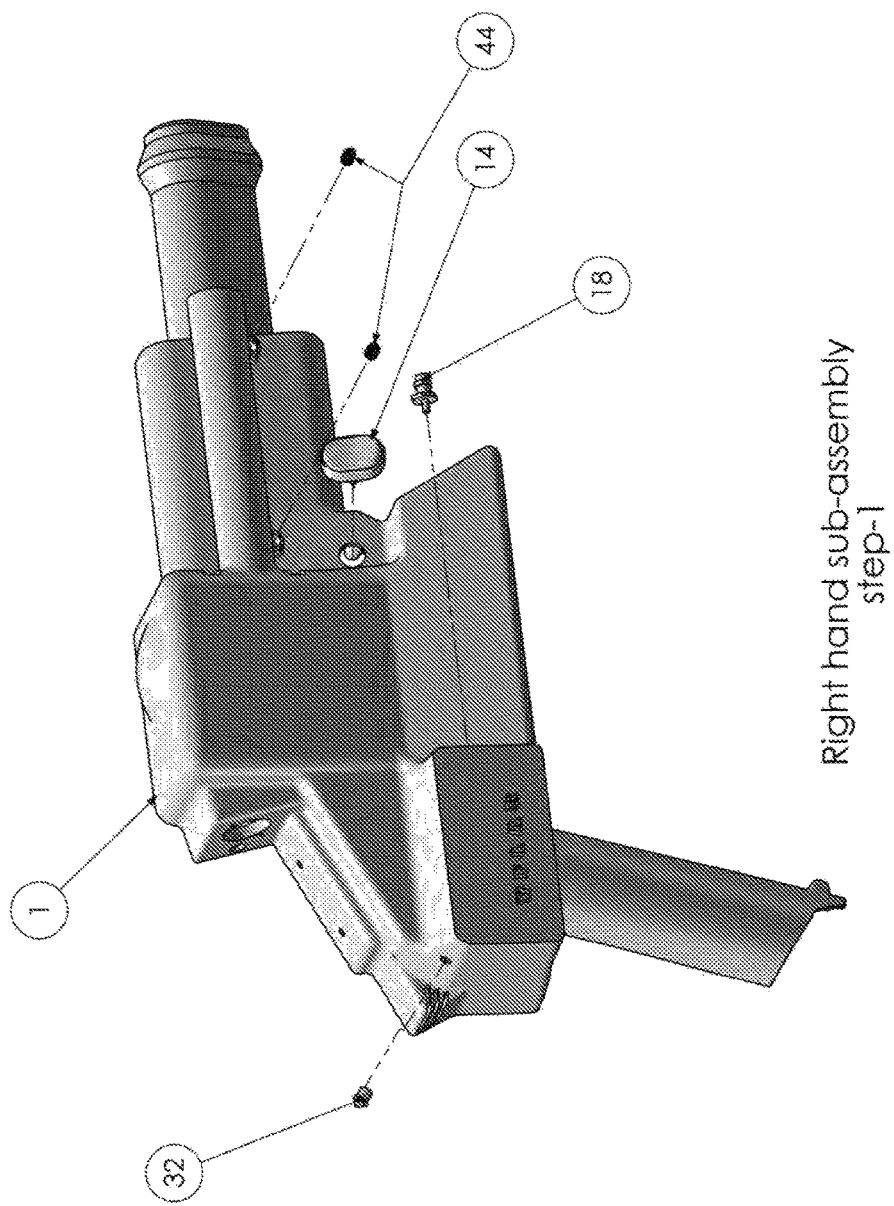
Figure 18:
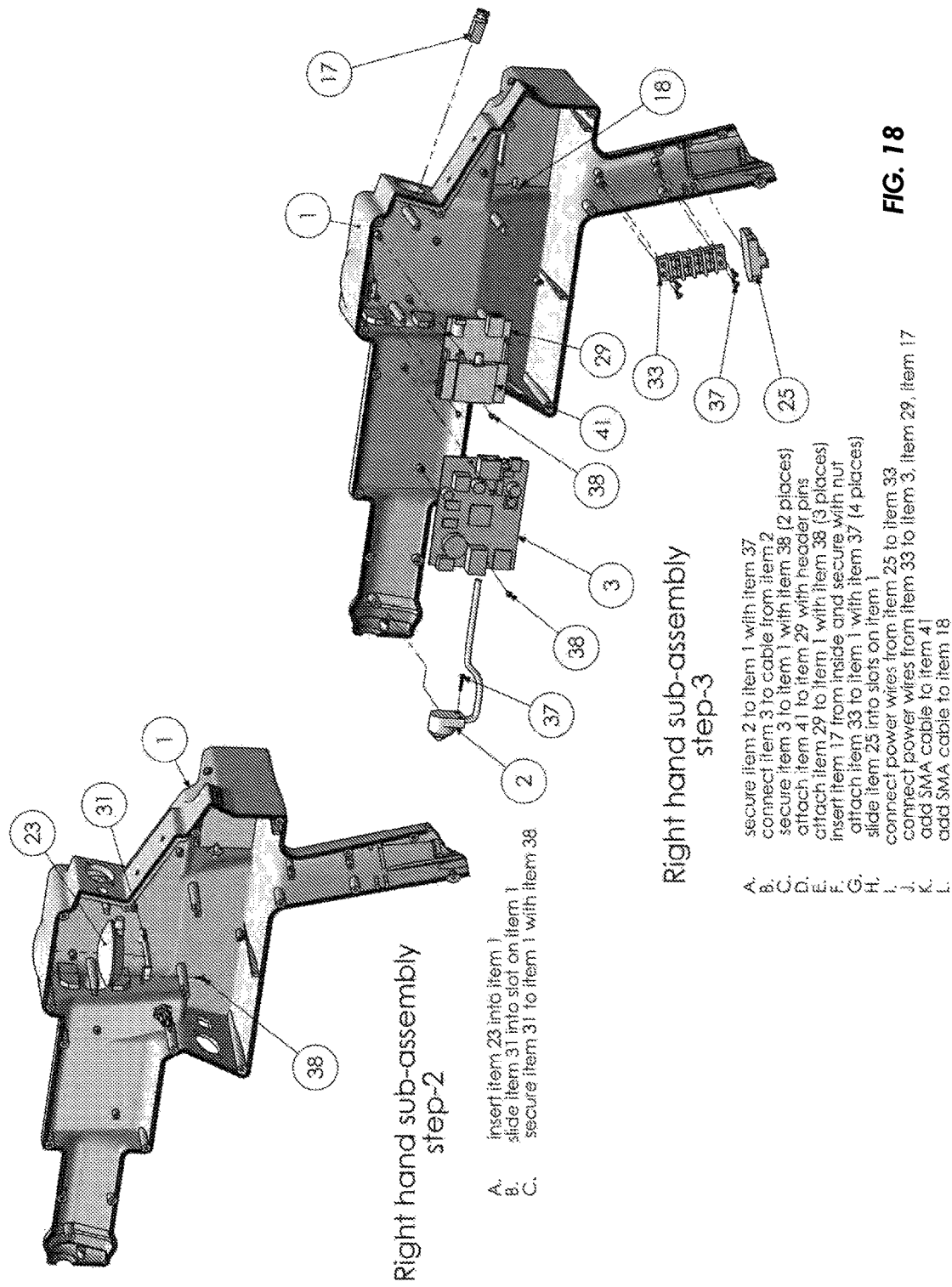
Figure 19:
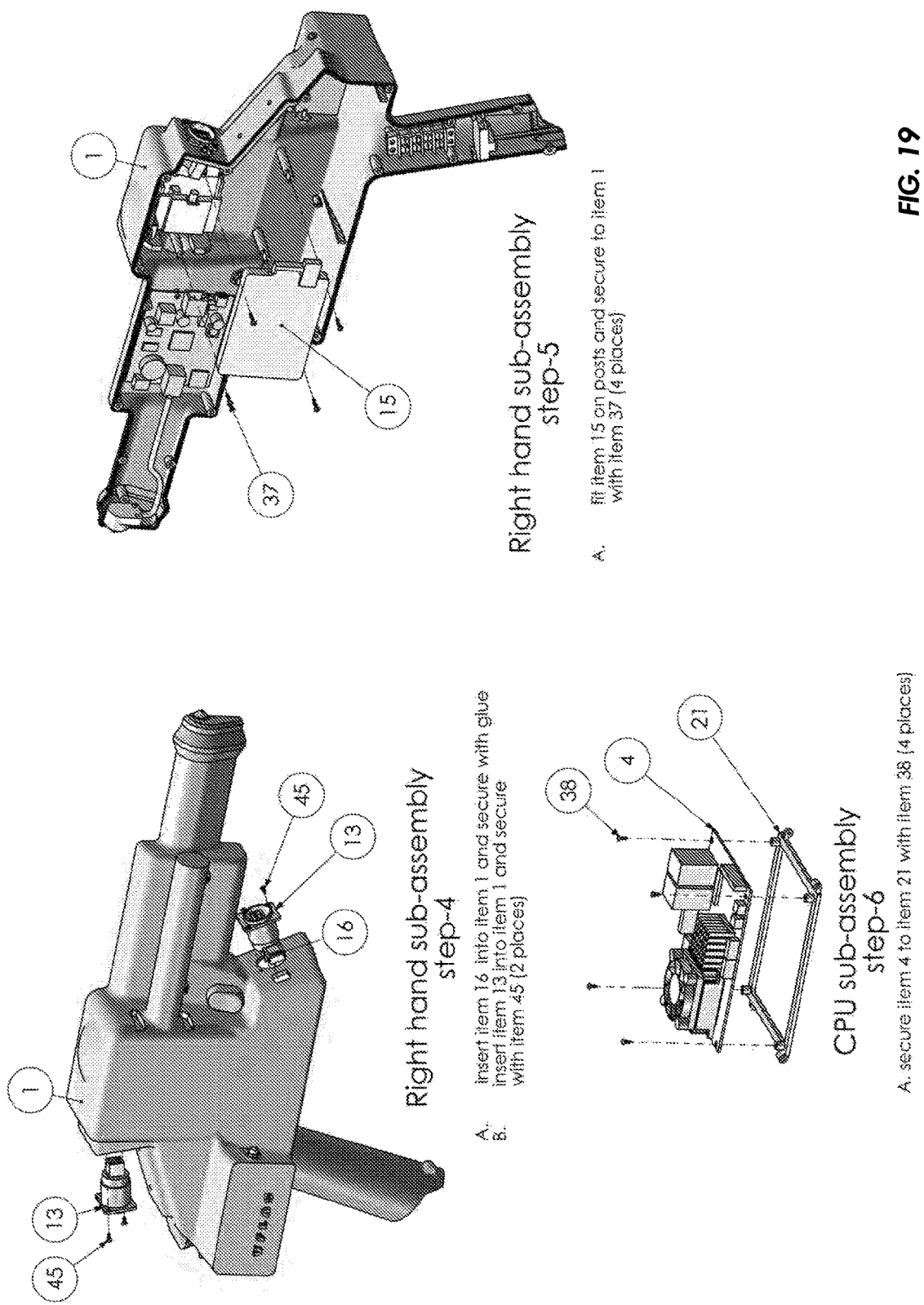
Figure 20:
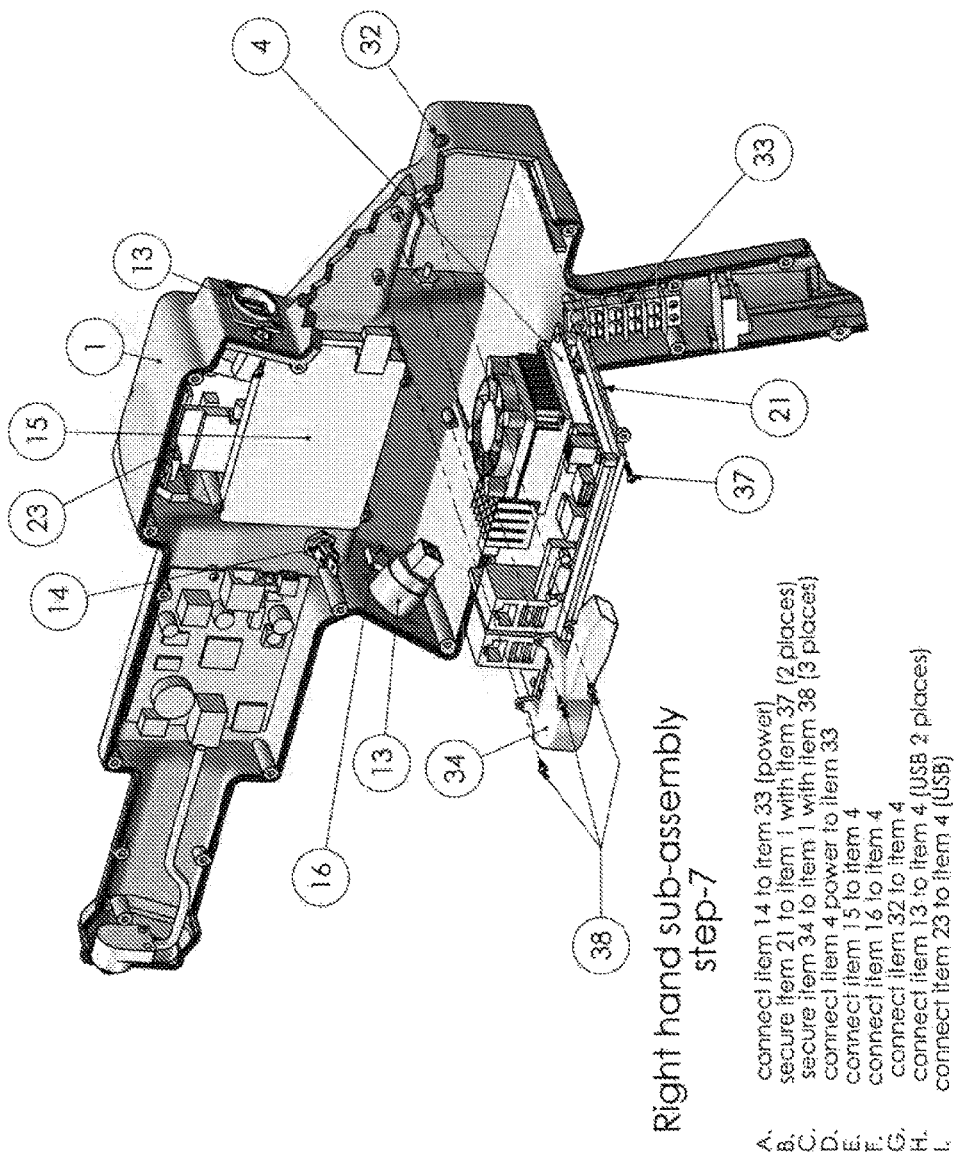
Figure 21:
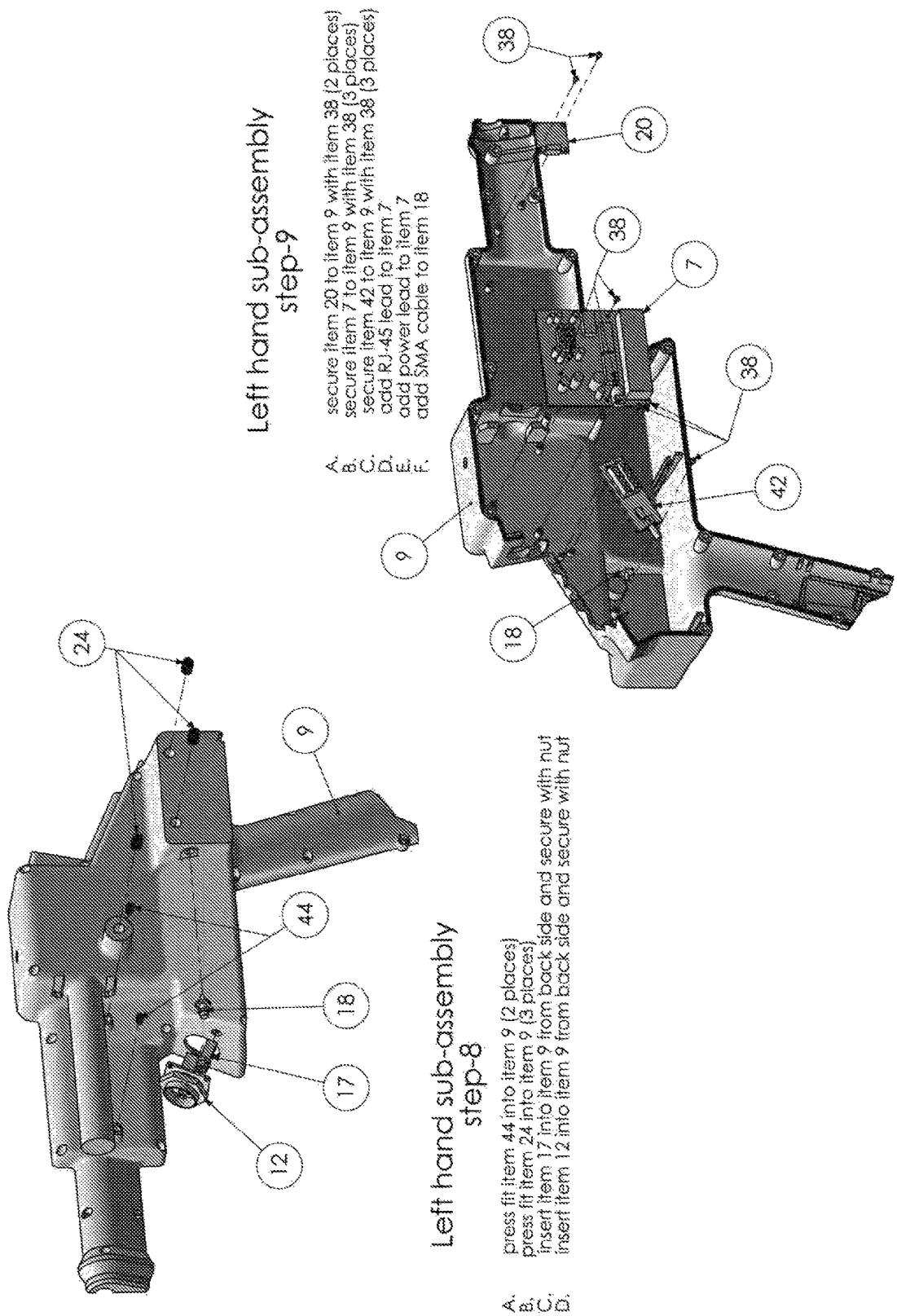
Figure 23:
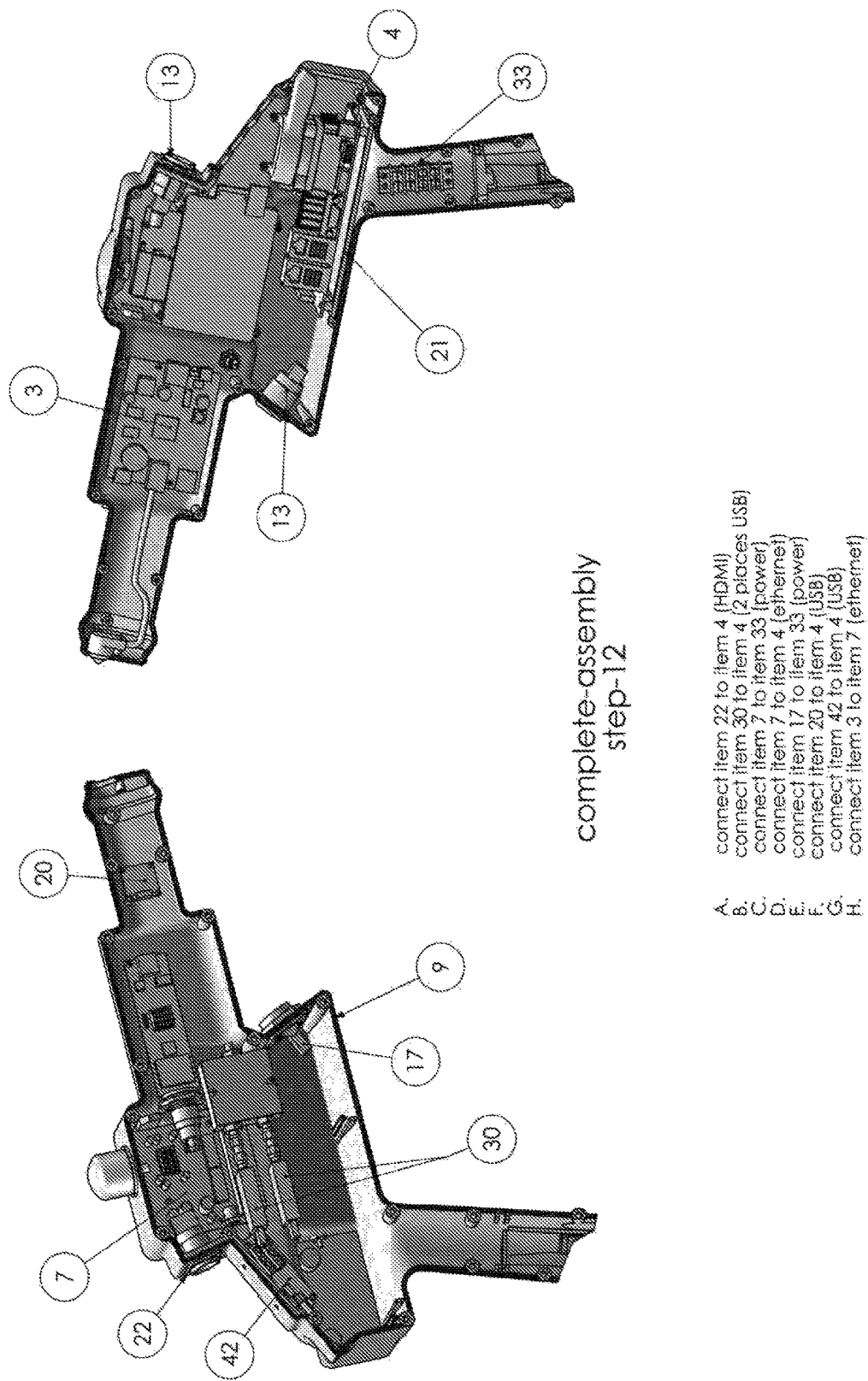
Figure 24:
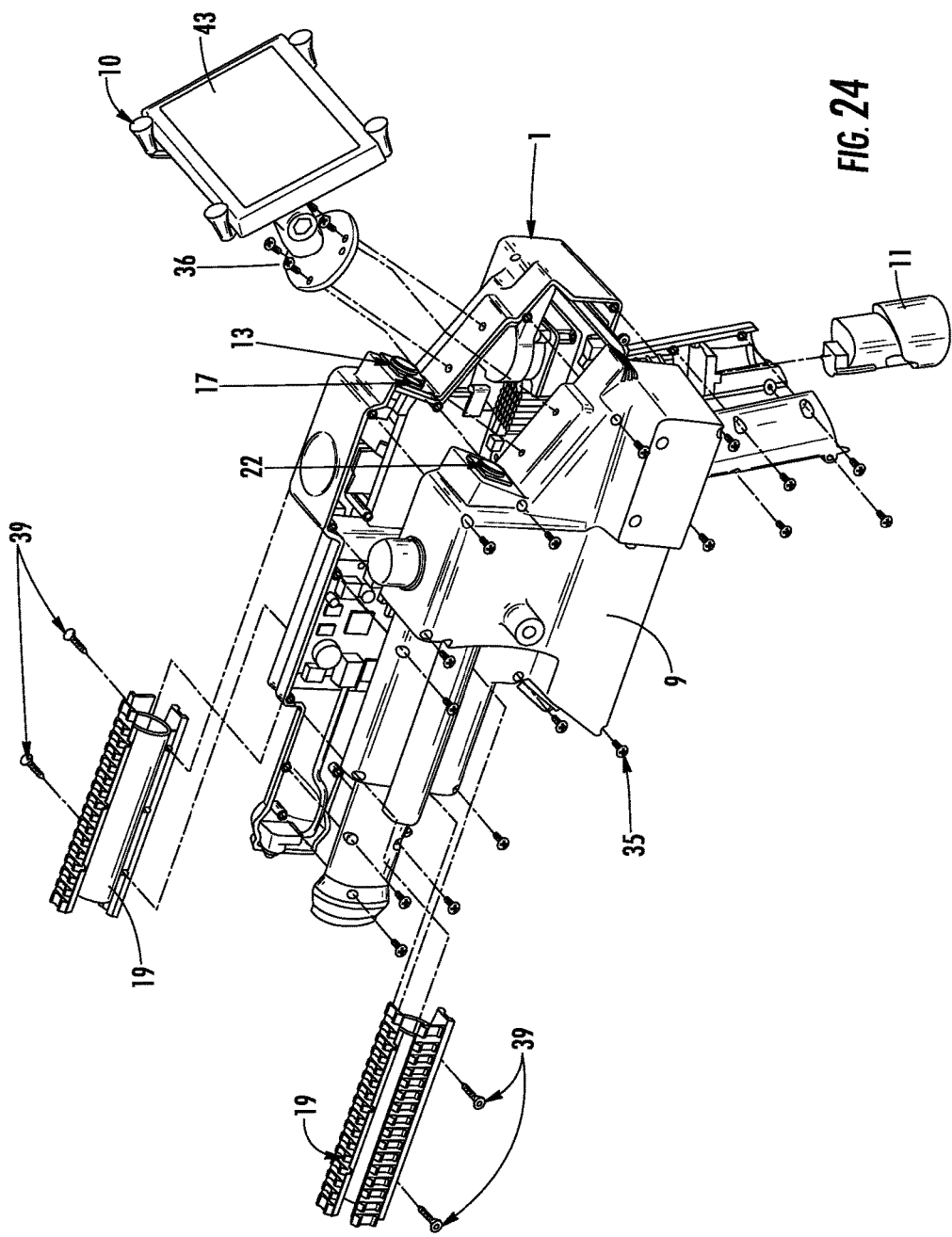

Referring now to FIG. 14, the portable visualizer 60 includes a CPU module 76 in communication with the various components of the visualizer 60 for overlaying detected frequencies detected by the one or more antennas 66A and 66B from images received by the camera 64 and displaying the overlayed frequencies and image on the display 67. Additional components of the portable visualizer 60 include a wireless communications component 78, such as, for example, a WiFi antenna and/or a microwave antenna, a GPS unit 80 and a replaceable and rechargeable battery 82 as shown in FIG. 15, all of which are preferably connected either directly or wirelessly to the CPU module 76.

FIGS. 16-24 illustrate an assembly of a portable handheld frequency visualization apparatus according to one specific embodiment of the frequency visualization apparatus. The portable handheld frequency visualization apparatus shown in FIGS. 16-24 enables a user to easily manipulate or carry the frequency visualization apparatus.

Figure 25:
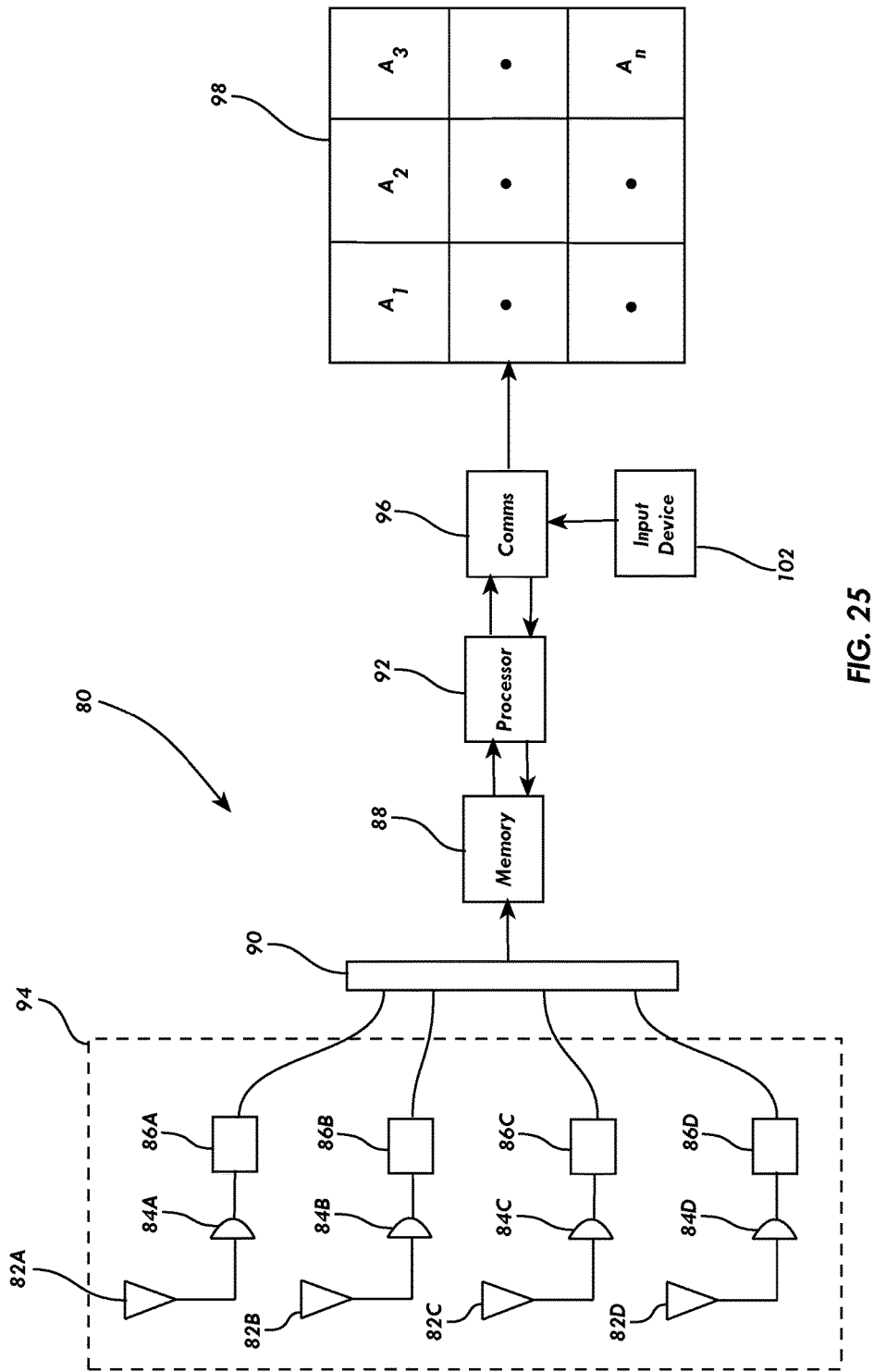
FIG. 25 shows a somewhat schematic view of a radio frequency imaging apparatus according to one embodiment of the disclosure.

FIG. 25 shows a basic embodiment of a RF imaging apparatus 80 according to the disclosure. The RF imaging apparatus 80 includes two or more directional RF antennas 82A-82D configured to detect one or more RF signals over a desired bandwidth. For example, the two or more (and more preferably, at least four or more) directional RF antennas 82A-82D may be formed of Yagi-Uda directional antennas or other like directional RF detectors. The two or more directional RF antennas 82A-82D are configured to detect RF signals in a substantially distinct area of a field of view of the RF imaging apparatus 80. When one of the RF antennas intercepts an RF signal, a small voltage is produced across an output of the RF antenna, the voltage corresponding to the strength of the intercepted RF signal. Two or more amplifiers 84A-84D are in communication with each corresponding two or more directional RF antennas 82A-82D. Each respective voltage from the amplifiers 84 is converted from an analog voltage to discrete digital data via corresponding analog to digital converters (ADCs) 86A-86D, respectively. The digital data from each ADC 86 is then sent to a digital memory apparatus 88 for storing the digital data. Optionally, the digital data may be converted from parallel format (coming from each of a plurality of ADC's) to a serial format using a parallel to serial converter 90 prior to the digital data reaching the digital memory apparatus 88. The digital memory apparatus 88 may include, for example, a volatile memory storage device, a non-volatile memory storage device, a removable memory storage device, or a combination thereof.

The digital memory apparatus 88 is connected to a processor 92 which is used to analyze, categorize, and further distribute the digital data. The processor 92 may include or otherwise take the form of a central processing unit including, for example, one or more microprocessors; an application-specific instruction-set processor; a network processor; a vector processor, a scalar processor, or any combination thereof; or any other control logic apparatus now known or later developed that is capable of performing the tasks described herein; or any combination thereof.

The two or more directional RF antennas 82A-82D are positioned such that the RF detectors 82A-82D intercept RF signals over a desired field of view. Each of the antennas 82A-82D intercepts RF signals within a particular area of the desired field of view based at least in part on the orientation of each particular RF antenna. The digital data from each ADC 86 corresponds to radio wave frequencies intercepted by a specific antenna. For example, digital data from a first ADC 86A corresponds to the RF signal intercepted by a first antenna 82A. The antennas 82 are preferably configured in a specific detector array 94 of n×m antennas 82, wherein "n" corresponds to the number of antennas employed in a first orientation and "m" corresponds to the number of antennas employed in a second orientation that is orthogonal to the first orientation. The digital data stored in the digital memory apparatus 88 is configured into a numeric array corresponding to the detector array 94.

Each section of the detector array 94 represents a portion of the field of view of the RF imaging apparatus 80. The number of portions of the field of view depends on the number of directional antennas focused on the field of view of the RF imaging apparatus 80. For example, the detector array 94 shown in FIG. 25 is a 3×3 array with nine portions of the RF detector array 94 corresponding to nine directional antennas focused on the field of view of the RF imaging apparatus 80.

The number of portions into which the field of view is divided ultimately defines a resolution of the RF imaging apparatus 80. The exemplary RF imaging apparatus 80 shown in FIG. 25 has a resolution of 3×3 portions. The resolution of the RF imaging apparatus may vary depending on a number, configuration, and/or specific nature of the antennas of the RF imaging apparatus. For example, the imaging apparatus may have a resolution of approximately 2×2 portions, 4×4 portions, 6×1 portions, 1×6 portions and various other configurations.

Referring again to FIG. 25, the processor 92 is connected to a communication interface 96. The processor 90 sends digital data received from the ADCs to the communication interface and causes the digital data to be categorized and/or distributed at the communications interface 96 based on the numeric array of data which corresponds to the detector array 94. The communication interface 96 transmits or otherwise displays numeric array of data to a user in various potential formats.

Figure 26:
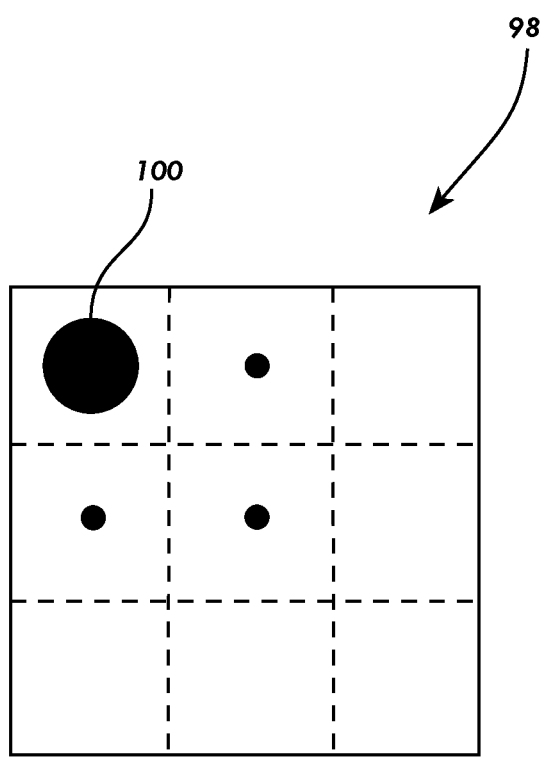
FIG. 26 shows a somewhat schematic view of a display of a radio frequency imaging apparatus according to one embodiment of the disclosure.

FIG. 26 is an illustration of a visual representation of an RF signal detected by the RF imaging apparatus 80. In one embodiment, the visual representation includes a display 98 that visually represents the RF detector array 94. For example, FIG. 26 shows a situation wherein a RF signal is detected most strongly in an upper left portion of the field of view of the RF imaging apparatus 80, indicating to the user with one or more visual indicators 100 that the RF signal is strongest in the upper left portion of the field of view of the RF imaging apparatus 80 and somewhat weaker in surrounding portions of the field of view of the RF imaging apparatus 80.

In the exemplary illustration of FIG. 26, the one or more visual indicators 100 vary based on, for example, the intensity of a RF signal detected by the RF imaging apparatus within each portion of the field of view of the RF imaging apparatus. It is also understood that various other visual indicators 100 may be used, such as various shapes, lines, indicators, graphs, color variation and other sufficient visual indicators to alert a user of the detection and strength of an RF signal within the field of view of the RF imaging apparatus 80 based on the available resolution of the particular imaging apparatus. Additionally, information such as a number or other data representing the strength of detected RF signals may be presented on the display 98 to a user.

The RF imaging apparatus 80 of the present disclosure advantageously enables a user to visualize the presence and location of one or more radio frequency signals intercepted over a desired field of view. In operation, the RF imaging apparatus 80 may be operated by a user to detect and locate one or more radio frequency signals from one or more radio frequency sources that would otherwise be invisible to the user. By using multiple radio frequency antennas oriented such that each radio frequency antenna covers a portion of the field of view of the RF imaging apparatus and assigning each radio frequency antenna to a portion of the RF detector array 94, the location of a radio frequency signal within the field of view of the RF imaging apparatus is determined and displayed on the display.

In one embodiment, the RF imaging apparatus includes a threshold RF signal strength for detected RF signals before displaying a detected RF signal on the display 98 of the RF imaging apparatus 80 to reduce the presence of any unwanted background RF interference. In another embodiment, the two or more antennas of the RF imaging apparatus are adjustably configured to detect various specified ranges of radiofrequency signals such as various high and low frequency bandwidths. Preferably, the display 98 includes touchpad functionality so that a user may input information for programming, calibration, radio frequency range specification and any other items that are desirable to be input to the apparatus 80 by a user. Alternatively, the apparatus 80 may include an input device 102 such as, for example, a key pad, for inputting information to the apparatus 80. Additionally or alternatively, the RF imaging apparatus 80 may be placed in communication with a separate input device such as, for example, a laptop computer, a cell phone, a tablet, or other separate input device. Such communication may be accomplished wirelessly and/or via one or more communication ports built in to the apparatus 80 (e.g., USB ports, 1394 ports, HDMI ports and the like).

Radio Frequency (RF) Focal Plane Array Diplexer System with Structured Light Rendering In one embodiment, a system and method of visualizing one or more frequencies includes combining an optical and RF field that can be viewed by visible wavelength detection imagers (e.g., video camera) necessitates converting the lower energy RF signals into high energy optical photons. These "RF photons" are then combined within the optical field using a diplexer arrangement.

Radio frequency (RF) signals may be converted into visible optical signals through the use of a focal plane array of RF detectors which are interfaced to a microprocessor. Each element of the RF focal plane array subtends an angle that is slight different from its array "neighbors" due to the physical offset of the array elements (RF detectors) from one another. The microprocessor sequences through the focal plane array taking readings from each array RF detector element and recording them into a numeric matrix that is stored within the microprocessor. The signal level of each matrix element is read which allows the microprocessor to intensity modulate a light source (e.g., laser diode, light emitting diode) so that it outputs a brighter signal when the corresponding RF focal plane array RF detector had a higher reading.

The light source is then angularly directed using a simple two-dimensional scanner thereby "painting" the RF scene into a corresponding intensity modulated optical scene. The intensity modulated optical scene is combined with a traditional optical image using an optical diplexer arrangement. The net result is a combined optical+RF image that shows the optical and RF signal levels.

1. Focal Plane Array-Based RF Signal Detection

Figure 27:
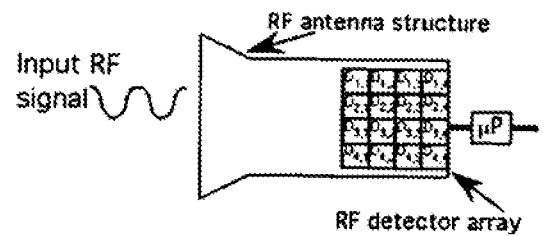
FIG. 27 shows a phased array of RF signal detectors according to one embodiment of the disclosure.

One embodiment incorporates a method of detecting an RF signal wavefront as shown in FIG. 27. Using a focal plane array technique, each RF detector subtends a specific angular field-of-view thereby allowing the spatial extent of the RF wavefront's intensity to be measured. In FIG. 27, a microprocessor is connected to the output of the detector array allowing a numeric value for each detector measured intensity to be obtained. The detection frequency range is dependent on the materials of each element of the detector array.

It is therefore possible to mix the detection frequency bands of the detector elements to provide slightly angularly offset sampling of the RF signal wavefront.

Figure 28:
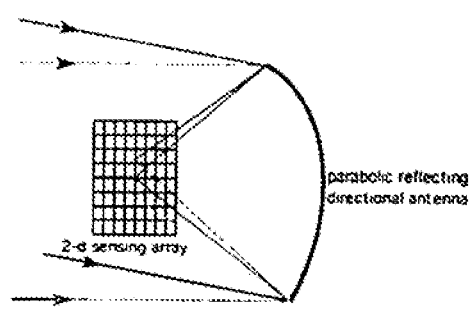
FIG. 28 shows a parabolic antenna used with the RF detector array position in the focal plane according to one embodiment of the disclosure.

The RF detector arrangement may also be as shown in FIG. 28. In this focal plane configuration, the detector array (not drawn to scale in FIG. 28) sits in the focal plane of the parabolic antenna. RF signals coming in from slightly different angles are reflected off the antenna and are focused onto different array elements. Different elements on the detector array thereby correspond to different subangles of the RF signal (phase) front.

Figure 29:
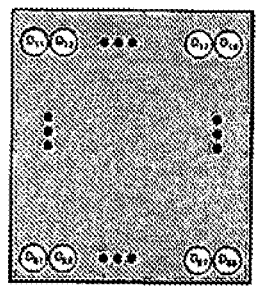
FIG. 29 shows an array of RF detectors which could be parabolic antennas according to one embodiment of the disclosure.

A variation on the focal plane detector array is to use a two-dimensional array of specific RF detectors, such as an 8×8 array of small parabolic antennas, shown in FIG. 29. This arrangement may also be directly connected to a microprocessor with it sequencing through the detector array.

2. Intensity-Modulated Light Source

Figure 30:
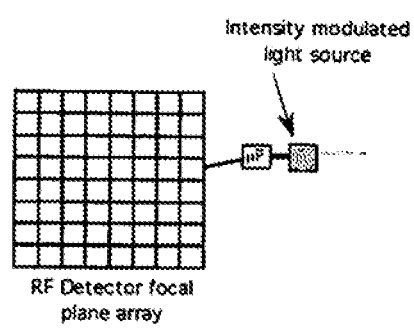
FIG. 30 illustrates a light source intensity modulated in accordance with the focal plane array RF signal levels according to one embodiment of the disclosure.

As shown in FIG. 27, the output from the RF detector array is ready by with the signal levels stored within a microprocessor. The microprocessor then sequentially steps through the RF signal array mapping the detector signal level to the intensity of the light source, FIG. 30. The resultant optical field represents the signal strength of the RF signal which is an augmented reality representation of the invisible RF field.

3. Structured Light Rending of Detected RF Fields

Figure 31:
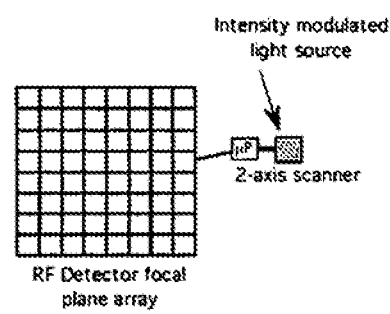
FIG. 31 shows a light source intensity modulated in accordance with phased array RF signal levels according to one embodiment of the disclosure.

Mapping an optical signal to the detected RF matrix is achieved by scanning, intensity modulated light source, FIG. 31. Using a conventional two-dimensional scanner (two-axis motor controlled mirror), the light source "paints" the image of the RF signal strength with the intensity changing according to the detected RF signal.

4. Varying Light Source Wavelengths

Figure 32:
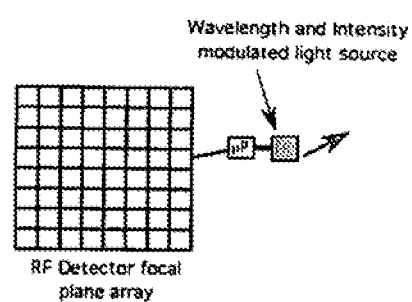
FIG. 32 shows wavelength modulation—or using multiple sources—to identify RF signals of different frequencies.

In the case where the matrix of RF detectors are detecting different frequencies, then the color of the light source may also be varied yielding a two-dimensional structured light pattern that changes color (wavelength) and intensity according to the detected RF signal strength. The light source may be a multicolor (multi-wavelength LED or laser diode) single source or multiple light sources with each source with a unique wavelength output, FIG. 32.

5. Optical Diplexer Combining of Multiple Light Fields

Figure 33:
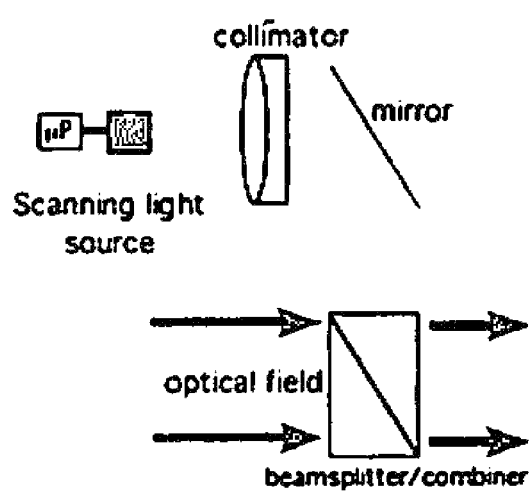
FIG. 33 illustrates a lens-light source arrangement according to one embodiment of the disclosure.

The scanning light source signal(s) are collimated using a lens-light source arrangement as shown in FIG. 33. The (then) collimated light field, or scene, is reflected off a mirror and aligned with an optical beamsplitter/combiner. The optical field enters into the beamsplitter from one direction while the RF-optical "scene" enters into the beamsplitter from an orthogonal direction, see FIG. 33. The two optical "scenes" are combined with the resultant combined scene output to the right of the beamsplitter.

6. Polarization Sensitive Optical Diplexer Combining of Multiple Light Fields

The diplexer arrangement of FIG. 33 may also rely on polarization of the light fields—specifically when using a polarized intensity-modulated, wavelength-modulated light source—to allow for scene isolation/identification of the combined field.

Head Mounted Display for Frequency Visualization

In one embodiment, the portable visualizer system and method are configured to be user-wearable. The system comprises a user-wearable apparatus that: (1) facilitates user selection of K frequency bands (K≥1), which may be but need not be contiguous or overlapping; (2) facilitates user selection and display and user-initiated change of a geographic region R to be interrogated for presence of signals with one or more components in any of the K frequency bands; (3) facilitates user selection of a threshold signal intensity for one or more or all of the signal frequency bands; (4) analyzes a received signal associated with the region R to determine if a signal frequency component in at least one of the frequency bands is detected, with a frequency intensity at least equal to the selected frequency intensity threshold (a "qualifying frequency component") for that frequency band; (5) visually displays, on a head mounted visual display that is worn by the user, the selected geographic region R and each qualifying frequency component, optionally with an indication of the magnitude of the corresponding frequency intensity as "characteristics," including (i) the intensity of the presently detected qualifying frequency component, (ii) the corresponding frequency intensity detected (whether qualifying or not) for a preceding cycle of such detection, (iii) a time integral of the corresponding qualifying frequency intensity, extending backward in time over M preceding cycles (M≥1) and including the present cycle, (iv) a time integral of intensity of the corresponding qualifying frequency component, extending backward in time over M−1 preceding cycles, not including the present cycle; (6) displays one or more of the qualifying frequency components set forth in (5); (7) provides a record and/or display of present user location UL and present angular orientation UAO of the user system; (8) allows the user to change the definition or prescription of the selected geographic region R and corresponding user angular orientation UAO by turning the user's head and subsequently holding the user's head relatively motionless for a prescribed time interval (e.g., of selected length Δt=2–5 seconds); and (9) allows the user to narrow or broaden the size (dimensions) of the selected geographic region R by adjusting a control on the apparatus.

Figure 34:
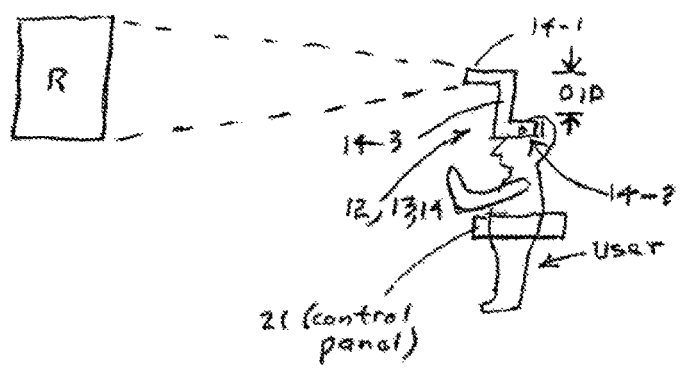
FIGS. 34-39 illustrate embodiments of a head mounted frequency visualization system according to one embodiment of the disclosure.

FIG. 34 schematically illustrates operation and control of the system 104 by a user U to select or prescribe the geographic region R to be interrogated and to determine or estimate user location UL and/or user angular orientation UAO. The user U wears a head mounted display apparatus 12, including a display module 13 that, in one mode of operation, displays, and thereby limits or defines, the region R. Visual information for the region R is received by an optical viewer 14 that superficially resembles a submarine periscope, with the visual display appearing at a first end 14-1 of the optical viewer and the user's eye or other visual image perception mechanism being located at a second end 14-2 of the optical viewer 14. The optical imaging distance OID between the first end 14-1 and the second end 14-2 of the optical viewer 14 is chosen to be at least as large as, and preferably larger than, the user's near-distance of focus, which is typically 10-20 cm. Optionally, a length L(14-3) of an intermediate component 14-3 of the optical viewer 14 is adjustable by the user (increasing or decreasing OID) to suit the optical image viewing by the user.

A planar surface or other surface S associated with the optical viewer 14 has N spaced apart, location determination signal (LDS) sensors 15-$n$ ($n$=1, 2, 3, . . . , N; N≥3) that each receive LDSs from a plurality of LDS sources, such as a plurality of Global Positioning Satellites (GPS) or GLO-NASS satellites, and that provide reasonably accurate position information for each of the sensors 15-$n$. A linear combination or convex combination of the location coordinates ($x_n$, $y_m$, $z_n$) of the LDS sensor 15-$n$ is formed to estimate user location coordinates:

$$(x_{UL}, y_{UL}, z_{UL}) = \sum_{n=1}^{N} w_n (x_n, y_n, z_n), \quad (1)$$

$$\sum_{n=1}^{N} w_n = 1, \quad (2)$$

Location coordinates of three non-collinear locations of the LDS sensors on the surface S are combined as vectors to determine an angular orientation SAO of a vector NS that is normal to the surface S and to determine a user angular orientation UAO relative to the geographic region R. User location coordinates and/or user angular orientation coordinates (e.g., direction cosines of the vector NS) are optionally displayed and/or recorded for present or future use.

Figure 35:
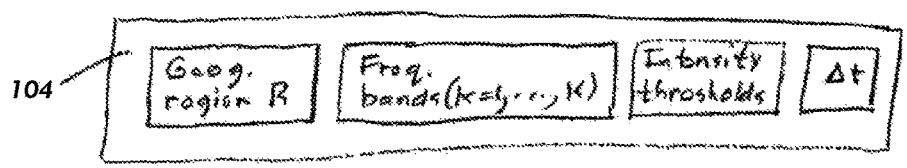

FIG. 35 is an illustration of a suitable control panel 104 that can be used by the user or another person or entity to prescribe: (i) the geographic region R to be interrogated; (ii) each of the K frequency bands (K≥1) for which a signal associated with the region R is to be interrogated; and (iii) a threshold intensity value I(thr;k), which may vary with frequency index k), against which a signal frequency component in the frequency band k=1, . . . , K is to be compared to determine whether the detected frequency component is a qualifying frequency component (i.e., has an associated frequency intensity at least equal to I(thr;k)). The user may initially enter appropriate values into the system, using the control panel 21 and/or may enter changes in one or more of these values during operation of the system.

FIG. 34 schematically displays an embodiment of a head mounted display (HMD), including receipt and display of (i) information or characteristics of a qualifying frequency component and (ii) receipt and estimation of location determination signals ("LDSs") concerning user location UL and/or use angular orientation UAO. Visual information on frequency(ies) associated with the region R is received by an optical viewer 14 that superficially resembles a submarine periscope, with the visual display appearing at a first end 14-1 of the optical viewer and the user's eye or other visual image perception mechanism being located at a second end 14-2 of the optical viewer. The optical imaging distance OID between the first end 14-1 and the second end 14-2 of the optical viewer 14 is chosen to be at least as large as, and preferably larger than, the user's near distance of focus, which is typically 10-20 cm. Optionally, a length L(14-3) of an intermediate component 14-3 of the optical viewer 14 is adjustable by the user (increasing or decreasing OID) to suit the optical image viewing by the user.

Figure 37:
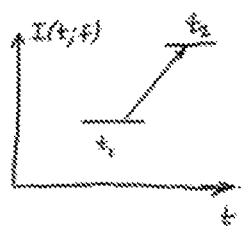
Figure 38:
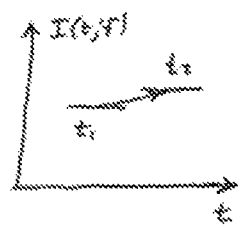
Figure 39:
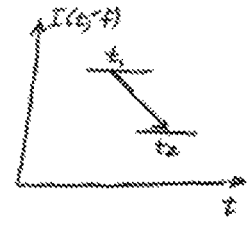

FIGS. 37-39 illustrate a graphical display, as horizontal bars, representing a signal intensity I(t;f) versus time t for a qualifying frequency component (where the received intensity I for a given FDI, indexed ask, is at least equal to a selected intensity threshold value I(thr;k), for the following situations in a first detection cycle (t=t1) and for an immediately following detection cycle (t=t2>t1): I(t2;k)>I(t1;k) (FIG. P2-1); I(t2;k)≈I(t1;k) (FIG. P2-2); and I(t2;k)<I(t1;k) (FIG. P2-3). The graph preferably indicates whether I(t2;k) increases, remains about the same, or decreases relative to I(t1;k). Optionally, where the difference between I(t1;k) and I(t2;k) is more than an order of magnitude, the quantities $\text{Log}_a \{I(t1;k)\}$ and $\text{Log}_a \{I(t2;k)\}$ are displayed on the ordinate, where "a" is a suitable real number greater than 1 (e.g., a=2, 2.718282, 3.16 or 10). The graph also indicates the value or range of the frequency index k and optionally indicates the selected geographical region R that is interrogated.

FIGS. 37-39 are analogous graphical displays of the time integrated quantities.

$$\text{Int1} = \int_{t1}^{t1+\Delta t} I(t';k)dt' \text{ and} \quad (3)$$

$$\text{Int1} = \int_{t1}^{t1+\Delta t} I(t';k)dt' \text{ and} \quad (3)$$

$$\text{Int1} = \int_{t2}^{t2+\Delta t} I(t';k)dt' \quad (4)$$

where Δt is a temporal length of an FDI cycle, or an integer multiple of consecutive FDI cycles, and t1 and t2 differ by the length of one or an integer multiple of cycles. Again arrows indicate whether the second integrated quantity Int2 is greater than, about the same as, or less than the first integrated quantity Int1.

The graphs in FIGS. 37-39 may represent any frequency detection interval FDI, whether the frequencies are in the ultraviolet, visible, near infrared, mid-infrared or far-infrared wavelength regions. These graphs represent frequency translations and corresponding representations of FDIs and are perceptible by any user who can view and understand the nature of the graphs. In this sense, the graphs represent an application of augmented reality to a sensory range (visual) that expands the scope of the user's perception or sensing of frequencies or wavelengths.

Where the quantity I(t2;k) is strongly increasing or strongly decreasing in FIGS. 37-39, this indicates that an intensity of the corresponding signal interrogated in the indicated FDI for the region R is strongly changing, perhaps because this signal has been recently "turned on" or recently "turned off" relative to a reference mode. This signal S(t;k; R) resulting from the region R should be examined more closely to evaluate the consequences of the signal turn-on or the signal turn-off that is presently occurring, which may indicate activation of a corresponding electronic or electromagnetic signal.

Figure 36:
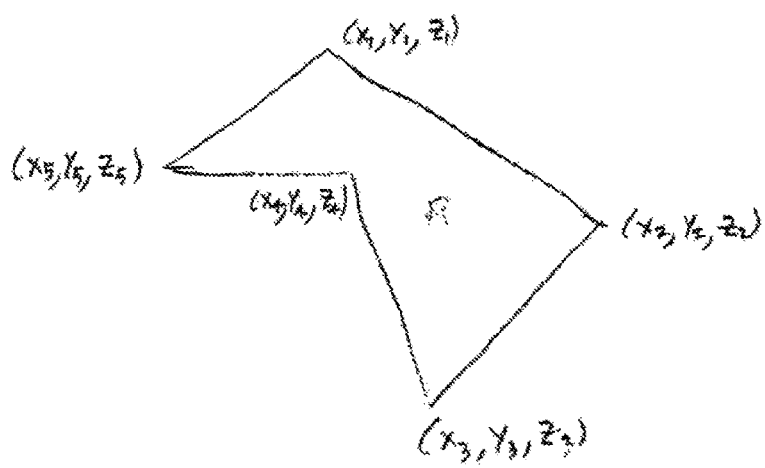

FIG. 36 illustrates a polygon, specified by M sets of coordinates $(x_m,y_m,z_m)$ (m=1, . . . , M; M≥3), where the polygon interior serves as the geographic region R and no three consecutive sets of coordinates are collinear. The user control panel, illustrated in FIG. 35, can be used to enter or change the coordinate sets $(x_m,y_m,z_m)$ that define the region R, either alphanumerically or using a touch screen.

Hemispheric Sensing Via Sensor Arrays

In one embodiment, the system for recognizing the presence of frequencies in a selected portion of the electromagnetic spectrum is configured into an array of sensor, each with a limited field of view as described below. While each sensing element in the sensor array may only observe/measure within a certain angle, output signals of the sensing elements of the array are correlated by a microprocessor in a manner that synthesizes hemispheric sensing. The sensor array provides a system for the detection of multiple parameters using synthesized high-gain omnidirectional sensors/antennas. Simultaneous detection of parameters such as RF signals, acoustic signals, and chemicals are possible with correlation techniques used to reveal a location of a signal source as well as a strength of the measured signals.

In a traditional system for taking hemispheric measurements, a single detector element is mechanically, electrically or optically swept through 360° (e.g., radar systems). At any moment the sensing is only occurring within the field of view of the single detector element. Combining multiple limited field of view detectors in a signal correlation manner allows for a hemispheric coverage of the sensed parameter to be fabricated.

Parameters of interest, such as radio frequency (RF) signals, chemical emissions, and acoustic signals may be detected using an omnidirectional sensor/antenna. In such situations, typically the gain of the omnidirectional sensor/antenna is significantly less than the gain of a highly directional sensor/antenna. The performance tradeoff becomes one of 360° coverage with modest signal detection range (standoff distance) or less than hemispheric coverage but with increased detection range using a directional sensor/antenna.

Figure 40A:
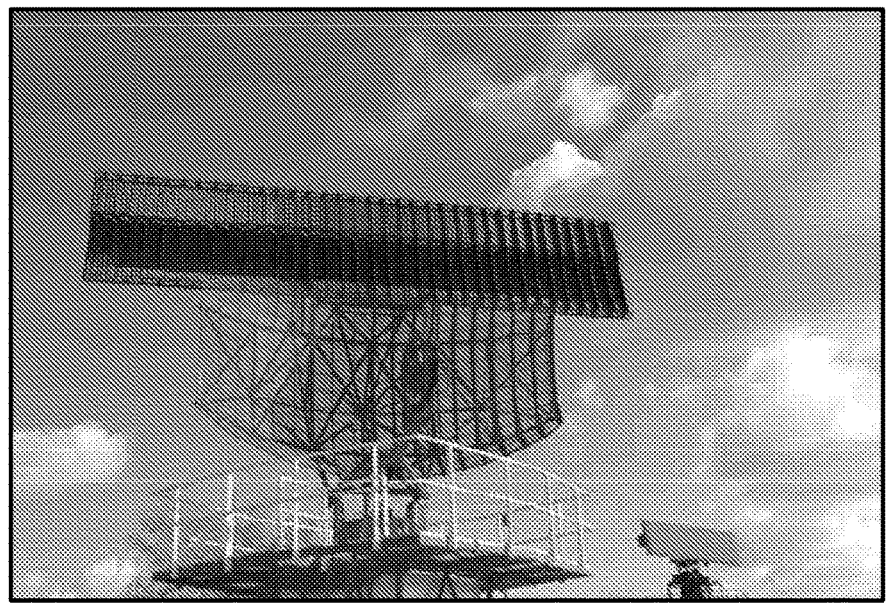
FIGS. 40A and 40B illustrate a radar system according to one embodiment of the disclosure.
Figure 40B:
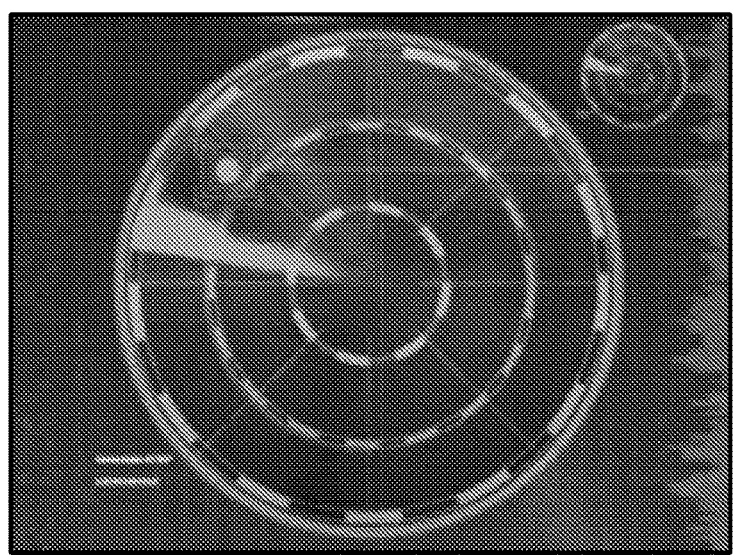

The situation is seemingly resolved in the class radar tracking case where a directional sensor/antenna is swept through a 360° circle by a mechanical system, such as the system illustrated in FIG. 40A. Resulting signals are displayed on a screen that exhibits some form of image latency be it through traditional phosphor persistence or by a computer that stores the 2-dimensional 360° interpreted image and then displayed that image for a certain duration, as illustrated in FIG. 40B. In this way the tradeoff between range and directionality (hemispheric coverage) is seemingly minimized.

One limitation of this rotating high gain/directional sensor/antenna is that a short duration signal may not be detected if it is present during the time interval when the directional sensor/antenna is pointed in another direction.

The array of sensing elements of the present disclosure eliminates this effect by having multiple directional sensor/antennas arrange, mechanically, electrically, optically and mathematically to provide continuous omnidirectional sensing of multiple parameters. The net result is a platform that provides high gain, synthesized omnidirectional multiple parameter sensing.

Figure 41A:
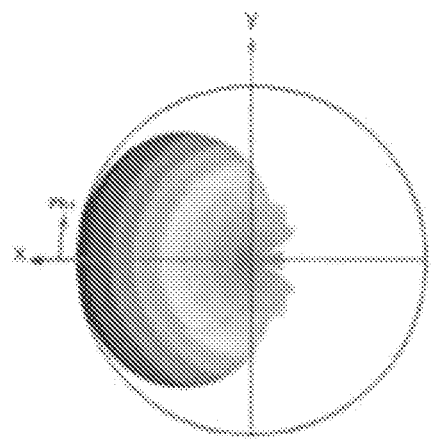
FIGS. 41A and 41B illustrate a radiation pattern of an antenna according to one embodiment of the disclosure.
Figure 41B:
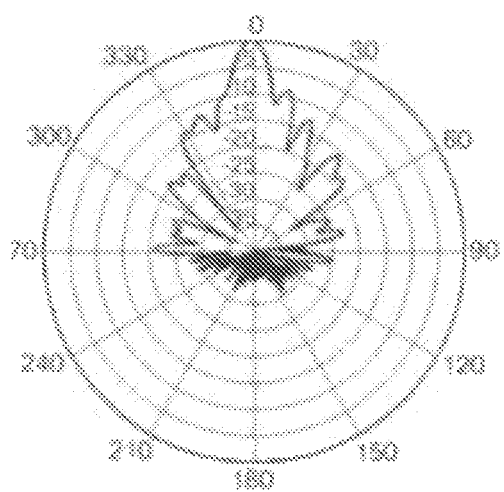

Consider the situation where a 90° sectored antenna, with a radiation pattern similar to that shown in FIG. 41B, is used for RF signal detection. FIG. 41A displays the directionality of the antenna and indicates minimal detection sensitivity in any direction other than to the left (red indicates maximum sensitivity, green minimum).

A high gain omnidirectional antenna is synthesized by mechanical placement of four such 90° sector antennas. Each pattern slightly overlaps, but with sensitivities (3 dB rolloff points in the +/−30° range) decreasing there is minimal pickup of adjacent directivity signals from the four sensors/antennas. An arrangement may result in the situation shown in FIG. 42.

Processing of the directional sensors readings may take multiple forms, but essentially relies on temporal and spatial/angular alignment readings. Data frames are time stamped allowing for correlation analysis of the signals thereby providing a synthesized omnidirectional, high gain, sensing of RF signals. Display of the resultant signals may be in one of many manners including that shown in FIG. 40B.

Figures 42, 43:
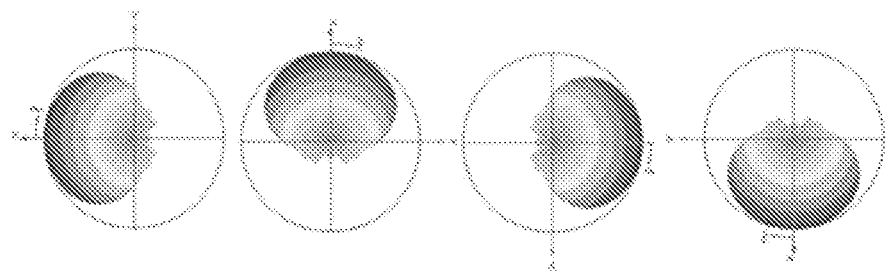
FIG. 42 illustrates synthesized omnidirectional sensor/antenna coverage obtained through the placement and orientation of four discrete 90 degree sectored antennas according to one embodiment of the disclosure.
FIG. 43 illustrates patterns of microphones according to one embodiment of the disclosure.

The array of sensor may also be used to synthesize high gain omnidirectional acoustic/audio signal detection. Measurement of acoustic/audio signals are long range is typically achieved using a high gain directional microphone (sensor+antenna). While there are a wide variety of such microphones, the antenna reception patterns of a suit of common used microphones is shown in FIG. 43.

Detection of a burst of acoustic energy emanating from a specific location using a directional microphone is subject to the same issues discussed above with respect to RF signal detection. Similar to the situation depicted in FIG. 42, a synthesized omnidirectional acoustic detection system is based on placement and orientation of directional microphones each with their own "acoustic field of view". Processing of audio signals received from the synthesized high gain omnidirectional microphone is performed in a correlation manner similar to that described above with respect to RF detection.

The above embodiment may also include synthesized high gain omnidirectional chemical signal detection. Remote sensing of chemicals is frequently performed in the optical realm using emission spectroscopy. Typically an optical detection system—such as a telescope—with a relatively narrow field of view is used to capture the light from a region of interest. The high gain of the optical detection system (telescope) allows for measurements to be taken from considerable distances from the emitting chemical source. Standard information deciphering techniques are used to determine the presence of a chemical of interest (classic spectroscopy). The "looking in the wrong direction at the wrong time" scenario described above for RF signal detection is immediately present in this chemical signal detection due to the directionality of the chemical sensor (optical system).

Placement and orientation of multiple high gain chemical signal detection systems allows for synthesis of an omnidirectional detection system. Similar to the RF and acoustic signal cases, signal processing is based on a correlation of the measured parameters.

Further, it is possible to synthesize omnidirectional high gain detection systems capable of measuring a variety of parameters of interest in accordance with the embodiment above. Essentially, any parameter of interest may be measured using these techniques of placement, orientation, and correlation mathematics to allow for 360° hemispheric "always on" signal detection.

Acoustic Imaging

In one embodiment, an acoustic frequency detector is provided for imaging detected acoustic frequency signals. An apparatus and method for providing an image showing one or more acoustic signals over a desired field of view is disclosed. As referred to herein, acoustic signals generally comprise signals including vibration, sound, ultrasound and infrasound.

Figure 44:
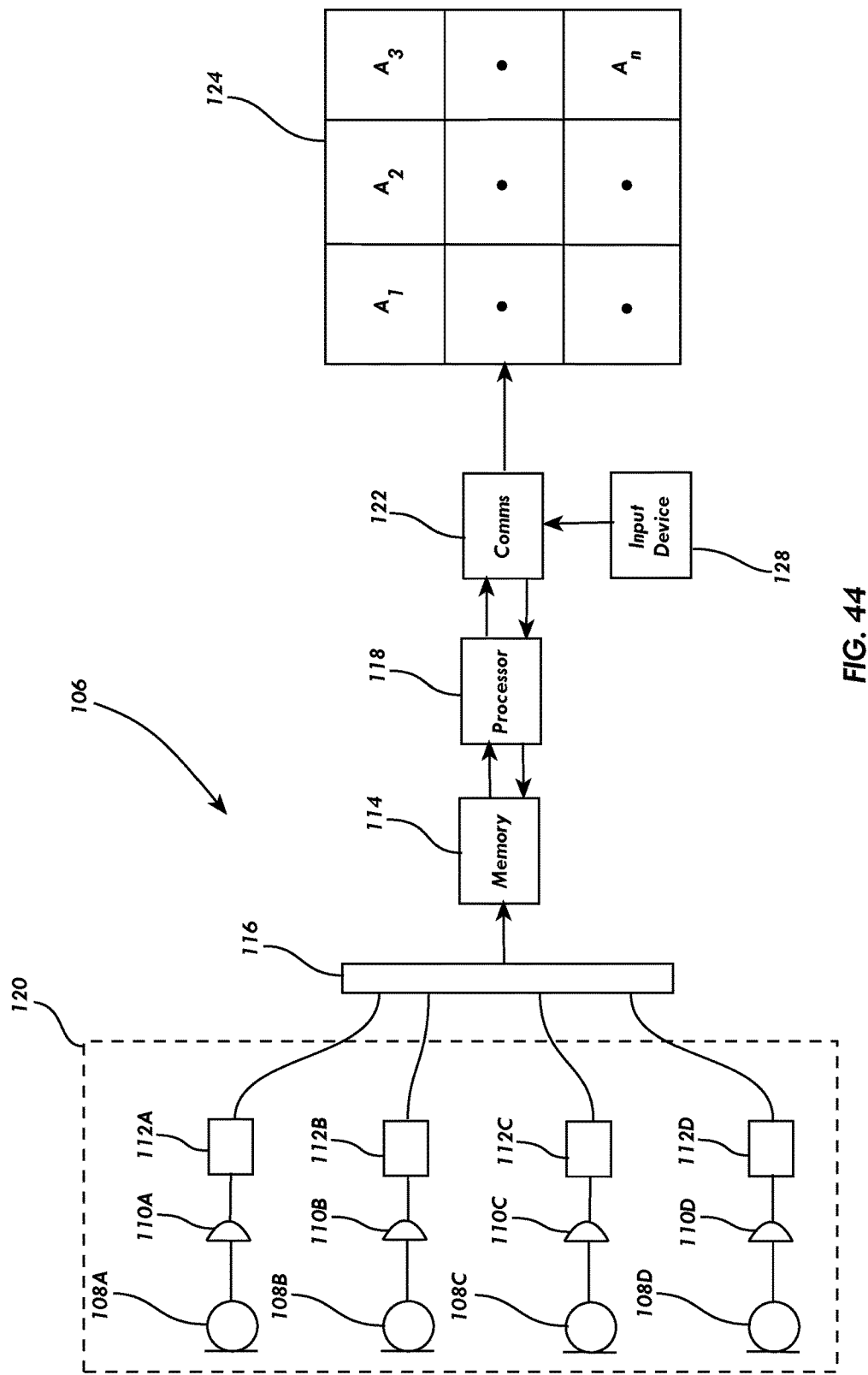
FIG. 44 illustrates an acoustic frequency imaging apparatus according to one embodiment of the disclosure.

FIG. 44 shows a basic embodiment of an acoustic imaging apparatus 106 according to the disclosure. The acoustic imaging apparatus 10 includes two or more directional microphones 108A-108D configured to detect one or more acoustic signals over a desired wavelength. For example, the two or more (and more preferably, at least four or more) directional microphones 108A-108D may be formed of shotgun type directional microphones or other like directional acoustic detectors. The two or more directional microphones 108A-108D are configured to detect acoustic signals in a substantially distinct area of a field of view of the acoustic imaging apparatus 106. When one of the directional microphones detects an acoustic signal, a small voltage is produced across an output of the directional microphone, the voltage corresponding to the strength of the detected acoustic signal. Two or more amplifiers 110A-110D are in communication with each corresponding two or more directional microphones 108A-108D. Each respective voltage from the amplifiers 110 is converted from an analog voltage to discrete digital data via corresponding analog to digital converters (ADCs) 112A-112D, respectively. The digital data from each ADC 112 is then sent to a digital memory apparatus 114 for storing the digital data. Optionally, the digital data may be converted from parallel format (coming from each of a plurality of ADC's) to a serial format using a parallel to serial converter 116 prior to the digital data reaching the digital memory apparatus 114. The digital memory apparatus 114 may include, for example, a volatile memory storage device, a non-volatile memory storage device, a removable memory storage device, or a combination thereof.

The digital memory apparatus 114 is connected to a processor 118 which is used to analyze, categorize, and further distribute the digital data. The processor 118 may include or otherwise take the form of a central processing unit including, for example, one or more microprocessors; an application-specific instruction-set processor; a network processor; a vector processor, a scalar processor, or any combination thereof; or any other control logic apparatus now known or later developed that is capable of performing the tasks described herein; or any combination thereof.

The two or more directional microphones 108A-108D are positioned such that the microphones 108A-108D detect acoustic signals over a desired field of view. Each of the microphones 108A-108D detects acoustic signals within a particular area of the desired field of view based at least in part on the orientation of each particular microphone. The digital data from each ADC 112 corresponds to acoustic frequencies intercepted by a specific microphone. For example, digital data from a first ADC 112A corresponds to the acoustic signal intercepted by a first microphone 108A. The microphones 108 are preferably configured in a specific detector array 120 of n×m microphones 108, wherein "n" corresponds to the number of microphones employed in a first orientation and "m" corresponds to the number of microphones employed in a second orientation that is orthogonal to the first orientation. The digital data stored in the digital memory apparatus 114 is configured into a numeric array corresponding to the detector array 120.

Each section of the detector array 120 represents a portion of the field of view of the acoustic imaging apparatus 106. The number of portions of the field of view depends on the number of directional microphones focused on the field of view of the acoustic imaging apparatus 106. For example, the detector array 120 shown in FIG. 44 is a 3×3 array with nine portions of the acoustic detector array 120 corresponding to nine directional microphones focused on the field of view of the acoustic imaging apparatus 106.

The number of portions into which the field of view is divided ultimately defines a resolution of the acoustic imaging apparatus 106. The exemplary acoustic imaging apparatus 106 shown in FIG. 44 has a resolution of 3×3 portions. The resolution of the acoustic imaging apparatus may vary depending on a number, configuration, and/or specific nature of the microphones of the acoustic imaging apparatus. For example, the imaging apparatus may have a resolution of approximately 2×2 portions, 4×4 portions, 6×1 portions, 1×6 portions and various other configurations.

Referring again to FIG. 44, the processor 22 is connected to a communication interface 122. The processor 118 sends digital data received from the ADCs to the communication interface and causes the digital data to be categorized and/or distributed at the communications interface 122 based on the numeric array of data which corresponds to the detector array 120. The communication interface 122 transmits or otherwise displays numeric array of data to a user in various potential formats.

Figure 45:
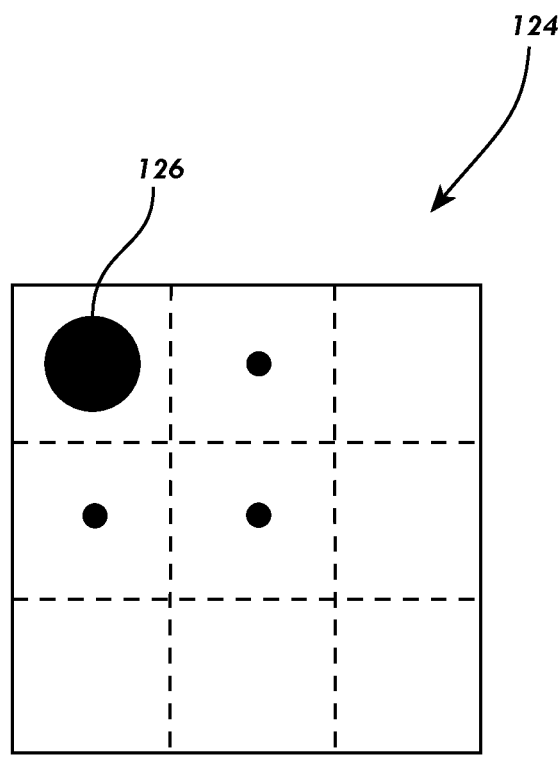
FIG. 45 shows a somewhat schematic view of a display of an acoustic frequency imaging apparatus according to one embodiment of the disclosure.

FIG. 45 is an illustration of a visual representation of an acoustic signal detected by the acoustic imaging apparatus 106. In one embodiment, the visual representation includes a display 124 that visually represents the acoustic detector array 120. For example, FIG. 2 shows a situation wherein an acoustic signal is detected most strongly in an upper left portion of the field of view of the acoustic imaging apparatus 106, indicating to the user with one or more visual indicators 126 that the acoustic signal is strongest in the upper left portion of the field of view of the acoustic imaging apparatus 106 and somewhat weaker in surrounding portions of the field of view of the acoustic imaging apparatus 106.

In the exemplary illustration of FIG. 45, the one or more visual indicators 126 vary based on, for example, the intensity of an acoustic signal detected by the acoustic imaging apparatus within each portion of the field of view of the acoustic imaging apparatus. It is also understood that various other visual indicators 126 may be used, such as various shapes, lines, indicators, graphs, color variation and other sufficient visual indicators to alert a user of the detection and strength of an acoustic signal within the field of view of the acoustic imaging apparatus 106 based on the available resolution of the particular imaging apparatus. Additionally, information such as a number or other data representing the strength of detected acoustic signals may be presented on the display 124 to a user.

The acoustic imaging apparatus 106 of the present disclosure advantageously enables a user to visualize the presence and location of one or more acoustic frequency signals detected over a desired field of view. In operation, the acoustic imaging apparatus 106 may be operated by a user to detect and locate one or more acoustic frequency signals from one or more acoustic frequency sources that would otherwise be invisible to the user. By using multiple directional microphones oriented such that each microphone covers a portion of the field of view of the acoustic imaging apparatus and assigning each microphone to a portion of the acoustic detector array 122, the location of an acoustic frequency signal within the field of view of the acoustic imaging apparatus is determined and displayed on the display.

In one embodiment, the acoustic imaging apparatus includes a threshold acoustic signal strength for detected acoustic signals before displaying a detected acoustic signal on the display 124 of the acoustic imaging apparatus 106 to reduce the presence of any unwanted background acoustic interference. In another embodiment, the two or more microphone of the acoustic imaging apparatus are adjustably configured to detect various specified ranges of acoustic signals such as various high (ultrasound) and low (infrasound) frequency sub-ranges. Preferably, the display 124 includes touchpad functionality so that a user may input information for programming, calibration, acoustic frequency range specification and any other items that are desirable to be input to the apparatus 106 by a user. Alternatively, the apparatus 106 may include an input device 128 such as, for example, a key pad, for inputting information to the apparatus 106. Additionally or alternatively, the acoustic imaging apparatus 106 may be placed in communication with a separate input device such as, for example, a laptop computer, a cell phone, a tablet, or other separate input device. Such communication may be accomplished wirelessly and/or via one or more communication ports built in to the apparatus 106 (e.g., USB ports, 1394 ports, HDMI ports and the like).

Radio Frequency (RF) Electrical Signature Analysis (ESA) of Electrical Distribution Transformers In one embodiment, the system and method of the present disclosure may be used to analyze electromagnetic signals that emanate from electrical distribution transformers. Electrical distribution transformers emit a unique set of radio frequency and thermal IR signals depending on the transformer's operational status. Detection and capture of these transformer emitted signals with subsequent electrical and thermal signature analysis (ETSA) allows a RF ETSA operator to determine the health status of the transformer. Such information may then be used to determine if the transformer is operating in a suboptimal manner and even nearing failure thereby providing an indication as to if the transformer should be service (maintenance). Using directional sensing allows the system to isolate specific transformers being analyzed even in dense deployment situations. By co-aligning a directional antenna with an optical (visible or thermal IR) video system, then overlaying the image scene with the RF spectrum or ETSA identified transformer status, plus providing a recording of the combined image for a user to determine of what the transformer status (visual) (thermal and visible) and RF ETSA) is.

A multi-parameter measurement system is provided whereby electromagnetic signals in a wide range of frequencies/wavelengths emanating from electrical distribution transformers are measured and analyzed then displayed on a video monitor. The suite of measurements are correlated yielding an electromagnetic signature that is unique to the transformer's operational state. The parameters are displayed on a monitor—plus recorded—for operator real time use as well as forensic analysis of the transformer whose performance is being investigated.

Figure 46:
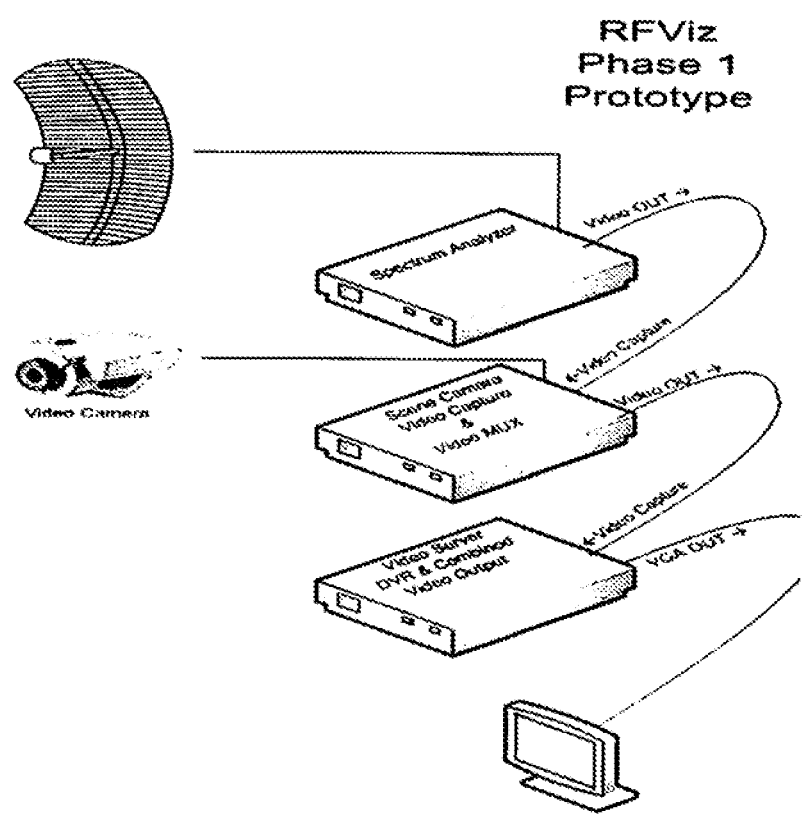
FIG. 46 is a diagram of parallel detection paths, RF and optical, optical mixing and rendering according to one embodiment of the disclosure.

The RF-ESA system is illustrated in FIG. 46 where a directional antenna is co-aligned with a combination thermal IR imaging camera and a visible-wavelength video camera. The system allows the user to select which camera image (thermal or visible) is displayed on the screen with the ESA values visually overlaid creating an augmented reality "scene".

Spectral analysis of the RF signal is performed using dedicated hardware or a software application. The resulting discrete spectrum $F(\omega)$ is stored in local memory. A database system transfer functions, $H(\omega)$, generated from pre-recorded spectra from various electrical distribution transformers is then used for correlation-based comparison to ascertain the operational state of the distribution transformer. The comparison is quantified as a simple number—scalable representing the degree to which the transformer should be serviced (>95, transformer close to imminent failure; <5 transformer is operating fine, no service required).

1. Directional Antenna and Spectral Analysis of Distribution Transformer

Figure 47:
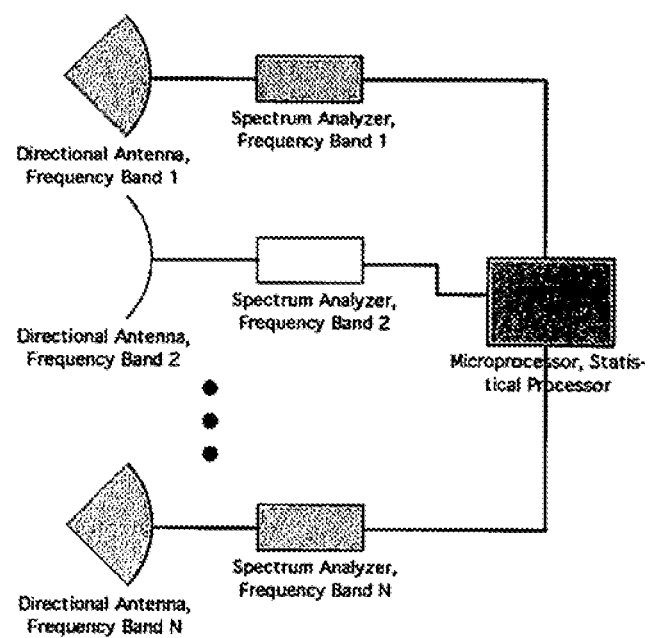
FIG. 47 illustrates three antennas co-aligned with associated spectrum analyzers for ESA of RF signals emanating from transformers according to one embodiment of the disclosure.

A cascading antenna system is used for signal detection in the 800-5800 MHz, 850-950 MHz, 2400-2500 MHz, and 5150-5750 MHz bands with corresponding spectrum analyzers. Mechanical mounting achieves a coalignment of the antennas radiation patterns as shown in FIG. 47.

2. Thermal IR and Visible Signal Detection

Figure 48:
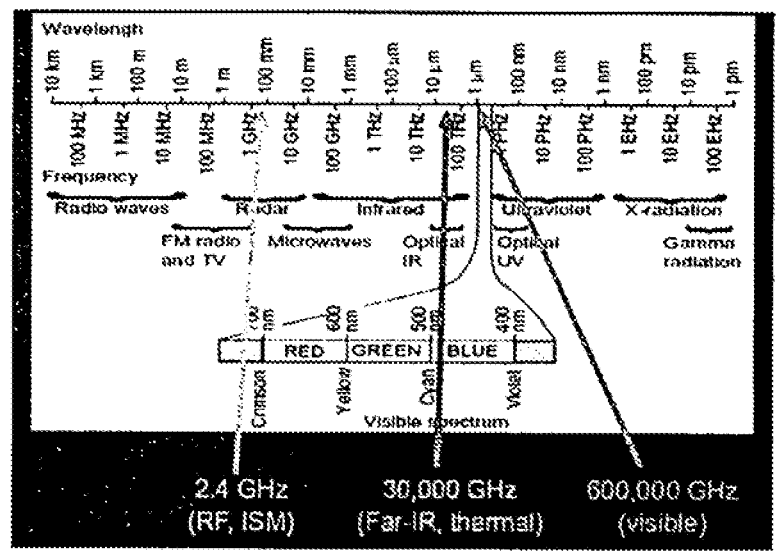
FIG. 48 shows the electromagnetic spectrum showing the RF, thermal IR and visible frequencies/wavelengths signals which are emanating from a transformer being measured according to one embodiment of the disclosure.

Two or more IP-addressable cameras are used for detection of the electromagnetic (EM) signals in the thermal IR and visible wavelengths, as shown in FIG. 48.

The cameras are co-aligned with each other and the RF antenna. Antenna beamwidths and optical fields-of-view for each system are close to possible identical. Therefore the optical imagery are the same as for the antenna providing the user looking at the system screen to know that the display is similar (if not identical) as the beam widths. Images from the IR cameras are stored as motion JPEGs (frame-by-frame) thereby allowing for direct registration (alignment) of the visible and thermal IR images. This verifies that each camera is co-aligned along with the RF spectral measurements. A combined data set of the two images and the RF data form the electrical signature of the device under test (inspection). RF measurements cover the 50 MHz to 6 GHz frequency range. A single power reading is taken over this frequency band thereby providing a total power reading. This reading is combined in the data set along with the thermal IR and visible camera images and the select RF spectral measurements.

Figure 49:
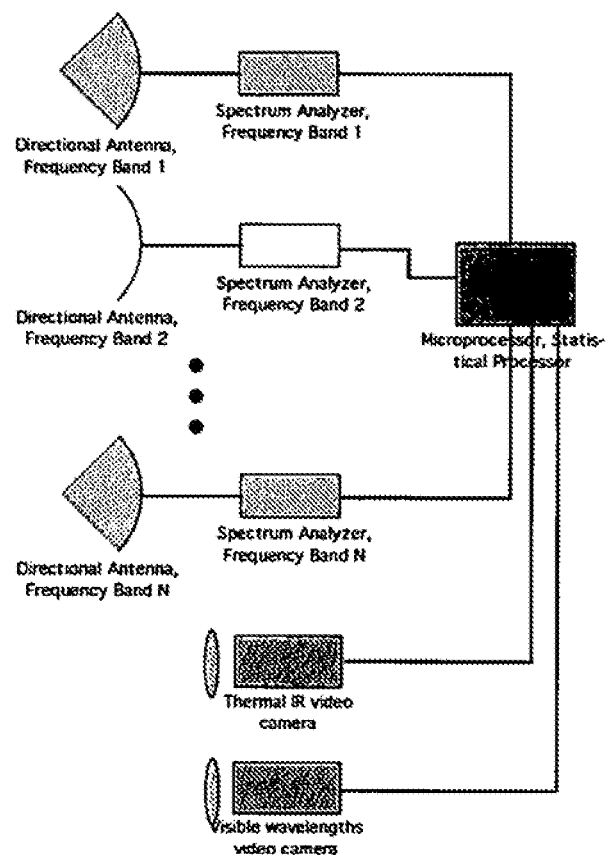
FIG. 49 shows co-aligned RF, thermal IR and visible cameras according to one embodiment of the disclosure.

The IP addressable IR and visible cameras are co-aligned with the RF antennas as shown in FIG. 49.

3. ESA System Architecture

Figure 50:
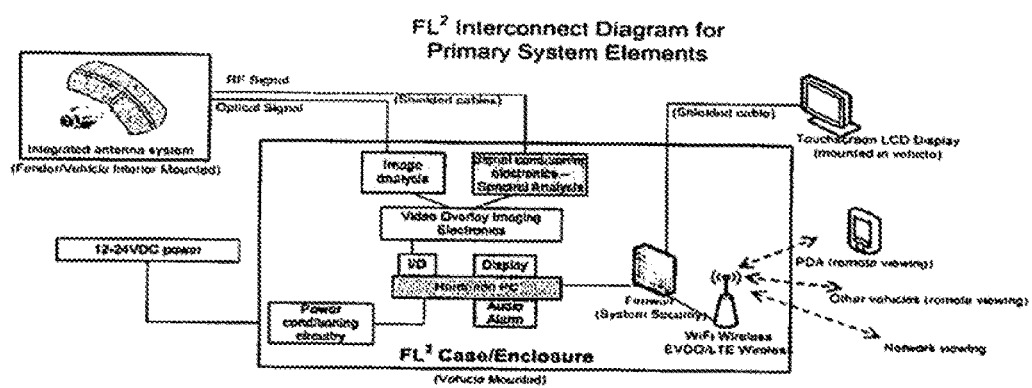
FIG. 50 shows a vehicle mount for a transformer measurement system according to one embodiment of the disclosure.

The mathematical output of the ESA is a simple scalar ranging from 0 to 100. The value varies in accordance with the state of the transformer's operation. The output of each spectrum analyzer goes to a microprocessor where the electrical signal analysis (ESA) functions are performed. FIG. 50 depicts a system architecture for the directed sensing ESA unit.

4. ESA Hardware Design

Figure 51:
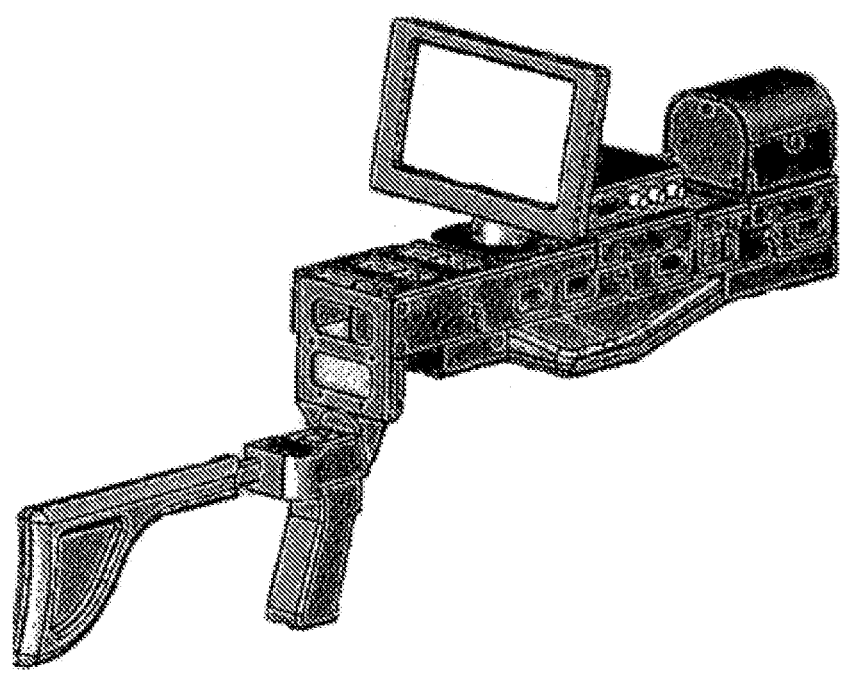
FIG. 51 illustrates a mechanical design for a handheld ESA unit according to one embodiment of the disclosure.

The design for a handheld ESA unit is shown in FIG. 51. The design allows for different cameras and sensors to be interchanged on the unit. The handle is a folding stock design. The lower tray holds the RF antennas. A visible IP video camera is mounted at the top and front of the housing. A Weaver-rail is used under the antenna tray onto which a second video camera, a thermal IR for distribution transformer measurements, is mounted to the rail. The touchscreen LCD display is connected to the CPU and Ethernet switch box that is directly in front of the monitor (between the monitor and the video camera).

5. Correlation Statistical ESA

The mathematical output of the ESA is a simple scalar ranging from 0 to 100. The value varies in accordance with the state of the transformer's operation. Therefore a 100 indicates imminent failure, 0 represents excellent operation. The resolution of the result is also dependent on the system transfer functions that are generated based on ESAs obtained from distribution transformers in various stages of operation/failure. The value is displayed in an overlay fashion on the system's monitor screen.

A table of RF and thermal electric signals that were recording using the system shown in FIG. 4 is stored in the PC. Current readings are taken using the system and then compared via correlation statistics to the stored readings. The correlation coefficient is used to generate the ESA scalar value which is then used for numerical (and iconic) display on the touchscreen LCD screen (shown in FIG. 50).

6. Sensing Volume—Spatial Correlation of Sensed Signals

Figure 52:
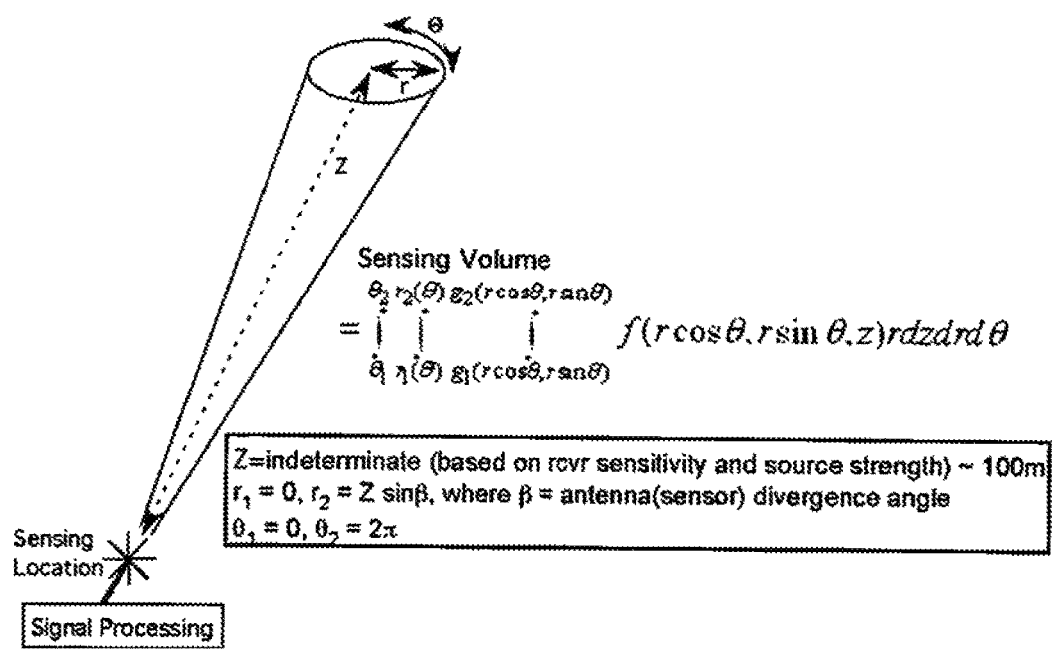
FIG. 52 illustrates volume sensing and overlap of sensing volumes with co-aligned imagers according to one embodiment of the disclosure.

Mapping an optical signal to the detected RF matrix is achieved by a scanning intensity modulated light source, as shown in FIG. 52.

Data is acquired for multiple imaging/sensing systems using co-aligned devices. The field-of-view overlap allows for correlation of disparate sensing parameters that are spatially co-resident.

Figure 53:
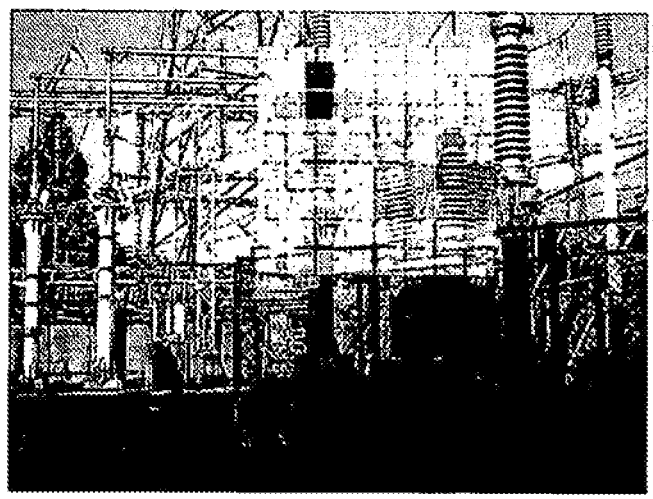
FIG. 53 illustrates a graphical display of multiple sensor readings according to one embodiment of the disclosure.

The net result is a method of depicting sensor readings that are coming from specific locations on transformers. The situation is illustrated in FIG. 53. This is achieved in the ESA for distribution transformers.

Determining Range to an Electromagnetic Wave Source

Figure 54:
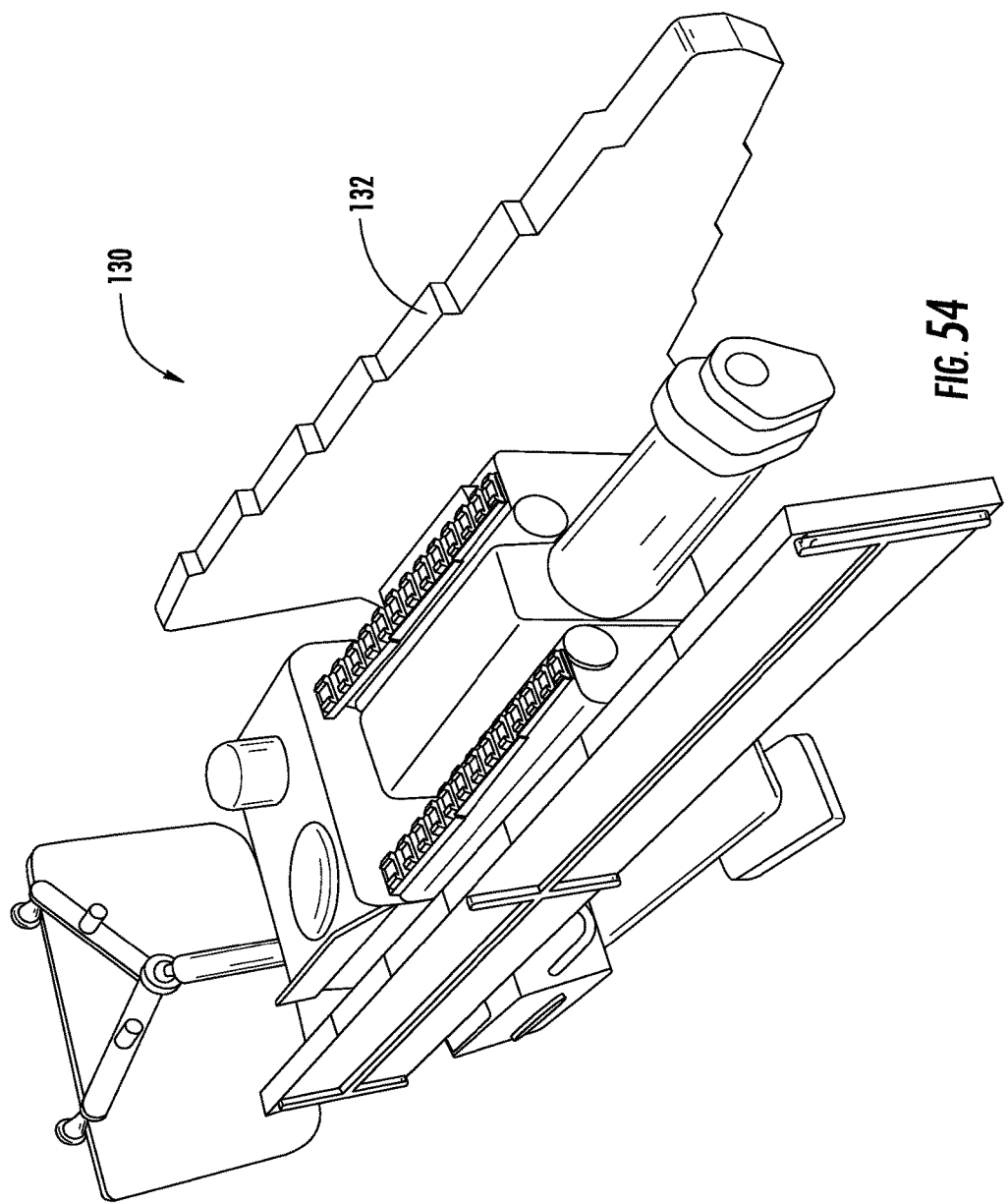
FIG. 54 shows a radio frequency detector according to one embodiment of the disclosure.

In one embodiment, the system and method of the present disclosure is also capable of determining a range to an electromagnetic wave source. FIG. 54 shows an embodiment of a radio frequency detector 130 including one or more antennas 132 and a computer processor 134 including a memory 136 in direct or indirect communication therewith. Embodiments of the device referred to herein as a "radio frequency detector" are more specifically apparatuses for detecting the linear distance from a source of an electromagnetic wave emission. Some of the wave data associated with these detection calculations is typically provided as frequencies or within certain frequency ranges. As such, the term "radio frequency detector" is used herein to reference such apparatuses.

Using the one or more antennas 132, the radiofrequency detector 130 detects one or more radio frequency signals from one or more radio frequency sources and determines a distance to the one or more radio frequency sources based at least in part on a power of the received radio frequency signal. The processor 134 may include one or more of the following: a central processing unit including, for example, one or more microprocessors; an application-specific instruction-set processor; a network processor; a vector processor, a scalar processor, or any combination thereof; or any other control logic apparatus now known or later developed that is capable of performing the method steps described herein. The memory 136 may include one or more non-volatile digital storage devices, one or more volatile digital storage devices, and one or more ports for one or more removable digital storage devices.

A wireless communications connection between a radio frequency source and the radio frequency detector 130 is established after the one or more antennas 132 receive a signal from the radio frequency source. Thereafter, the processor 134 performs a calculation according to Eq. 5 below:

$$P_R = P_T + G_T + G_R - FSL - A_L \quad \text{(Eq. 5)}$$

where $P_R$=received power of the radio frequency signal in dBm, $P_T$=transmit power (dBm), FSL=free space spreading loss (dB), $A_L$=atmospheric loss (dB), $G_T$=gain of a transmit antenna (dBi), and $G_R$=gain of a receiver antenna (dBi). These values are stored in the memory 136 and preferably categorized with additional associated data such as local time and the three-dimensional orientation of the radio frequency detector at the time the signal was received and measured (e.g., a digital time/location stamp encoded in the data). Certain values like transmit power are preferably selected or set on a default mode prior to the calculation step as described in greater detail below. Data values, default settings, and other settings are preferably made using a user input device 138 (e.g., a laptop computer, a tablet computer, a cellular phone) in wired or wireless communication with the radio frequency detector 130. Alternatively, the radio frequency detector 130 may include a user interface device 140 built-in (e.g., a touchpad, a dial pad, or other input apparatus).

The free space loss, FSL, represents the power loss resulting from the spreading of the signal propagating from one location to another over a distance, d. By inverting Eq. 1, the free space loss is calculated according to Eq. 6 below:

$$FSL = P_T + G_T + G_R - A_L - P_R \quad \text{(Eq. 6)}$$

Free space loss is related to the distance, d, and a frequency of the radio frequency signal, f. This relationship is defined as shown in Eq. 7:

$$FSL = 32.5 + 20 \log d + 20 \log f \quad \text{(Eq. 7)}$$

Where the distance, d, is measured in kilometers and the frequency, f, is measured in megahertz (MHz). Combining equations 6 and 7 results in a determination of the distance, d, as follows:

$$32.5 + 20\log d + 20\log f = P_T + G_T + G_R - A_L - P_R \quad \text{(Eq. 8a)}$$
$$(20\log d) = \{P_T + G_T + G_R - A_L - P_R - 32.5 - (20\log f)\}$$
$$\text{let}: x = \{P_T + G_T + G_R - A_L - P_R - 32.5 - (20\log f)\}$$
$$\text{then}: (20\log d) = x \quad \text{(Eq. 8)}$$
$$\text{or}: \log d = (x/20)$$
$$10^{(\log d)} = 10^{(x/20)}$$
$$\text{resulting in}: d = 10^{(x/20)}$$

wherein $P_T$ and $P_R$ are expressed in dBw (not dBm), d is in kilometers, $G_T$ and $G_R$ are in dBi, $A_L$ is in dB, and f is in MHz. A maximum signal detection distance is determined by using a minimal signal detection level, $P_R$. This amount is further reduced from a simple sensitivity value of the radio frequency detector due to excess noise factors and Boltzmann (kTB) noise resulting in a conservative minimal detection level of −89 dB.

Before calculating the distance between radio frequency source and radio frequency detector 130, a number of parameters are evaluated and established.

Receiver Antenna Gain ($G_R$)

The one or more antennas 132 of the radio frequency detector 130 shown in FIG. 54. The one or more antennas 132 may comprise, for example, a triangle-shaped log-periodic antenna with a frequency range of from about 700 Hz to about 6,000 Hz. Such an antenna may have, for example, a known receiver antenna gain value of approximately 5 dBi.

Transmitter Antenna Gain ($G_T$)

In a preferred embodiment, the transmitter antenna is an antenna of a cellular phone, wherein the radio frequency detector determines the distance from the radio frequency detector to the cellular phone. In a preferred embodiment, the transmitter antenna of an omnidirectional antenna of a cellular phone has a transmitter antenna gain of 2.2 dBi. In many cases, however, the precise nature of the transmitter is an unknown variable and the nature of such antennae is approximated based on likely antennae types for which a search is being made.

Signal Frequency (f)

As discussed above, in a preferred embodiment the radio frequency source comprises a cellular phone. Cellular phones operate on a number of frequencies as shown for example in Table 1:

TABLE 1

| Cellphone frequencies. | | |
|---|---|---|
| Technology | Band | Frequency (MHz) |
| 3G, 4G, DVB-H | 700 | 698-806 |
| SMR iDEN, ESMR CDMA (future), ESMR LTE (future) | 800 | 806-824 and 851-869 |

TABLE 1-continued

| Cellphone frequencies. | | |
|---|---|---|
| Technology | Band | Frequency (MHz) |
| GSM, IS-95 (CDMA), 3G | 850 | 824-849 and 869-894 |
| GSM, IS-95 (CDMA), 3G, 4G | PCS | 1,850-1,910 and 1,930-1,990 |
| 3G, 4G | AWS | 1,710-1,755 and 2,110-2,155 |
| 4G | BRS/EBS | 2,496-2,690 |

Figure 55:
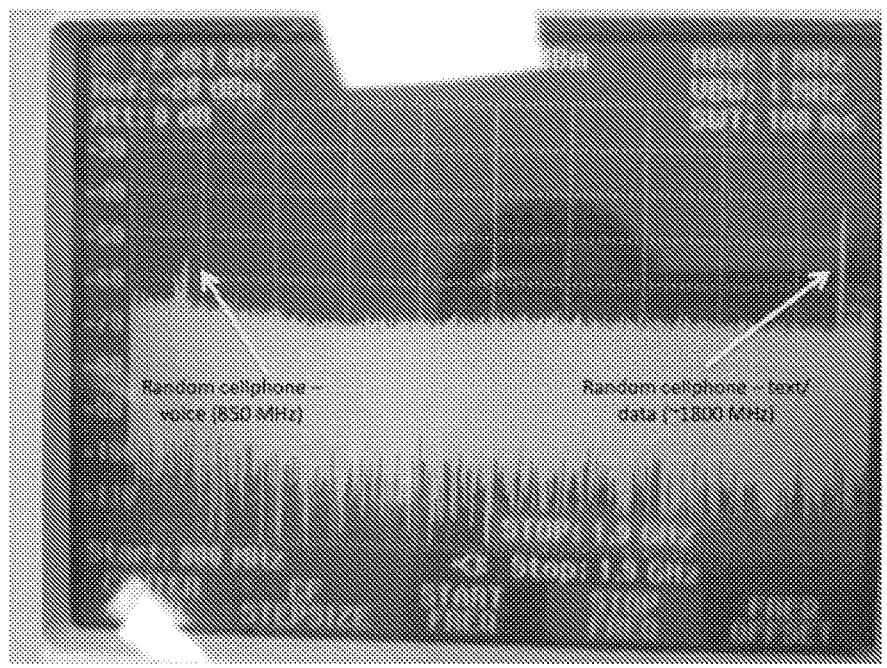
FIG. 55 shows a display screen showing indicia of the detection of a text message from a cellular phone at approximately 1800 MHz according to one embodiment of the disclosure.

As shown in FIG. 55, voice calls may occur at a frequency of approximately 850 MHz. However, it is also understood that various other frequencies may be monitored based on a desired signal to be detected. For example, text messaging and data transmission signals from a cellular phone may occur at a frequency of approximately 1800 MHz. Therefore, in one embodiment the radio frequency detector 130 may be adjustable wherein a user may designate one or more particular frequencies to detect using the user input device 138 or the user interface device 140.

Atmospheric Loss ($A_L$)

Figure 56:
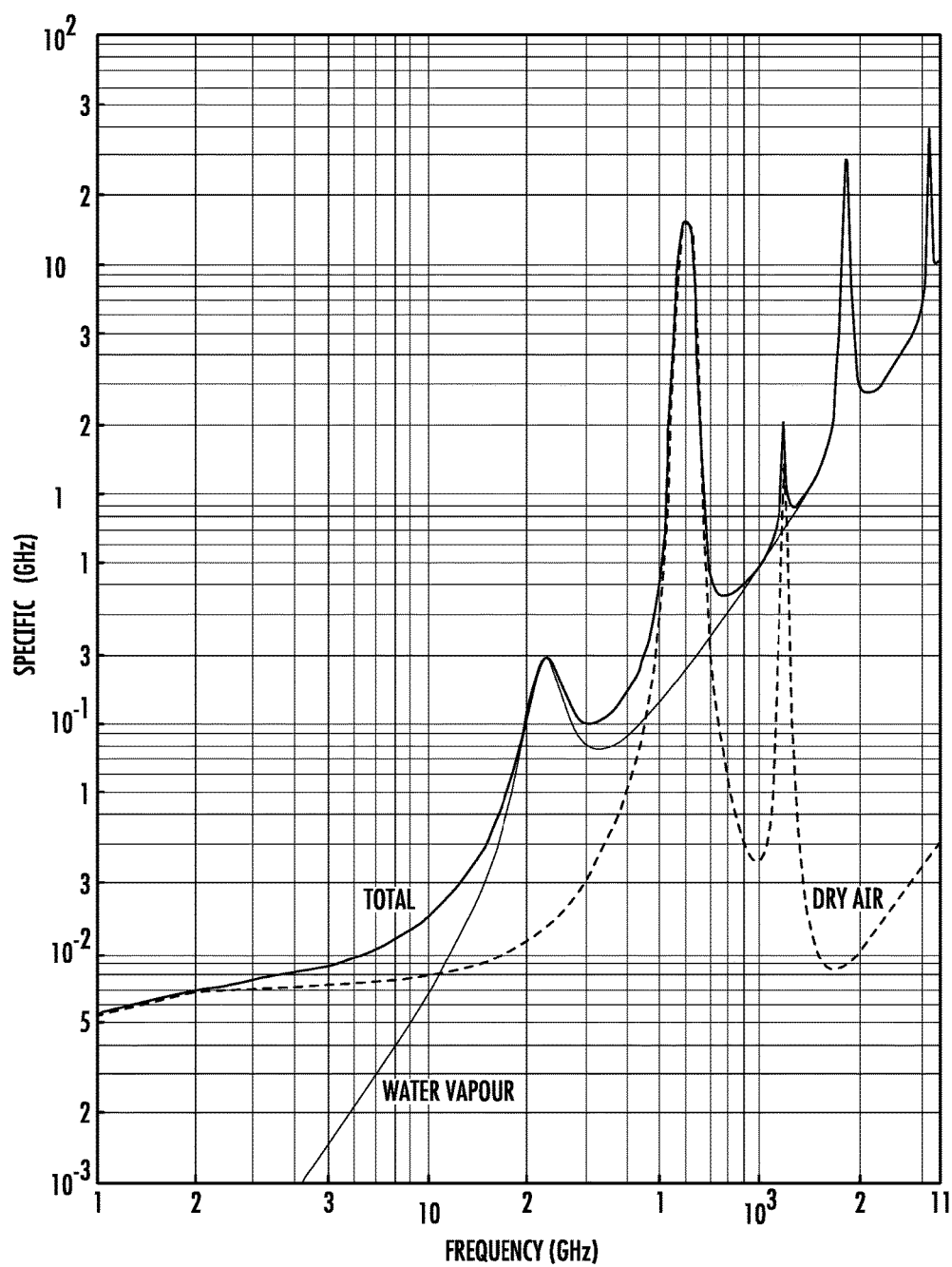
FIG. 56 shows a chart of attenuation losses at sea level that are preferably factored into distance determination according to one embodiment of the disclosure.

Atmospheric loss for a radio frequency signal varies based at least in part on the frequency of the radio frequency signal. FIG. 56 illustrates a chart of frequency versus attenuation of a signal at sea level according to the International Telecommunication Union (ITU). Atmospheric losses may increase with air density; therefore atmospheric losses may be greatest at sea level.

Figure 57:
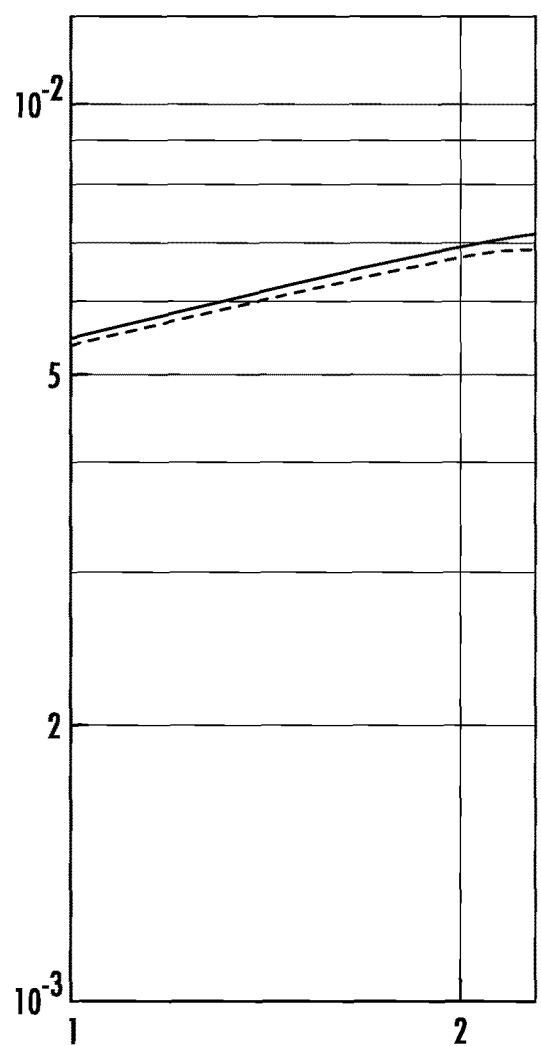
FIG. 57 shows a close-up view of attenuation losses at sea level that are preferably factored into distance determination according to one embodiment of the disclosure.

In a preferred embodiment wherein the radio frequency source is a cellular phone, the frequency of the radio frequency source is typically less than 2 GHz. Referring now to FIG. 57, a close-up view is shown of the chart of FIG. 57 for frequencies of approximately 2 GHz. As illustrated in FIG. 57, the nominative atmospheric loss (attenuation) is approximately $5 \times 10^{-3}$ dB/km (0.005 dB/km).

Therefore, as a conservative estimate, the atmospheric loss, $A_L$ for cellular phones may be approximately 0.006 dB/km. However, it is also understood that the atmospheric loss may be further adjusted based on a number of connectors and other hardware elements of the radio frequency detectors that may result in additional attenuation of the radio frequency signal. For example, additional losses may be estimated as 1 dB for every connector used to process the received radio frequency signal of the radio frequency detector 130. These variables are preferably reconciled by one or more algorithms stored in the memory 16 that are used by the processor 134. Additionally, an altimeter 142 in communication with the processor 134 can be included as a part of the radio frequency detector 130 wherein altitude data is fed to the processor at least approximately when a distance calculation is being made by the processor 134, thereby enhancing the accuracy of the calculation. Other similar devices are similarly contemplated including dry bulb and wet bulb temperature detection.

Transmitter Power ($P_T$)

An estimate of the transmitter power, $P_T$, may be made based on the type of radio frequency source to which the distance is being measured. In a preferred embodiment of detection of a cellular phone radio frequency source, the transmitter power may be variable based on a number of factors such as a variable output of the circuitry within the cellular phone.

For a cellular phone, the maximum transmitter power is typically standardized at 200 mW (23 dBm); however, typically the transmitter power is practically around 100 mW (20 dBm). The maximum transmission power of 200 mW of a cellular phone, also referred to herein as user equipment (UE), typically only occurs at cell edge. Power control of the cellular phone may reduce the maximum transmission power substantially to aid in reducing interference and conserve battery life of the cellular phone. Table 2 produced below shows data related to real-world LTE transmit power levels.

TABLE 2

Probability of various output power levels from cellular phones

| UE EiRP (dBm) | Urban/Suburban (1.732 Km ISD) (6 UE scheduled/ TTI/sector) | | Rural (7 Km ISD) (6 UE scheduled/ TTI/sector) | |
|---|---|---|---|---|
| | PDF | CDF | PDF | CDF |
| −40 | 0.0000 | 0.0000 | 0.0000 | 0.0000 |
| −37 | 0.0001 | 0.0001 | 0.0000 | 0.0000 |
| −34 | 0.0002 | 0.0003 | 0.0000 | 0.0000 |
| −31 | 0.0008 | 0.0011 | 0.0000 | 0.0000 |
| −28 | 0.0020 | 0.0031 | 0.0000 | 0.0000 |
| −25 | 0.0040 | 0.0071 | 0.0000 | 0.0000 |
| −22 | 0.0083 | 0.0154 | 0.0002 | 0.0002 |
| −19 | 0.0166 | 0.0320 | 0.0004 | 0.0006 |
| −16 | 0.0327 | 0.0647 | 0.0007 | 0.0013 |
| −13 | 0.0547 | 0.1194 | 0.0026 | 0.0039 |
| −10 | 0.0839 | 0.2033 | 0.0060 | 0.0099 |
| −7 | 0.1128 | 0.3160 | 0.0153 | 0.0252 |
| −4 | 0.1370 | 0.4530 | 0.0325 | 0.0577 |
| −1 | 0.1429 | 0.5959 | 0.0575 | 0.1152 |
| 2 | 0.1338 | 0.7297 | 0.0911 | 0.2062 |
| 5 | 0.1094 | 0.8390 | 0.1245 | 0.3307 |
| 8 | 0.0753 | 0.9143 | 0.1536 | 0.4843 |
| 11 | 0.0450 | 0.9594 | 0.1605 | 0.6448 |
| 14 | 0.0236 | 0.9830 | 0.1473 | 0.7920 |
| 17 | 0.0106 | 0.9936 | 0.1203 | 0.9123 |
| 20 | 0.0064 | 1.0000 | 0.0877 | 1.0000 |

Tabulated CDF Data

The data of Table 2 is separated into urban/suburban settings and rural settings. As shown by Table 2, in urban/suburban environments, the transmitter power is most probable to have an output power of −1 dBm (UEmaxprob=−1 dBm=0.794 mW). In rural environments, the transmitter power of the cellular phone is most probable to be 11 dBm (UEmaxprob=11 dBm=12.5 mW).

Figure 58:
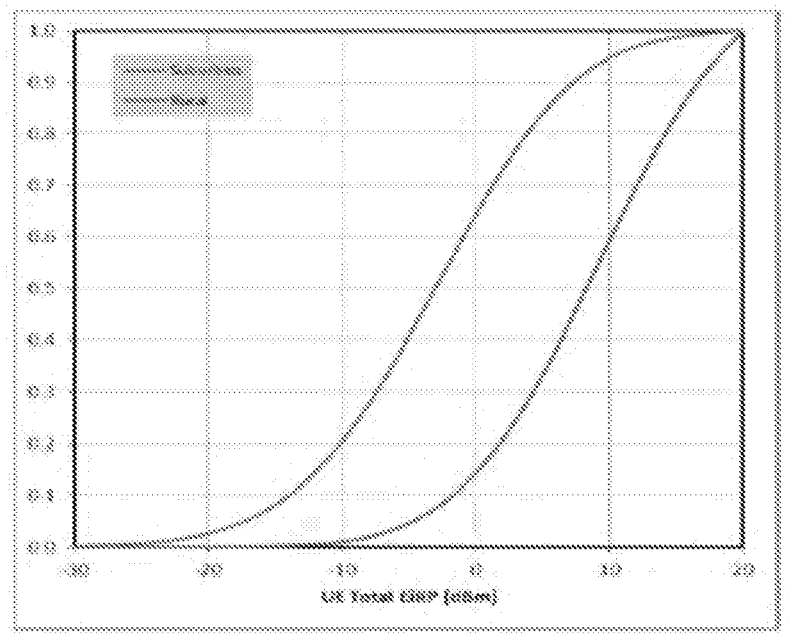
FIG. 58 shows a graphical representation of cellular phone power output probabilities shown as Cumulative Distribution Function (CDF) based on the nature (e.g., magnitude of electromagnetic wave traffic) of the surrounding area that is preferably factored into distance determination according to one embodiment of the disclosure.

Referring now to FIG. 58, a graphical representation of cellular phone power output probabilities is shown as a Cumulative Distribution Function (CDF). Cellular base stations may be rated at higher power levels depending upon class. For example, at full load, a residential femtocell transmits at 20 mW, enterprise small cells at 200 mW, some small cells at 2×1 to 2×5 Watts (two transmit antennas each at 5 Watts). Macrocells transmit a single carrier at from 2×20 Watts (for 5 MHz carrier) to 2×80 Watts (for 20 MHz AWS Band Carrier). A remote radio head (RRH) may support multiple carriers for multiples of these numbers. Additionally, 4 to 8 transmit branches may be used such that one RRH supports 8×20 Watts of RMS transmit power at peak traffic load.

Eq. 8 dictates that $P_T$ be expressed in dBW (not dBm). Therefore, Table 3 provides a unit conversion chart for power levels.

TABLE 3

Conversion table for power levels
dBm to Watt, mW, dBW converstion table

| Power (dBm) | Power (dBW) | Power (watt) | Power (mW) |
|---|---|---|---|
| −100 dBm | −130 dBw | 0.1 pW | 0.0000000001 mW |
| −90 dBm | −120 dBw | 1 pW | 0.000000001 mW |
| −80 dBm | −110 dBW | 10 pW | 0.00000001 mW |
| −70 dBm | −100 dBW | 100 pW | 0.0000001 mW |
| −60 dBm | −90 dBW | 1 nW | 0.000001 mW |
| −50 dBm | −80 dBW | 10 nW | 0.00001 mW |
| −40 dBm | −70 dBW | 100 nW | 0.0001 mW |
| −30 dBm | −60 dBW | 1 uW | 0.001 mW |
| −20 dBm | −50 dBW | 10 uW | 0.01 mW |
| −10 dBm | −40 dBW | 100 uW | 0.1 mW |
| −1 dBm | −31 dBW | 794 uW | 0.794 mW |
| 0 dBm | −30 dBW | 1.000 mW | 1.000 mW |
| 1 dBm | −29 dBW | 1.259 mW | 1.259 mW |
| 10 dBm | −20 dBW | 10 mW | 10 mW |
| 20 dBm | −10 dBW | 100 mW | 100 mW |
| 30 dBm | 0 dBW | 1 W | 1000 mW |
| 40 dBm | 10 dBW | 10 W | 10000 mW |

Data available in Table 3 and other similar conversion chart data are preferably stored in the memory 136 for reference by the processor 134 when making calculations. Therefore, $P_T$ may be calculated as:

$$P_T(\text{Urban/Suburban}) = -1 \text{ dBm} = -31 \text{ dBW}$$

$$P_T(\text{Rural}) = +11 \text{ dBm} = -19 \text{ dBW}$$

In one embodiment, the radio frequency detector 130 includes one or more user selectable modes such as "urban" mode or "suburban" mode, wherein the particular mode is designated by the user based on the user's surrounding environment. In another embodiment, the radio frequency detector 130 allows direct user input of an assumed cellular phone transmit power as mentioned above.

Received Power ($P_R$)

The received power is measured by the radio frequency detector 130. As a functional example, a signal connection path is established between the one or more antennas 132 to a RG174 cable outside of a housing of the radio frequency detector 130 to a SMA-SMA connector through the housing to a RG174 cable within the housing to a RF passband filter, and finally to the RF power detection circuit.

In one embodiment, a power detection circuit is included which is based on a Linear Technology LT5538 broadband power detector and associated DC1120A circuit board. The LT5538+DC1120A combination maps received signal levels to output voltages as shown, for example, in FIG. 59.

Circuit output voltages range from approximately 0.3 Volts to approximately 1.7 Volts. For example, operating characteristics of the LT5538 broadband power detector with an input RF signal of 880 MHz, which is within the cellular phone voice frequency band, are shown in Table 4 below.

TABLE 4

LT5538 circuit characteristics for an 880 MHz input signal

| RF Input Power Ramp | −75 to 10 | dBm |
|---|---|---|
| Linear Dynamic Range ±1 dB Linearity Error (Note 3) | 75 | dB |
| Output Slope | 19.0 | MV/dB |
| Logarithmic Intercept (Note 5) | −88.8 | dBm |

TABLE 4-continued

LT5538 circuit characteristics for an 880 MHz input signal

| Sensitivity | | −71.5 | dBm |
|---|---|---|---|
| Output Variation vs Temperature | Normalized to Output at 25° C. | | |
| | $P_{IN}$ = −50 dBm; −40° C. < $T_A$ < 85° C. | 0.1/0.7 | dB |
| | $P_{IN}$ = −30 dBm; −40° C. < $T_A$ < 85° C. | 0.1/0.4 | dB |
| | $P_{IN}$ = −10 dBm; −40° C. < $T_A$ < 85° C. | 01/0.4 | dB |
| 2nd Order Harmonic Distortion | Pin = −10 dBm; At RF Input | −37 | dBc |
| 3rd Order Harnionic Distortion | Pin = −10 dBm; At RF Input | −40 | dBc |

$I_{RF}$ = 880 MHz

The LT5538 voltage output is preferably digitized using an Analog-to-Digital Converter (ADC) (e.g., a DLP-IO8 8-channel 10-bit ADC). The digitized DLP-IO8 input voltage range is 0-5 Volts. The conversion of ADC numeric value to measured input voltage for a 10-bit ADC and a 0-5 Volt range is as follows:

$$\frac{\text{Resolution of the ADC}}{\text{System Voltage}} = \frac{\text{ADC Reading}}{\text{Analog Voltage Measured}}$$

Analog to digital conversions are dependant on the system voltage. Because we predominantly use the 10-bit ADC of the Arduino on a 5V system, we can simplify this equation slightly:

$$\frac{1023}{5} = \frac{\text{ADC Reading}}{\text{Analog Voltage Measured}}$$

If you're system is 3.3V, you simply change 5V out with 3.3V in the equation. If your system is 3.3V and your ADC is reporting 512, what is the voltage measured? It is approximately 1.15V.

If the analog voltage is 2.12V what will the ADC report as a value?

$$\frac{1023}{5.00 \text{ V}} = \frac{x}{2.12 \text{ V}}$$

Rearrange things a bit and we get:

$$\frac{1023}{5.00 \text{ V}} * 2.12 \text{ V} = x$$

$$x = 434$$

Figure 59:
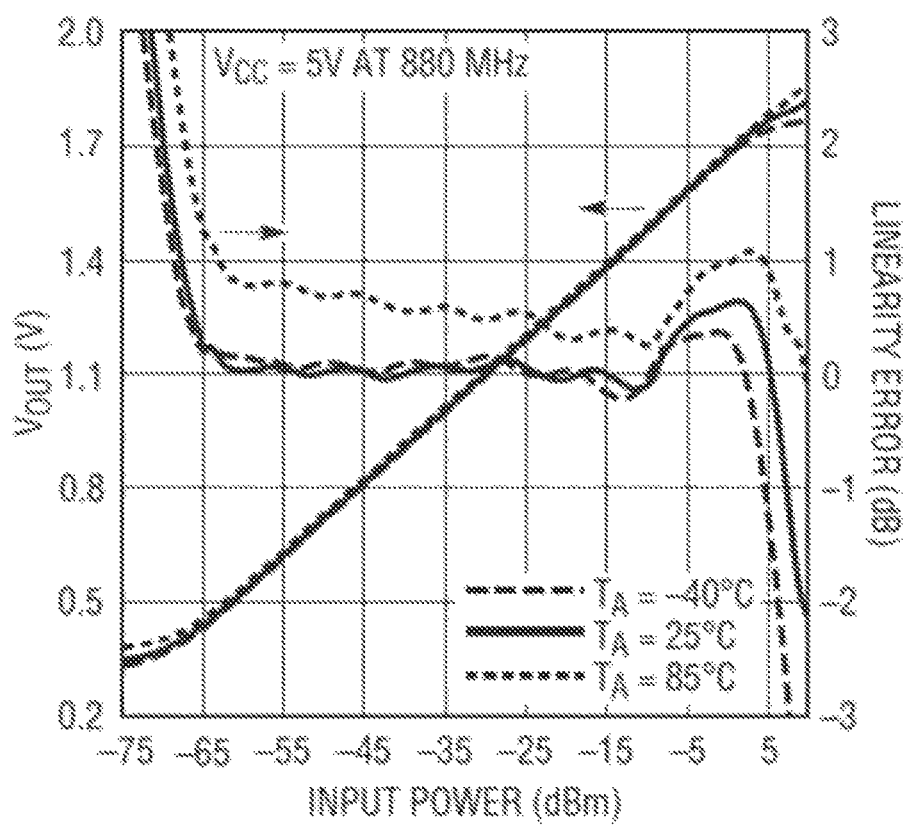
FIG. 59 shows a graph of output voltages of a radio frequency detection circuit according to one embodiment of the disclosure.
Figure 60:
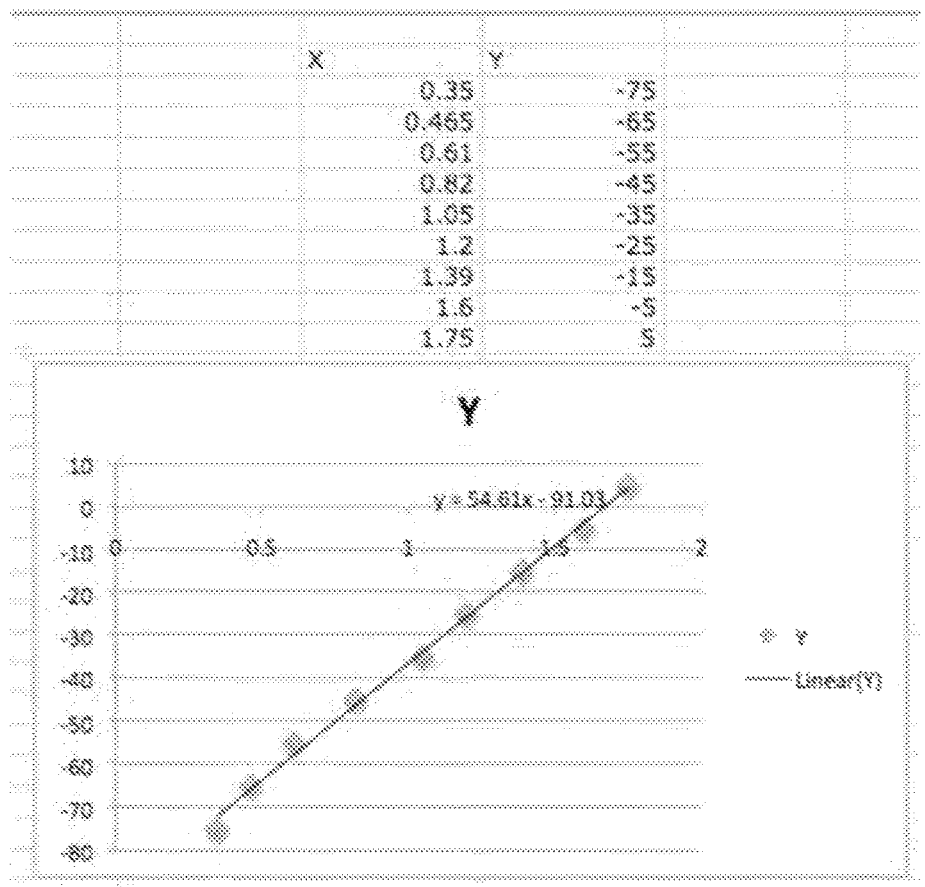
FIG. 60 shows a linear approximation of output voltages of a radio frequency circuit detection circuit according to one embodiment of the disclosure.
Figure 61:
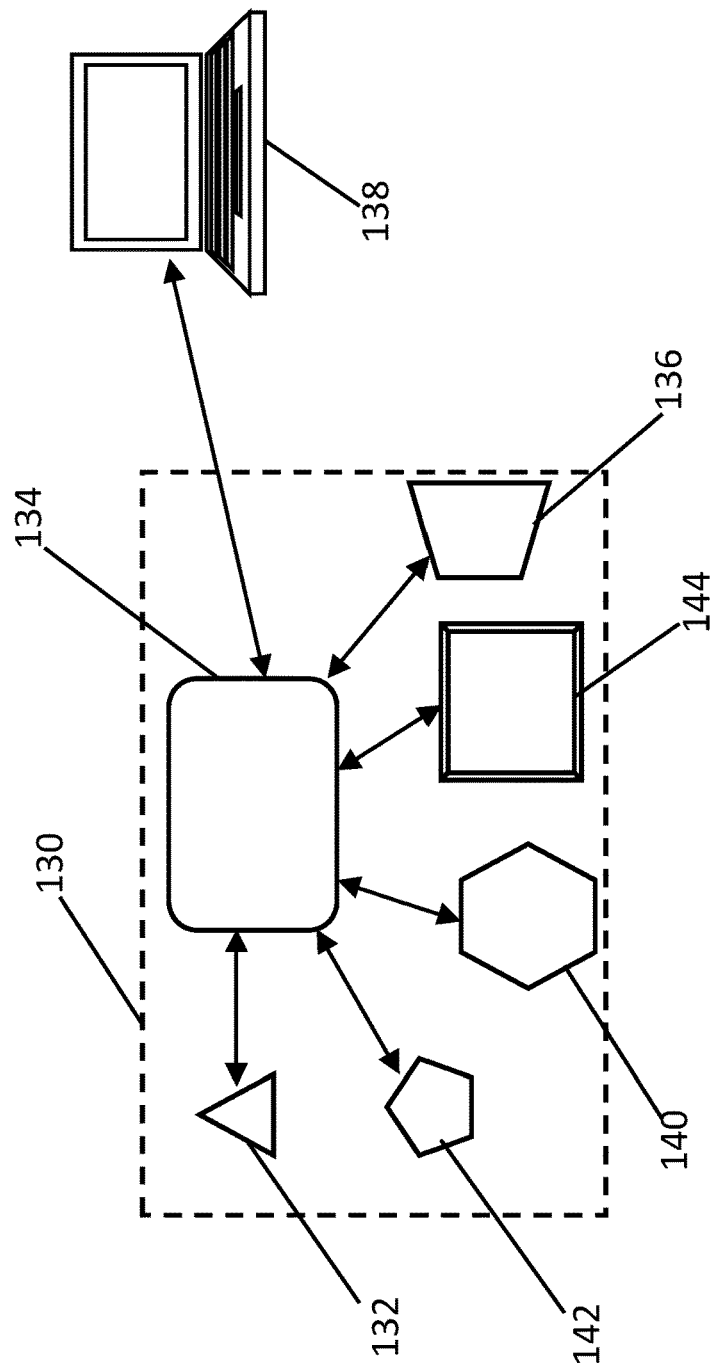
FIG. 61 illustrates a radio frequency detector according to one embodiment of the disclosure.

A received signal strength indicator (RSSI) value is determined from a linear approximation of the output voltage—received signal strength curve of FIG. 59. This linear approximation is shown in FIG. 60. This resulting linear approximation provides a conversion of the measured signal strength (voltage) to the detected RF power level, as shown in Eq. 9 below.

$$RFdet \text{ (dBm)} = 54.61 * LT5538 \text{ (Volts)} - 91.03 \qquad \text{(Eq. 9)}$$

As an example, to determine the detected RF power level, the processor 134 of the radio frequency detector 130 performs the following steps:

(1) Storing a known input range of the DLP-IO8 as from about 0.3 Volts to about 1.75 Volts;

(2) Storing an ADC reading of the DLP-IO8 10-bit, 0-5 V range as from about 61 to about 385 as a measured value of signal strength;

(3) Computing the LT5538 voltage as AVM=(5*ADC reading)/1023;

(4) Computing the radio frequency detected RFdet by inserting AVM above into Eq. 9 above; and (5) Converting RFdet (dBm) to $P_R$ having units of dBW as follows: $P_R$=RFdet−30.

In the manner described above as well as other contemplated ways, the radio frequency detector 130 determines the distance from the radio frequency detector 130 to the radio frequency source. Prior to determining the distance, a user may input various known variables of the above equations such as whether the distance is being determined in an urban/suburban or rural environment and an altitude of the user for aiding in calculating atmospheric loss values. Other variables are stored on a computer readable medium (e.g., the memory 136) of the radio frequency detector 130 in communication with the processor. Stored variables may include, for example, the receiver antenna gain, atmospheric loss values, and transmitted power values for various urban/suburban and rural settings such as those shown in Table 2 above.

When or after the radio frequency detector 130 detects a radio frequency signal from the radio frequency source, the distance between the radio frequency detector 130 and radio frequency source is calculated by the processor 134. Once the distance is calculated, a distance value may be displayed on a visual display output 144 of the frequency detector 130 to the user along with other relevant information such as a calculated or otherwise estimated margin of error and other information detected by the radio frequency detector 130. The radio frequency detector 130 advantageously allows a user to determine the distance to the radio frequency source which, along with other information that may be available to the user such as a direction of the radio frequency source, may allow a user to locate the radio frequency source passively and, thereby, without providing any notice to the radio signal source operator that he or she is being monitored or otherwise observed.

While the above discloses a radio frequency detector including specific hardware elements to determine the distance between the radio frequency detector and the radio frequency source, other various components known to a person having ordinary skill in the art, other components are contemplated that can perform the same function in the same way with the same or similar results.

Assisted Detection and Location of Cooperating Assets with Augmented Reality Visualization In one embodiment, a system and method for the location and detection of "radio tags" which have been attached to moveable assets such as, for example, equipment and people is provided. Radio Frequency Identification ("RFID") systems involve the detection of a tag when it is in close proximity to an associated RFID reader/interrogator. There are a variety of interrogation methods as well as passive, semi-active, and active RFID tags. An associated technical field is Real Time Location Services ("RTLS") where the tags and readers may use technologies significantly different from the aforementioned RFID systems. In these cases, the infrastructure (readers/interrogators) send a signal to the tags which re-radiate a signal which the readers detect and process.

There is a developing field of detection and location of assets known as "Real Time Locations Services" (RTLS). These services all require the movable assets (equipment or people) to wear a 'tag' capable of either periodically emitting a radio signal (pinging) or emitting a signal when excited by a nearby radio transmission—RFID tags. These RTLS systems require an infrastructure to be built and maintained that is fixed to a specific location. The asset tags roam about the site and the fixed infrastructure senses the presence of the tags moving about within its space.

This disclosure supports the concept of allowing the apparatus to essentially be a movable/dynamic infrastructure—being deployed wherever the need may arise for asset tracking. In one embodiment, the man-portable frequency location and detection apparatus can detect standard commercial tags based on their frequency or can be paired with specific and unique supplied tags designed to provide distance resolution. Coupling the distance from the detector to the tag with knowledge of the detector's position results in information that is coupled with location visualization to provide users with a greater understanding of the asset location. This information is stored on one or more on-board memory storage modules and organized by one or more on-board processors.

Existing location services for RTLS do not include the overlay of augmented reality (AR) visualization, but the detector described herein does.

Possible uses include: location of public safety personnel and equipment—a Fire Chief can see where in a building his firefighters are deployed; Police/Military Commanders see the deployment of personnel in hidden positions; Lost/misplaced assets might be located in a dense or confusing environment.

Based on the varying degrees of sophistication of the AR software, the data associated with the tag could be as simple as any of the examples as follows: (1) a tag frequency is coming from a given location (no additional data about the asset); (2) the tag supplies pre programmed data (e.g., a name); or (3) the tag provides pre programmed and dynamic data (e.g., name, temperature, etc.).

In various embodiments of the frequency location and detection apparatus, preferably all data is displayed in an augmented visualization display using a display device configured to display one or more levels of information including, for example, real-time video of a targeted field of view, indicators showing the relative location of tagged persons/items within the field of view, a virtual video of the targeted field of view which has been altered to improve performance (e.g., for easier viewing in the dark, for easier viewing in sunlight, or for stealth of the user), and/or other data of interest to a user. The frequency location and detection apparatus is preferably battery powered by one or more on-board batteries, includes at least one on-board processor, and at least one on-board memory device in communication with the processor and in communication with detection hardware (e.g., antennas) for storing data associated with detected signals.

The detected information is stored, processed, and displayed so as to maximize the information about the assets available within the field of view to a user using the frequency location and detection apparatus.

Directional Passive Wireless Sensor Tag Interrogation

Passive wireless sensor tags (PWST) are a variant on radio-frequency identification (RFID) technology, but incorporate sensors. There are two ways that RFID is integrated with sensors: (1) knowing that an RFID "tag" is essentially an electronic barcode (and is guided and regulated by dozens of international standards) with a "0", "1" data sequence embedded in the tag (similar to how optical barcodes have the 0/1 sequence encoded as light/dark strips), a reader sends an EM signal (radio wave) out. The EM signal interacts with the RFID tag and the 0/1 tag sequence is reflected back to the signal source (the reader). The RFID tag may be totally passive (as in no battery or active electronic components or no transistors in the circuitry).

There are variations on this interrogation method, with one being that the tag has a battery (or similar energy storage device/mechanism). The reader's signal then acts as a "wake up" signal to the tag. It responds to the wake up by energizing its circuitry and transmitting a signal (which would have the 0/1 code in it).

In this mode of operation, RFID sensors take advantage of both the passive and active RFID operational means. In the active case the "wake up" signal does indeed wake up the circuit; however, instead of just the 0/1 sequence, there are also one or more sensors in the circuit. The sensor reading is then converted into a 0/1 sequence typically as a high/low—or binary state—sensor (the circuit is very simple being a threshold detector). The RFID response then has the electronic barcode numbers—indicating which tag it is—along with a sensor reading. The interrogator/reader then detects the sensor reading and may further process the sensor reading (like just relay it on up the data stream).

In the passive case, the sensor manipulates the reflected RFID barcode, thereby changing one or more barcode bits. The manipulation is typically difficult as it requires some material property to change (in accordance with the parameter of interest), and then modulate/manipulate the return code.

One example is to use a polyimide material that absorbs moisture. As the moisture is absorbed the electrical properties of that region of the polyimide change (impedance, and to an extent capacitance, but that point is geometry-dependent). If tuned just right, then this impedance change can be incorporated into a lumped element RLC circuit and change the resonant frequency right at the location of where the polyimide is. If that is over/under one part of the RFID's electronic barcode, then you can (potentially) change that specific bit's state (e.g., 0 to 1 or 1 to 0).

Figure 62:
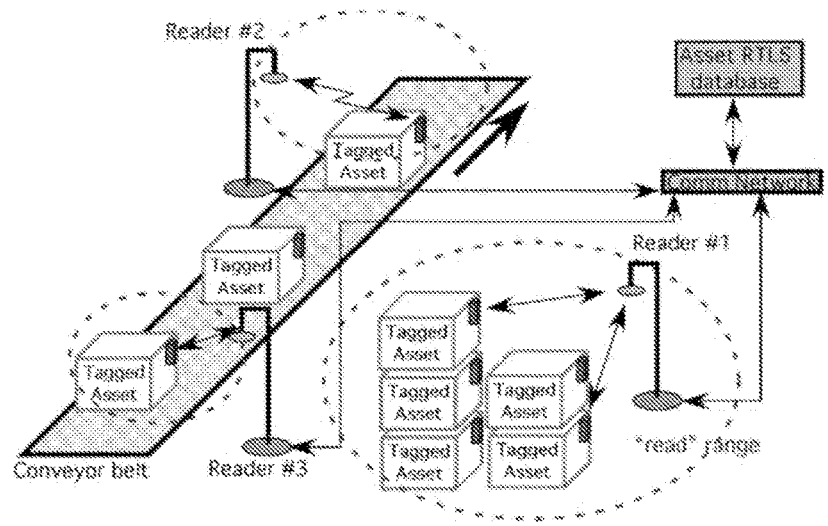
FIG. 62 illustrates RFID incorporated in an asset tracking system according to one embodiment of the disclosure.

Again, it is incumbent upon the interrogator/reader to determine the sensor value and then do something with it. The system view of a traditional RFID tag incorporated into a real-time location system (RTLS) architecture is illustrated in FIG. 62.

Figure 63:
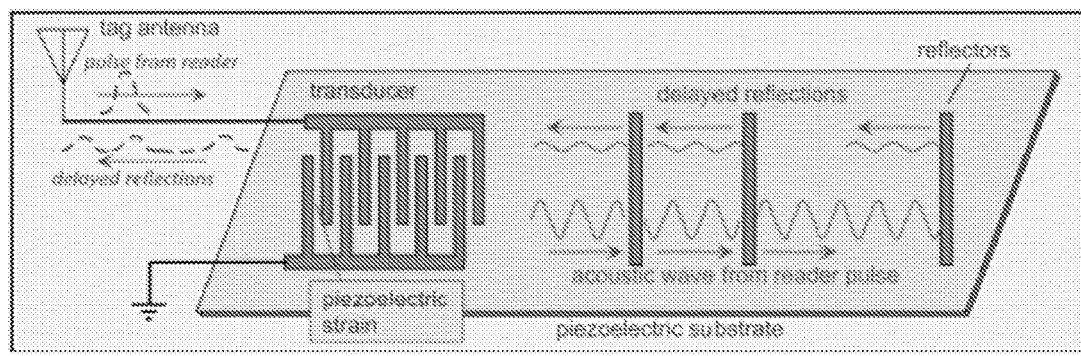
FIG. 63 illustrates a SAW-based PST sensor according to one embodiment of the disclosure.

Variations of PWST systems exist. For example, a surface acoustic wave (SAW) is used for the sensor with standard interdigitated circuit "fingers" then coupled with delay lines for RF signal reflection (and temporal delineation between the interrogator and sensor signals). There is still an interrogator/reader that sends an EM wave towards the PWST, see FIG. 63.

Figure 64:
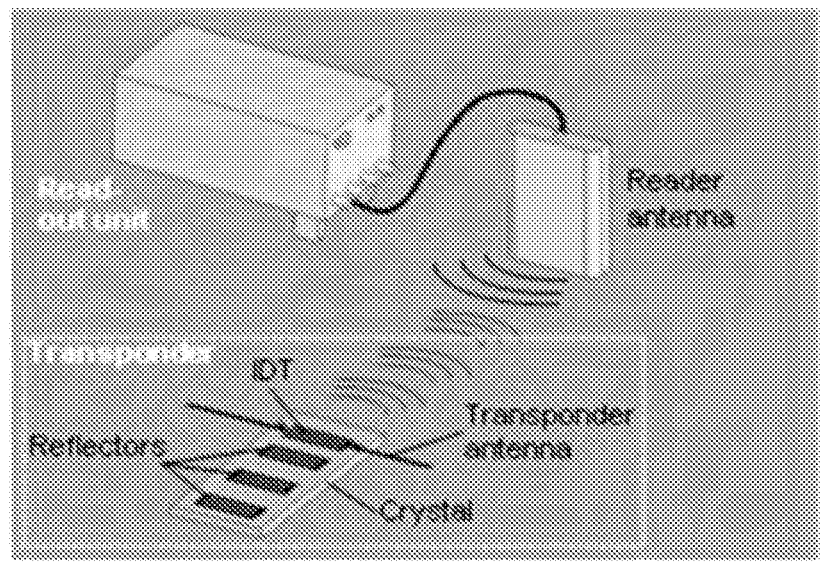
FIG. 64 illustrates a SAW RFID system according to one embodiment of the disclosure.
Figure 65:
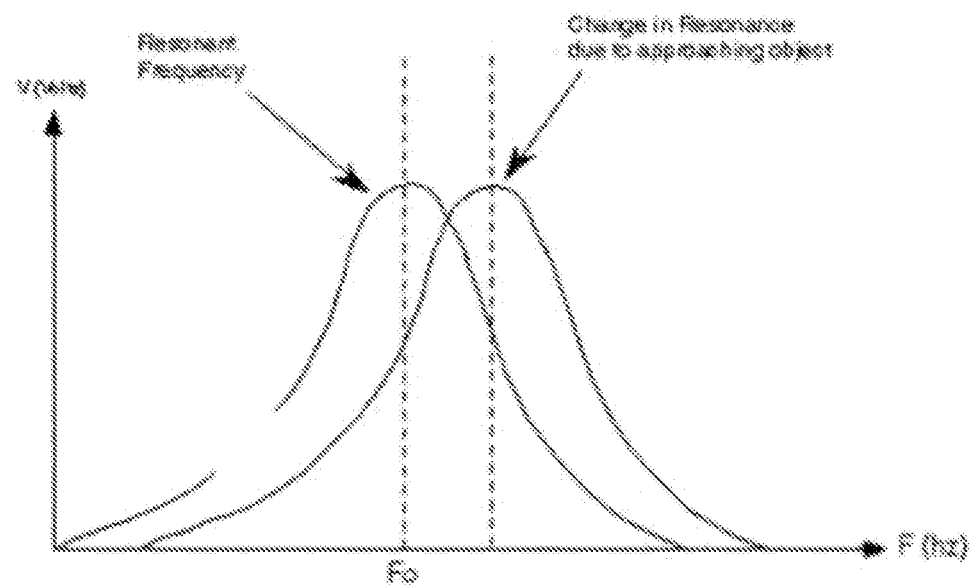
FIG. 65 is a graph illustrating a frequency resonance varying proximity sensor according to one embodiment of the disclosure.

As opposed to RFID where the 0/1 sequence is reflected (in the passive case) or transmitted (in the active case), in a SAW-based PWST, the interrogator/reader/probe signal is narrowband in frequency. The SAW active element changes the resonant frequency of the circuit causing it to reflect/reradiate an EM wave/signal that is offset in frequency from the initial probe signal that was transmitted to the SAW active element. In other words, the reflected signal behaves as a frequency shifted (FM) sensor signal. The sensor value is encoded within amount of deviation of the FM sensor signal from the probe signal. Signal detection is achieved using classic frequency-shift-keyed (FSK) techniques. A representative system diagram is presented as FIG. 64.

However, these SAW RFID systems include only a single antenna, thereby limiting the reading of PWSTs within proximity of the antenna.

An encoding and interrogation method and apparatus is provided comprising one or more directional antennas and associated transmitter hardware that allows the remote reading of a variety of PWSTs. The frequency and amplitude deviation from the interrogation EM signal returned from a PWST under interrogation is measured and used to determine the sensor readings. In addition, the PWST itself has an integrated electronic barcode representing a unique ID for the particular PWST. The resultant sensor reading is combined with the PWST ID code, data is logged within the interrogator, and the data is made available for machine-to-machine data transmission which includes information on the sensed data and identification of the PWST that is doing the interrogating.

A preferred version of a device including this technology has at least two operational modes: (1) a conventional RFID interrogator, but having various directional antennas and probe signal output levels wherein the electronic barcode is read and readied for system relay; and (2) a PWST interrogator with directional antennas and variable probe signal output levels. In this latter configuration, the PWST ID is read and the sensor reading—be it binary state modulation or a frequency shift varying value—is interpreted, integrated with the PWST ID code and readied for system relay.

Figure 66:
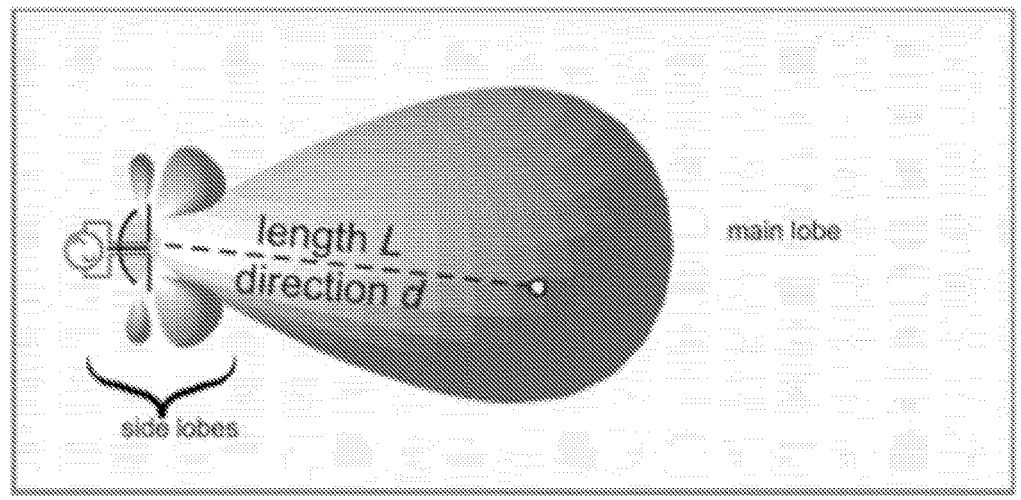
FIG. 66 illustrates a directional antenna beam pattern according to one embodiment of the disclosure.

FIG. 66 illustrates the situation where the gain of the directional antenna allows the PWST device to be placed inside an environment that exhibits a high degree of attenuation of EM signals. Sending an EM wave from the interrogator to the PWST, then receiving the return signal from the PWST has two key elements:

(1) the signal levels; and
(2) switching the interrogator from active transponder (emitting an EM signal) to passive listener (receiving the return signal from the PWST).

The situation just outlined for RF signal detection mirrors what is used to determine if a communications system will function (at a certain bit error rate). System performance, or in this case detection of a radio signal, is predicated on having a receive signal power that exceeds the system noise floor. The communications link equation is presented as Equation 6:

$$P_R = P_T + G_T + G_R - FSL - A_L \quad \text{(Eq. 6)}$$

where PR=received power (dBm), PT=transmit power (dBm), FSL=free space spreading loss (dB), AL=atmospheric loss (dB), GT=gain of transmit antenna (dBi), GR=gain of receive antenna (dBi).

Figure 67:
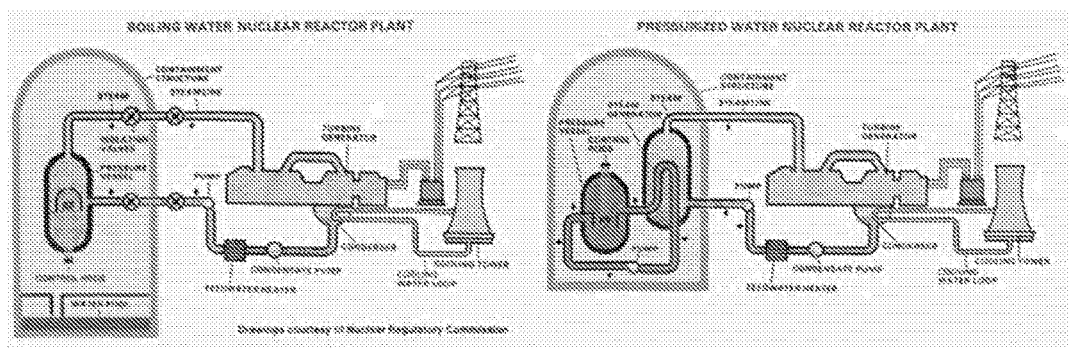
FIG. 67 illustrates a cross section of a nuclear power plant containment vessel according to one embodiment of the disclosure.
Figure 68:
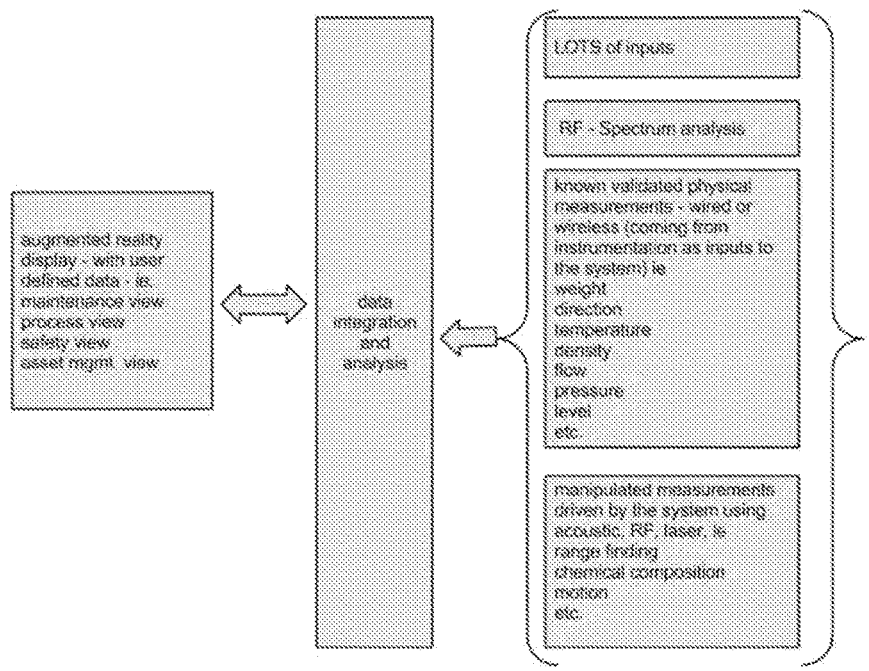
FIG. 68 is a chart illustrating integration of multiple parameter sensing using passive and active detection techniques coupled with an augmented reality visualization according to one embodiment of the disclosure.

An envisioned use of the PWST+interrogator system lies within a nuclear power plant. Consider the situation where sensing/readings are to be taken from within the containment vessel shown in FIG. 67.

The sensors, in this case PWSTs, are to be placed within the containment vessel/chamber (a high temperature, high pressure, and high radiation environment) while the interrogator is outside of the chamber. The concrete and rebar forming the vessel exhibit a high level of signal attenuation (term, AL in Equation 6). Using the directional antenna system and configuration, with high antenna gain (term GT=gain of transmit antenna in Equation 1), enough energy is transmitted through the concrete to interact with the PWST and cause the return EM signal to then propagate back towards the interrogator. With the interrogator's transmitter now turned off—it is now operating in listen mode—the directional antenna system now performs as a receiver thereby using the high gain to detect the return signal (term GR=gain of receive antenna of Equation 6).

The situation just described for a nuclear containment vessel sensing/interrogation is representative of a large number of similar cases where the environment presents a large atmospheric loss or other challenges which limit the use of PWSTs.

Strategic and Inferential Measurements with Visual Identification of Phenomena in Real-Time The system and method of the present disclosure provides visual identification of remote measurements or phenomena in real-time. The system and method has the ability to aggregate multiple measurements into a strategic measurement and is not limited to passive reception. This methodology supports the direct input of wired or wireless measurements (i.e., reading a weight scale or process instrument's value) as well as actively creating a perturbation of an existing condition and measuring a response (i.e., lasing the atmosphere, pinging for acoustic echo). There are a variety of related measurements that can provide input to create an inferential strategic measurement displayed with contextual data in an augmented reality framework. Exemplary integration of multiple parameter sensing using passive and active detection techniques coupled with an augmented reality visualization is integrated in FIG. 62.

A. Concepts of Operation—Measurement Parameters: Industrial

1. Industrial Asset Management

A maintenance worker needs to locate a high-pressure steam leak to affect repairs. The jet of steam may be laser thin and the associated noise may be ultrasonic making location of the jet impossible to see and very dangerous. Using the system and method of the present disclosure, the maintenance worker is able to visually see the steam jet using a combination of IR and audio sensors with relevant data displayed as an overlay on an augmented reality display.

In similar fashion to the above example, a maintenance worker can quickly and inexpensively scan process equipment for operating conditions that are out of specification—heat of the bearings and vibrations are two main indicators of rotating machinery wear. In this case the system and method of the present disclosure could gather data via a combination of IR and laser motion/vibration detection, presented with data overlayed into an augmented reality display.

The system and method of the present disclosure could also be used with corrosion detection within piping and vessels. Using the combination of conductivity measurements coupled with audio reflections and turbulence flow detection can allow for the 'visual' detection of corrosion within industrial piping.

2. Environmental Analysis

In other examples, the system and method of the present disclosure may be used in environmental analysis such as with fugitive emissions by enabling a person to "see" acceptable or abnormal hydrocarbon emissions over a process plant such as by focusing on a specific smokestack or over the general area. This measurement includes the use of IR, laser and potentially toxic vapor analyzers, combined into a strategic measurement displayed virtually with data in augmented reality. Additionally, vessels moving into and out of port may be scanned for hydrocarbon spills and emissions. Similarly, vehicles may be scanned, such as at toll booths, to analyze exhaust temperatures coupled with laser and IR scan for vapors.

3. Other Applications

The system and method of the present disclosure may also be used in other industrial applications, such as with RFID/tagged material (warehouse inventory/building material/intelligently pick from a pile concept), industrial RF material tagging (for flow and transformation—material tagging application where a user can track the material flow and/or transformation through the process and micro RFID tagging/tracking where the tag's RF capability is affected by the process in a predictable manner), home/building infrastructure inspection (using a combination of RF vibration, heat, sound reflection, ground penetration radar—pipeline detection—water sewer/septic), home inspection (penetration radiation, acoustics, rodent ants, rotted beams, wire/pipe locations, objects in walls, etc.), medical imaging (pathology/cellular/tumor identification and locating using the combination of RF and IR), body armor (chest bomb detection—heat signature or lack thereof), drive by home energy audits (scan the house and send picture to the energy auditors), drive by/portal flu or fever detection, and drive by/portal gun detection.

B. Concepts of Operation—Measurement Parameters: Military

1. Visual Frequency Location and Sensing (VFLAS)

A visual frequency location and sensing (VFLAS) signal detection platform and system of the present disclosure is a multi-parameter sensing and augmented reality visualization tool that supports a wide range of surveillance and counter-surveillance missions. Representing a hybrid of optical, RF, electronic and computing technologies, the system and method of the present disclosure encompasses an overlay technology that has been compressed into a small form factor system suitable for use in a variety of situations.

Signal detection relies on advanced correlation-based assessment of the digital native attributes (DNA) inherent in radio signals. Such Sig-DNA when coupled with beam-forming antennas allows for rapid assessments of "areas of interest" to determine if unauthorized signals are present (indicative of the enemy, a perimeter or border trespasser, or contraband assets).

The VFLAS core technical merit allows for the visualization of multi-parameter signals overlaid on an optical (visible, infrared or thermal) image stream. The system includes visual alerts, reporting and recording functionality presented in a secure architecture with remote access capabilities. The system software architecture is meant for delivering the resultant measurement data—either as raw data feeds or "interpreted Sig-DNA results"—via an Ajax framework over end-to-end, IP-addressable content management system.

Coupling of platform architecture with integrated optical and optional plug-and-play directional direction systems allows for various levels of directionality. The result is a system that allows a user to literally scan across a region or zone of interest to determine if a wide variety of signals are present in an area under inspection.

In a military setting the VFLAS system can scan and display, on a video monitor, a source of multi-parameter signals emanating from concealed positions, such as from hilltops, villages, fields, and along roads. VFLAS locates multi-parameter signals to assist in protecting individuals from threats that use multi-parameter signals, such as RF-controlled improvised explosive devices (IEDs), surveillance teams or advancing enemy forces. VFLAS can detect multi-parameter signals that could locate a sniper, surveillance or observation team attempting to track security units, shielded pockets of individuals preparing for advancement, or individuals preparing to receive drugs or illegal aliens, all from a safe standoff distance that would provide a tactical advantage for a Warfighter. Detection at significant standoff distances and mobile vehicle-mounted speeds from multiple platforms has been validated at a variety of U.S. Government test sites, including the Yuma Proving Ground.

The VFLAS of the present disclosure can operate in four modes: handheld, on a vehicle, mounted inside an aircraft or on a small unmanned aircraft system (SUAS), or from a fixed position, such as a light pole co-located with CCTV systems.

VFLAS capabilities can support intelligence, surveillance, and reconnaissance (ISR) by addressing synchronization of both internal and external integration and can conduct reconnaissance or surveillance to a named area of interest or directed search areas. VFLAS forward-looking capabilities are accomplished in real time to detect and locate signal sources or re-target areas in real time to support ISR. VFLAS is a passive system that supports ISR by providing relevant information to update ISR operations to preclude surprises from the enemy and identify preemptive activities.

VFLAS is scalable to ISR demands and to the concurrent operation platforms of handheld portable, mobile or static position deployments. VFLAS can correlate scalable information in real time to support ISR. VFLAS software may overlay mathematically calculated RF internally generated to create GPS, directionality and a range of GIS file formats including SHAPE or raster files. Overlays are integrated, fused and analytical.

2. VFLAS Tactical ISR Description & Architecture

Figure 69:
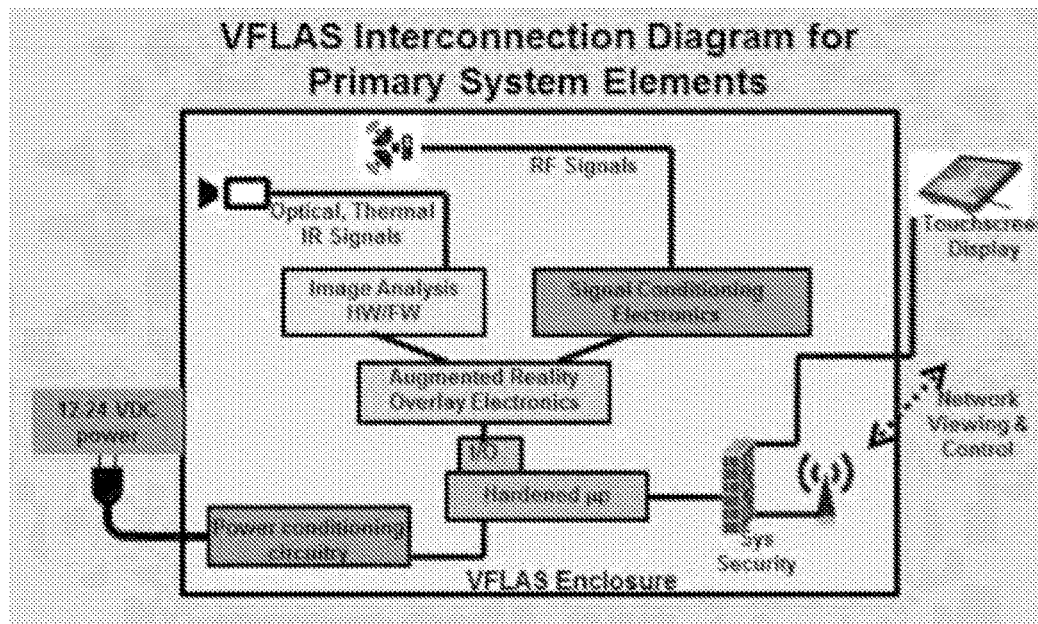
FIG. 69 illustrates a simplified VFLAS system architecture according to one embodiment of the disclosure.

The VFLAS signal detection platform and system of the present disclosure is a multi-parameter sensing and augmented reality visualization tool that supports a wide range of surveillance and counter-surveillance missions. VFLAS has elements that appear as an embedded device—specifically in the modularity and inherent intelligent end device (IIED) constructs for autonomous sensing systems—as well as core software system design elements (e.g., Ajax services). A simplified system diagram is shown in FIG. 69.

Figure 70:
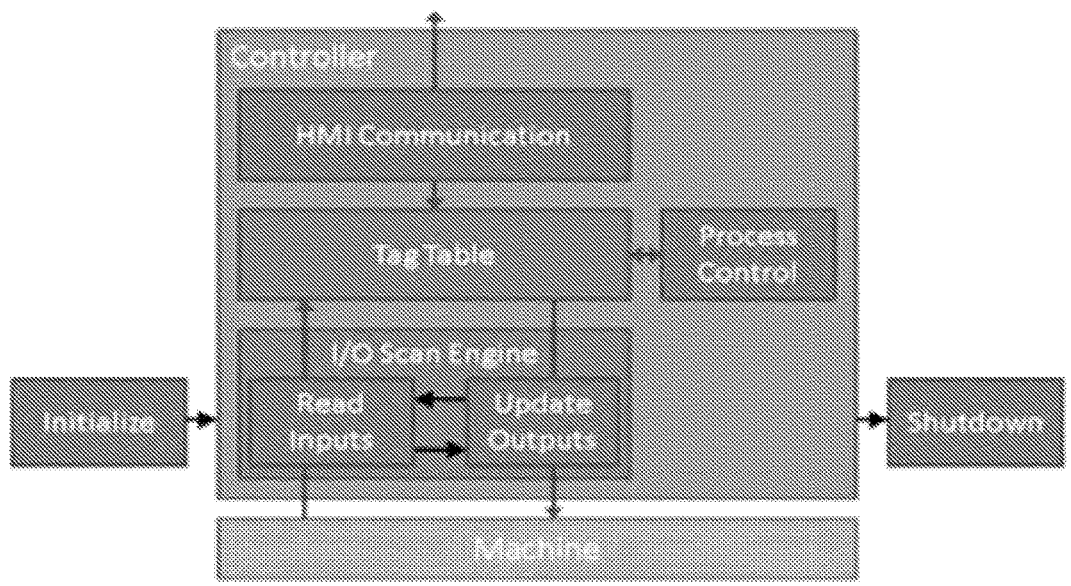
FIG. 70 illustrates a VFLAS high-level interface diagram according to one embodiment of the disclosure.

Each sensor component—be it hardware (physical device) or software (sensor agent)—is treated as a process control module within the software architecture. The situation is represented in FIG. 70 (details associated with how the messages or instructions with how the control tags get to the module are purposefully omitted here). FIG. 70 does not illustrate how the system components relate to each other after that step. This abstraction highlights how the software incorporates human machine interface (HMI) including a physical touch screen for user interaction and control. These processes may be readily automated and/or controlled by a higher level source code. In such a case the elements being managed are:

Inputs from a machine under control;
Outputs to control the machine;
A startup and shutdown process;
A human interface device so users can obtain reports from the system or interact with it; and
A form of control language using tags that defines the machine control.

The VFLAS hardware includes specialized optical, RF and thermal IR antennas and detectors, customized signal processing circuits, and related signal detection components. The computational hardware os a COTS industrial ECX form factor single board computer relying on an Intel Core i7 outfitted with a variety of I/O and memory.

As a hybrid embedded system—microcomputer—the "embedded side" circuitry utilizes an ARM Cortex-M3 (or equivalent) with standard I2C and digital+analog I/O. Programming of the Cortex is in C++ and relies on the CeSourcery Toolchain (Mentor Graphics) with a variety of Joint Test Action Group (JTAG) programming tools available for firmware flashing. This is in conformance with what is now standardized as the IEEE 1149.1, Standard Test Access Port and Boundary-Scan Architecture. Software is coded in C++ with compilers suitable for the Core i7's operating system Ubuntu 10.6.

Elements of Eclipse Integrated Development Environment are used for the support of multiple programming languages as necessary (specifically via the use of plugins). VFLAS relies on visual sensing systems that can operate in the visible, IR, and thermal IR ranges. The data "consumed" by the software originates from these sensing systems and is Motion JPEG (MJPEG) formatted. The VFLAS custom software then overlays the mathematically calculated RF internally generated data, including position (GPS) and directionality information, onto the imagery in a secondary MJPEG stream. A suite of MJPEG image manipulation and identification software routines isolate specific sensed features. To recap, the data consumed is internal to the VFLAS hardware/software system while the data generated is an MJPEG image stream available through VFLAS web-services.

3. DCSG-A DSC Cloud Migration Strategy

The VFLAS system design is based on allowing a remote user to securely access the system for either simply viewing what the system is generating—the aforementioned MJPEG image stream, plus rewind/playback functionality—or for remote control of the VFLAS operation (thereby overriding the touch screen).

Integration into a Cloud Strategy should be a relatively easy task for the overarching software architecture depicted in FIG. 69 treats "user inputs" as functionality modules which could be provided as a data stream from a control system. The situation is easily seen in that the touch screen provides command and control data to the software via the touch screen's USB interface. A Cloud-based command and control base would, in the simplest sense, replicate the touch screen commands.

The VFLAS software merely needs an MJPEG data stream and does not need to know where that IP-addressable camera is physically located—just network addressable. There are certain assumptions that are made in the correlation of the variety of signals that the VFLAS software is computing. Such equations would have to be refined in the instance where the MJPEG image stream source is at another location (and probably looking in a different direction than the rest of the VFLAS detection system).

VFLAS development followed the Open Group Service Oriented Architecture Integration Maturity Model (OSIMM). In addition to the aforementioned MJPEG data stream, the interpreted measurement information may be parsed and reconstituted as machine and human readable forms. The VFLAS software also generates alarms—displayed in the MJPEG image stream—which can be configured into (essentially) any format and pushed to the Cloud if required. From an Entity Management perspective, the VFLAS system is designed to respond to ICMP and SNMP-V3 queries from network management systems. This can be modified as necessary.

Figure 71:
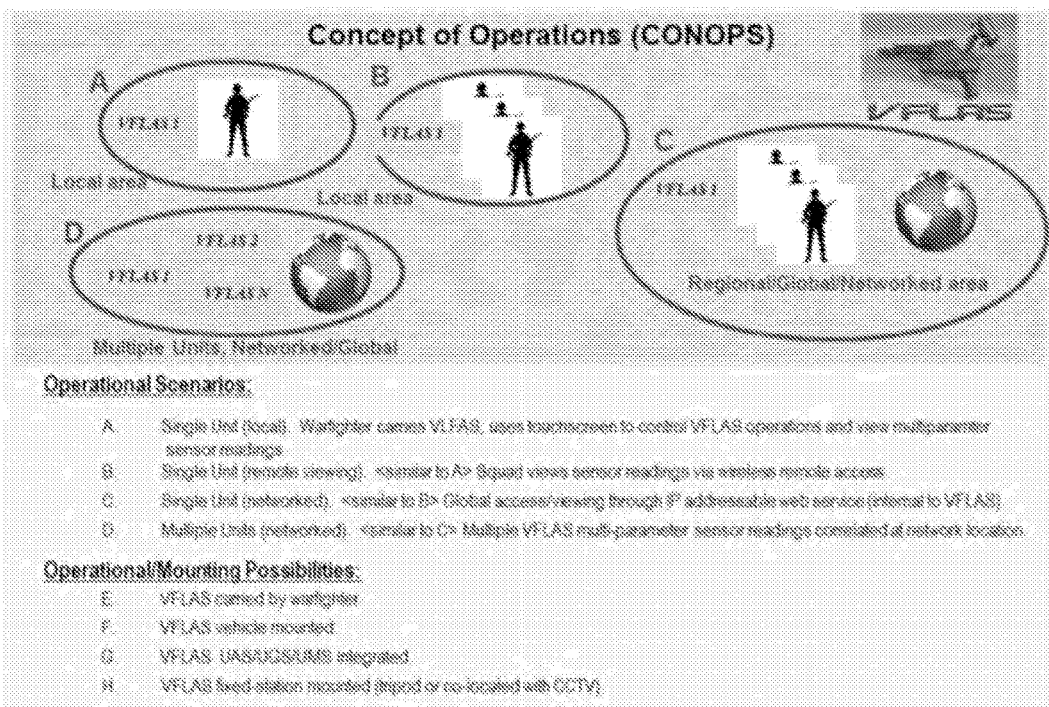
FIG. 71 illustrates a concept of operations for the VFLAS instance according to one embodiment of the disclosure.
Figure 72:
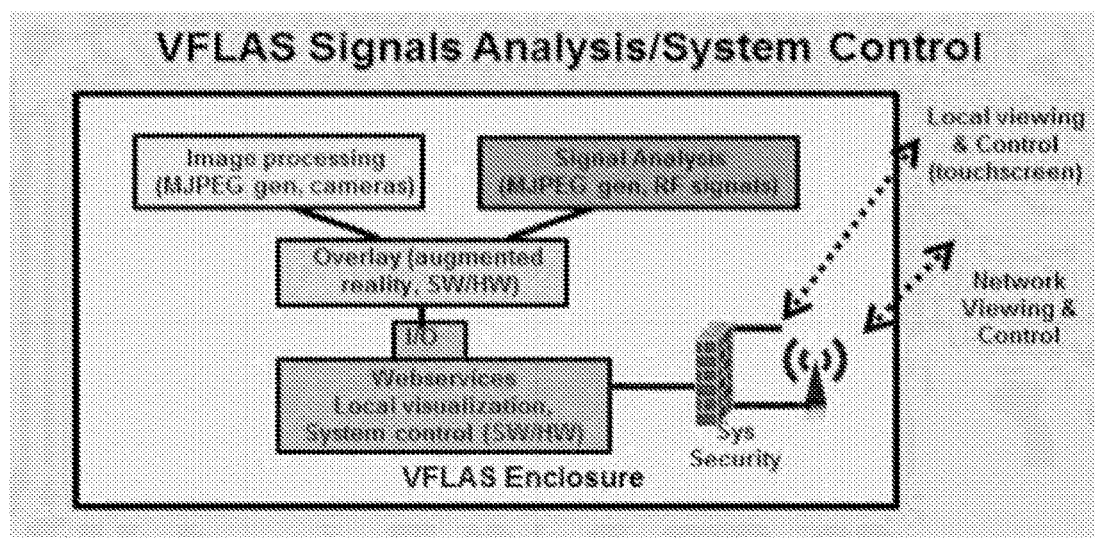
FIG. 72 illustrates the software structure of the VFLAS according to one embodiment of the disclosure.

FIG. 71 illustrates a concept of operations (CONOPS) for the VFLAS instance, and FIG. 72 illustrates the software structure of the VFLAS.

4. Summary

VFLAS locates multi-parameter signals to assist in protecting individuals from threats that use RF signals, such as RF-controlled improvised explosive devices (IEDs), surveillance teams or advancing enemy forces. The system identifies signals that may be obscured by natural (trees, brush) or man-made structures (buildings, vehicles). VFLAS scans areas to determine if multi-parameter signals exist. If a multi-parameter signal is found the system displays the source of the signal on a video monitor and determines the strength of the signal, which aids in determining distance. All this is done in real time.

VFLAS can accomplish this from a moving vehicle or by an individual holding the system. Multi-parameter signals detection will assist in identifying, verifying, and tracking individuals without direct physical contact in the most challenging conditions.

The present disclosure provides a multi-parameter acoustic measurement system for detecting acoustic frequencies in a wide range of frequencies/wavelengths emanating from a structure are measured and analyzed then displayed on a monitor. Measurements obtained by the acoustic measurement system are analyzed to determine the location from which the acoustic frequency is detected.

The acoustic measurement system preferably includes an acoustic antenna that is co-aligned with a combination thermal infrared imaging camera and a visible-wavelength video camera. The system allows a user to select which camera image (thermal or visible) is displayed on the screen with indicia corresponding to any acoustic frequencies overlaid creating an augmented reality "scene".

Acoustic frequencies detected by the acoustic antenna are analyzed and the resulting frequencies are stored preferably in a local memory device. The stored frequencies are then compared to known acoustic signatures for various anomalous situations (e.g., structures having operational flaws, such as, for example, various types of leaks in pipes) to determine whether any acoustic frequencies detected correspond to a particular anomalous situation.

The acoustic antenna may be a directional acoustic antenna capable of locating the direction from which an acoustic frequency of interest is detected. The acoustic antenna may detect sounds having a frequency in the low frequency infrasound range typically having a frequency<20 Hz, audible sound range, and high frequency ultra sound range typically having a frequency greater than 20,000 Hz.

The acoustic antenna is aligned such that co-alignment of the antenna's radiation pattern is achieved.

The combination thermal infrared imaging camera and visible-wavelength camera are used for detection of the source of a detected acoustic frequency in the thermal infrared and visible wavelengths. The cameras are co-aligned with each other and the acoustic antenna. The detection field of the acoustic antenna and the optical fields-of-view for the cameras is matched as closely as possible.

Images from the cameras are stored as motion JPEGS (frame-by-frame) thereby allowing for direct registration (alignment) of the visible and thermal infrared images. This process verifies that each camera is co-aligned along with the field of detection for the acoustic antenna. A combined data set of the camera images and detected acoustic frequencies is detected by the acoustic measurement system.

The acoustic measurement system may remove any background sounds present during use of the system. Various methods are known in the art for removing background sounds or "noise" from a desired acoustic signal or frequency. Further, various background noises may be anticipated by the acoustic measurement system and thereby removed based on the intended environment of the acoustic measurement system.

The general embodiments described herein allow for different cameras and sensors to be interchanged on the unit. The handle is a folding stock design. The lower tray holds the acoustic antennas. A video camera is mounted at the top and front of a housing. A waver-rail is used under the antennas tray onto which a second video camera, a thermal infrared is mounted to the rail. A monitor such as, for example, a touch screen LCD display is connected to a CPU and communications switch box (including, e.g., Ethernet ports, USB ports, and/or other similar port features) that are located directly in front of the monitor.

The acoustic measurement system may be used, for example, in an industrial setting for locating a high-pressure steam leak. The high-pressure steam leak may be extremely thin and have an ultrasonic acoustic profile, making the leak inaudible to a human ear. This makes the leak very difficult to see and therefore extremely dangerous.

The acoustic measurement system may be used to locate and visually see the high-pressure steam leak using a combination of the acoustic antenna and cameras. For example, information related to one or more acoustic frequencies detected by the acoustic antenna may be overlaid on the monitor with an image captured by the video camera. The acoustic frequency corresponding to the leak may be separated from any background noise. Information related to the one or more acoustic frequencies may include the frequency, strength, location and other identifying information on the acoustic frequency, thereby allowing the user to initially locate an area where the acoustic frequency originates. The user may then switch to the thermal infrared camera to further identify the exact location of the leak by detecting heat from the leaked steam.

The foregoing description of preferred embodiments of the present disclosure has been presented for purposes of illustration and description. The described preferred embodiments are not intended to be exhaustive or to limit the scope of the disclosure to the precise form(s) disclosed. Obvious modifications or variations are possible in light of the above teachings. The embodiments are chosen and described in an effort to provide the best illustrations of the principles of the disclosure and its practical application, and to thereby enable one of ordinary skill in the art to utilize the concepts revealed in the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

What is claimed is:

1. A radio frequency imager comprising:
    two or more directional radio frequency antennas, each of the two or more directional radio frequency antennas oriented to capture a distinct portion of a field of view targeted by the radio frequency imager and intercept radio waves therein, such orientation comprising a detector array, each antenna configured to output a specific voltage based on the strength of the intercepted radio waves within each antenna's distinct portion of the field of view;
    two or more voltage amplifiers in communication with the two or more radio frequency antennas, for amplifying the strength of each output voltage;
    two or more analog to digital converters, each converter connected to a corresponding voltage amplifier of the two or more voltage amplifiers for converting each output voltage into digital data;
    a digital memory apparatus connected to the two or more converters for receiving and storing the digital data in a numeric array, wherein digital data from each of the two or more radio frequency antennas is stored in the numeric array at a location of the array corresponding to the distinct portion of the field of view captured by each of the two or more directional radio frequency antennas;
    a processor connected to the digital memory apparatus for processing the digital data; and
    a display apparatus connected to the processor for receiving display commands from the processor and for displaying a visual array comprising individual visual array indicator elements, each visual array indicator element corresponding to digital data of a specific radio frequency antenna stored in the numerical array and configured to display visual information characterizing a magnitude of the radio wave frequency intercepted within each distinct portion of the field of view by each of the two or more radio frequency antennas, the location of visual array indicator elements on the display corresponding to a location of radio waves within the visual field of view targeted by the radio frequency imager;
    wherein the display apparatus visually displays locations of the intercepted radio waves within the field of view of the radio frequency imager on portions of the display apparatus that correspond to the locations within the field of view of the radio frequency imager.

2. The radio frequency imager of claim 1, wherein the two or more directional radio frequency antennas are comprised of Yagi-Uda directional antennas.

3. The radio frequency imager of claim 1, wherein the visual array comprising array elements is at least a 3×3 array of visual array elements.

4. The radio frequency imager of claim 1, wherein the visual array elements are selected from the group consisting of geometric shapes, graphs, color variations, and combinations thereof.

5. The radio frequency imager of claim 4, wherein the visual array elements vary in appearance based on a strength of the radio wave intercepted by the radio frequency imager.

6. The radio frequency imager of claim 1, wherein characteristics of the visual array elements vary based on a particular wavelength range of the intercepted radio waves.

7. The radio frequency imager of claim 1, wherein the intercepted radio waves further comprise corresponding wavelength ranges selected from the group consisting of from about 0.1 nm to about 10 nm; from about 10 nm to about 400 nm; from about 400 nm to about 700 nm; from about 1 um to about 1000 um; from about 1 mm to about 10 cm; and from about 50 cm to about 10 m.

8. A method of intercepting and displaying visual indicators related to one or more radio waves based on a strength and location of the intercepted radio waves, the method comprising:
    orienting two or more directional radio frequency antennas to capture a desired field of view, each of the two or more directional radio frequency antennas capturing a distinct portion of the field of view;
    capturing one or more radio waves within the distinct portion of the field of view of each the two or more radio frequency antennas;

generating an output signal at each of the two or more radio frequency antennas, wherein a strength of the output signal of the two or more radio frequency antennas is based on a strength of the radio waves detected within the field of view by each of the two or more radio frequency antennas;

displaying an array of visual array indicator elements, wherein each of the visual array indicator elements corresponds to each of the two or more radio frequency antennas and wherein the visual array elements are oriented according to the distinct portion of the field of view captured by each of the two or more radio frequency antennas;

displaying a visual indicator within each of the visual array elements when each of the corresponding two or more radio frequency antennas capture one or more radio waves within the particular radio frequency antenna's distinct portion of the field of view; and varying an appearance of the visual indicator based on a strength of the output signal from each of the two or more radio frequency antennas that is based on a strength of the radio waves detected by the radio frequency antennas;

wherein the display apparatus visually displays locations of the intercepted radio waves within the field of view of the radio frequency imager on portions of the display apparatus that correspond to the locations within the field of view of the radio frequency imager.

\* \* \* \* \*